(12) United States Patent
Yamakoshi et al.

(10) Patent No.: US 10,026,744 B2
(45) Date of Patent: Jul. 17, 2018

(54) METHOD OF MANUFACTURING SEMICONDUCTOR DEVICE

(71) Applicant: RENESAS ELECTRONICS CORPORATION, Tokyo (JP)

(72) Inventors: Hideaki Yamakoshi, Tokyo (JP); Takashi Hashimoto, Tokyo (JP); Shinichiro Abe, Tokyo (JP); Yuto Omizu, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/672,909

(22) Filed: Aug. 9, 2017

(65) Prior Publication Data

US 2018/0047742 A1    Feb. 15, 2018

(30) Foreign Application Priority Data

Aug. 10, 2016    (JP) .................................. 2016-157536

(51) Int. Cl.
*H01L 27/112*    (2006.01)
*H01L 27/11563*    (2017.01)

(52) U.S. Cl.
CPC .............................. *H01L 27/11563* (2013.01)

(58) Field of Classification Search
None
See application file for complete search history.

(56) References Cited

U.S. PATENT DOCUMENTS 7,011,999 B2    3/2006 Minami et al.
2016/0064402 A1*   3/2016 Umeda ............. H01L 27/11573
                                                      438/241

FOREIGN PATENT DOCUMENTS

JP         2004-200504 A       7/2004

* cited by examiner

*Primary Examiner* — Jae Lee
(74) *Attorney, Agent, or Firm* — McDermott Will & Emery LLP

(57) ABSTRACT

An improvement is achieved in the reliability of a semiconductor device. A structure is obtained in which a first insulating film for a gate insulating film of a memory element is formed over a semiconductor substrate located in a memory region, a second insulating film for a gate insulating film of a lower-breakdown-voltage MISFET is formed over the semiconductor substrate located in a lower-breakdown-voltage MISFET formation region, and a third insulating film for a gate insulating film of a higher-breakdown-voltage MISFET is formed over the semiconductor substrate located in a higher-breakdown-voltage MISFET formation region. Subsequently, a film for gate electrodes is formed and then patterned to form the respective gate electrodes of the memory element, the lower-breakdown-voltage MISFET, and the higher-breakdown-voltage MISFET. The step of forming the second insulating film is performed after the step of forming the first insulating film. The step of forming the third insulating film is performed before the step of forming the first insulating film.

18 Claims, 57 Drawing Sheets

METHOD OF MANUFACTURING SEMICONDUCTOR DEVICE

CROSS-REFERENCE TO RELATED APPLICATIONS

The disclosure of Japanese Patent Application No. 2016-157536 filed on Aug. 10, 2016 including the specification, drawings and abstract is incorporated herein by reference in its entirety.

BACKGROUND

The present invention relates to a method of manufacturing a semiconductor device, which can be used appropriately as, e.g., a method of manufacturing a semiconductor device having a nonvolatile memory.

As an electrically writable/erasable nonvolatile semiconductor storage device, an EEPROM (Electrically Erasable and Programmable Read Only Memory) has been used widely. Such a storage device represented by a flash memory which is currently used widely has a conductive floating gate electrode or a trapping insulating film surrounded by oxide films under the gate electrode of a MISFET. A charge storage state in the floating gate or trapping insulating film is used as stored information and read as the threshold of the transistor. The trapping insulating film refers to an insulating film capable of storing charges therein, and examples thereof include a silicon nitride film. By injection/release of charges into/from such a charge storage region, the threshold of the MISFET (Metal Insulator Semiconductor Field Effect Transistor) is shifted to allow the MISFET to operate as a storage element. The use of a trapping insulating film such as a silicon nitride film as a charge storage region provides advantages over the use of a conductive floating gate film as the charge storage region such that, due to discrete storage of charges, data retention reliability is high, and the high data retention reliability allows the oxide films over and under the silicon nitride film to be thinned and allows a voltage for a write/erase operation to be reduced.

Japanese Unexamined Patent Publication No. 2004-200504 (Patent Document 1) describes a technique related to a semiconductor device having a nonvolatile storage element.

RELATED ART DOCUMENT

Patent Document

[Patent Document 1]
Japanese Unexamined Patent Publication No. 2004-200504

SUMMARY

It is desired to improve the reliability of a semiconductor device having an nonvolatile memory.

Other problems and novel features of the present invention will become apparent from a statement in the present specification and the accompanying drawings.

According to an embodiment, in a method of manufacturing a semiconductor device, a semiconductor substrate including a first region where a nonvolatile memory element is to be formed, a second region where a first transistor is to be formed, and a third region where a second transistor is to be formed is provided. Then, a structure is obtained in which a second insulating film for a gate insulating film of the memory element is formed over the semiconductor substrate located in the first region, a first insulating film for a gate insulating film of the first transistor is formed over the semiconductor substrate located in the second region, and a third insulating film for a gate insulating film of the second transistor is formed over the semiconductor substrate located in the third region. The first insulating film is thicker than the third insulating film. Then, a film for first, second, and third gate electrodes is formed and patterned to form the first gate electrode for the memory element, the second gate electrode for the first transistor, and the third gate electrode for the second transistor. The step of forming the third insulating film is performed after the step of forming the second insulating film. The step of forming the first insulating film is performed before the step of forming the second insulating film.

According to the embodiment, in a method of manufacturing a semiconductor device, a semiconductor substrate including a first region where a nonvolatile memory element is to be formed, a second region where a first transistor is to be formed, a third region where a second transistor is to be formed, and a fourth region where a third transistor is to be formed is provided. Then, a structure is obtained in which a third insulating film for a gate insulating film of the memory element is formed over the semiconductor substrate located in the first region, a first insulating film for a gate insulating film of the first transistor is formed over the semiconductor substrate located in the second region, a second insulating film for a gate insulating film of the second transistor is formed over the semiconductor substrate located in the third region, and a fourth insulating film for a gate insulating film of the third transistor is formed over the semiconductor substrate located in the fourth region. The first insulating film is thicker than the second insulating film. The second insulating film is thicker than the fourth insulating film. Then, a film for first, second, third, and fourth gate electrodes is formed and patterned to form the first gate electrode for the memory element, the second gate electrode for the first transistor, the third gate electrode for the second transistor, and the fourth gate electrode for the third transistor. The step of forming the fourth insulating film is performed after the step of forming the third insulating film. The step of forming the first insulating film and the step of forming the second insulating film are performed before the step of forming the third insulating film.

The embodiment allows the reliability of the semiconductor device to be improved.

DETAILED DESCRIPTION

Figure 1:
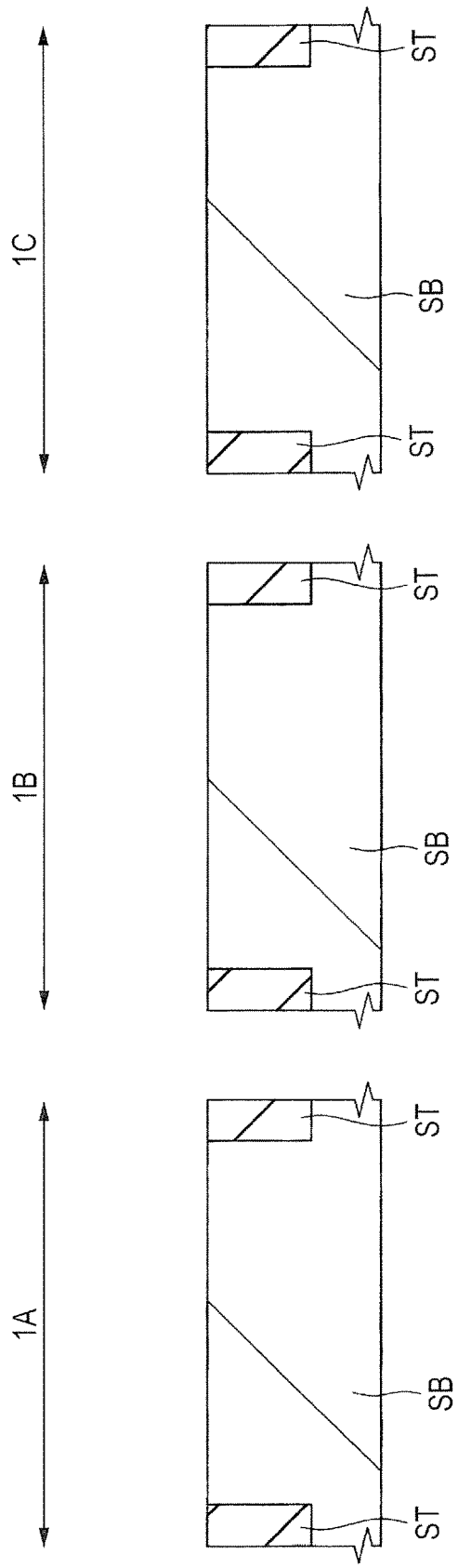
FIG. 1 is a main-portion cross-sectional view of a semiconductor device in an embodiment during the manufacturing process thereof.

In the following embodiments, if necessary for the sake of convenience, each of the embodiments will be described by being divided into a plurality of sections or embodiments. However, they are by no means irrelevant to each other unless particularly explicitly described otherwise, and one of the sections or embodiments is modifications, details, supplementary explanation, and so forth of part or the whole of the others. Also, in the following embodiments, when the number and the like (including the number, numerical value, amount, range, and the like) of elements are mentioned, they are not limited to the specified numbers unless particularly explicitly described otherwise or unless they are obviously limited to specified numbers in principle. The number and the like of the elements may be not less than or not more than the specified numbers. Also, in the following embodiments, it goes without saying that the components thereof (including also elements, steps, and the like) are not necessarily indispensable unless particularly explicitly described otherwise or unless the components are considered to be obviously indispensable in principle. Likewise, if the shapes, positional relationships, and the like of the components and the like are mentioned in the following embodiments, the shapes, positional relationships, and the like are assumed to include those substantially proximate or similar thereto and the like unless particularly explicitly described otherwise or unless it can be considered that they obviously do not in principle. The same shall apply in regard to the foregoing numerical value and range.

The following will describe the embodiments in detail on the basis of the drawings. Note that, throughout all the drawings for illustrating the embodiments, members having the same functions are designated by the same reference numerals, and a repeated description thereof is omitted. In the following embodiments, a description of the same or like parts will not be repeated in principle unless particularly necessary.

In the drawings used in the embodiments, hatching may be omitted even in a cross section for improved clarity of illustration, while even a plan view may be hatched for improved clarity of illustration.

Embodiment 1

(About Manufacturing Process of Semiconductor Device)

A semiconductor device in Embodiment 1 includes a nonvolatile memory (nonvolatile storage element, flash memory, or nonvolatile semiconductor storage device).

A method of manufacturing the semiconductor device in Embodiment 1 will be described with reference to FIGS. 1 to 23. FIGS. 1 to 23 are main-portion cross-sectional views of the semiconductor device in Embodiment 1 during the manufacturing process thereof. Each of FIGS. 1 to 23 is a main-portion cross-sectional view of a memory region 1A, a lower-breakdown-voltage MISFET formation region 1B, and a higher-breakdown-voltage MISFET formation region 1C, which shows the formation of a memory element (storage element or memory cell) MC of the nonvolatile memory in the memory region 1A, the formation of a lower-breakdown-voltage MISFET 2 in the lower-breakdown-voltage MISFET formation region 1B, and the formation of a higher-breakdown-voltage MISFET 3 in the higher-breakdown-voltage MISFET formation region 1C.

The memory region 1A mentioned herein is the region of a main surface of a semiconductor substrate SB where the memory element of the nonvolatile memory is to be formed. The lower-breakdown-voltage MISFET formation region 1B and the higher-breakdown-voltage MISFET formation region 1C are the regions of the main surface of the semiconductor substrate SB where peripheral circuits are to be formed.

The memory element MC of the nonvolatile memory formed in the memory region 1A is a single-gate memory element. The memory element MC uses a trapping insulating film (insulating film capable of storing charges therein) in the charge storage portion thereof. The memory element MC is described as an n-channel transistor (i.e., n-channel MISFET), but may also be described as a p-channel transistor (i.e., p-channel MISFET) having an opposite conductivity type.

The peripheral circuits are circuits other than the nonvolatile memory. Examples of the peripheral circuits include a processor such as a CPU, a control circuit, a sense amplifier, a column decoder, a row decoder, and an input/output circuit. The MISFETs formed in the lower-breakdown-voltage MISFET formation region 1B and the higher-breakdown-voltage MISFET formation region 1C are intended for the peripheral circuits.

Note that the lower-breakdown-voltage MISFET formation region 1B is the region where the lower-breakdown-voltage MISFET 2 for the peripheral circuit is to be formed and the higher-breakdown-voltage MISFET formation region 1C is the region where the higher-breakdown-voltage MISFET 3 for the peripheral circuit is to be formed.

The operating voltage of the higher-breakdown-voltage MISFET 3 is higher than the operating voltage of the lower-breakdown-voltage MISFET 2. In other words, the higher-breakdown-voltage MISFET 3 operates with a first power supply voltage and the lower-breakdown-voltage MISFET 2 operates with a second power supply voltage lower than the first power supply voltage. As will be described later, the thickness of the gate insulating film of the higher-breakdown-voltage MISFET 3 is larger than the thickness of the gate insulating film of the lower-breakdown-voltage MISFET 2.

The memory region 1A, the lower-breakdown-voltage MISFET formation region 1B, and the higher-breakdown-voltage MISFET formation region 1C are present in the same semiconductor substrate SB. That is, the memory region 1A, the lower-breakdown-voltage MISFET formation region 1B, and the higher-breakdown-voltage MISFET formation region 1C correspond to the different two-dimensional regions of the main surface of the same semiconductor substrate SB.

Embodiment 1 describes the case where an n-channel MISFET is formed in the memory region 1A. However, it is also possible to invert the conductivity type and form a p-channel MISFET in the memory region 1A. Likewise, Embodiment 1 describes the case where an n-channel MISFET is formed in the lower-breakdown-voltage MISFET formation region 1B. However, it is also possible to invert the conductivity type and form a p-channel MISFET in the lower-breakdown-voltage MISFET formation region 1B or form both of an n-channel MISFET and a p-channel MISFET in the lower-breakdown-voltage MISFET formation region 1B. Likewise, Embodiment 1 describes the case where an n-channel MISFET is formed in the higher-breakdown-voltage MISFET formation region 1C. However, it is also possible to invert the conductivity type and form a p-channel MISFET in the higher-breakdown-voltage MISFET formation region 1C or form both of an n-channel MISFET and a p-channel MISFET in the higher-breakdown-voltage MISFET formation region 1C.

To manufacture the semiconductor device, first, as shown in FIG. 1, the semiconductor substrate (semiconductor wafer) SB made of p-type monocrystalline silicon having a specific resistance of, e.g., about 1 to 18 Ωcm or the like is provided (prepared). Then, in the main surface of the semiconductor substrate SB, isolation regions ST defining active regions are formed.

The isolation regions ST are made of an insulator such as silicon dioxide and can be formed by, e.g., a STI (Shallow Trench Isolation) method, a LOCOS (Local Oxidation of Silicon) method, or the like. For example, after trenches for isolation are formed in the main surface of the semiconductor substrate SB, an insulating film made of, e.g., silicon dioxide is embedded in the trenches for isolation to be able to form the isolation regions ST.

That is, after the isolation trenches (trenches for isolation) are formed in the main surface of the semiconductor substrate SB by etching or the like, the insulating film made of a silicon dioxide (e.g., ozone TEOS (Tetraethoxysilane) film or the like is formed over the semiconductor substrate SB so as to be embedded in the isolation trenches. Then, the insulating film is polished using a CMP (Chemical Mechanical Polishing) method or the like. Thus, the unneeded insulating film located outside the isolation trenches is removed, while the insulating film is left in the isolation trenches to be able to form the isolation regions ST made of the insulating film (insulator) embedded in the isolation trenches.

By the isolation regions ST, the active regions of the semiconductor substrate SB are defined. In the active region of the memory region 1A which is defined by the isolation region ST, the memory element MC is formed in such a manner as will be described later. Also, in the active region of the lower-breakdown-voltage MISFET formation region 1B which is defined by the isolation region ST, the MISFET 2 is formed in such a manner as will be described later. Also, in the active region of the higher-breakdown-voltage MISFET formation region 1C which is defined by the isolation region ST, the MISFET 3 is formed in such a manner as will be described later.

Figure 2:
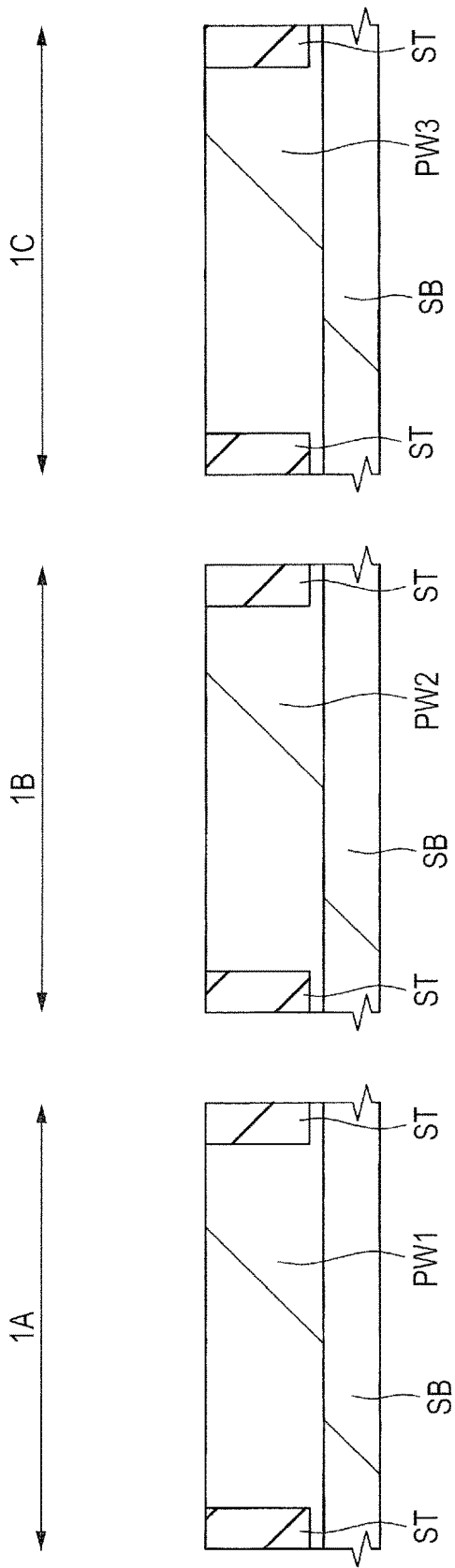
FIG. 2 is a main-portion cross-sectional view of the semiconductor device during the manufacturing process thereof, which is subsequent to FIG. 1.

Next, as shown in FIG. 2, a p-type well PW1 is formed in the memory region 1A of the semiconductor substrate SB, a p-type well PW2 is formed in the lower-breakdown-voltage MISFET formation region 1B, and a p-type well PW3 is formed in the higher-breakdown-voltage MISFET formation region 1C.

The p-type wells PW1, PW2, and PW3 can be formed through, e.g., the ion implantation of a p-type impurity such as boron (B) into the semiconductor substrate SB or the like. The p-type wells PW1, PW2, and PW3 are formed to predetermined depths from the main surface of the semiconductor substrate SB. The p-type wells PW1, PW2, and PW3 may be formed by the same ion implantation step or different ion implantation steps.

Note that, as necessary, the p-type wells PW1, PW2, and PW3 may also be formed after n-type wells (not shown) deeper than the p-type wells PW1, PW2, and PW3 are formed.

Next, by removing a natural oxide film from the top surface of the semiconductor substrate SB by wet etching using, e.g., an aqueous hydrofluoric acid (HF) solution or the like, the top surface of the semiconductor substrate SB is cleaned to be purified. This exposes the top surface (silicon surface) of the semiconductor substrate SB (p-type wells PW1, PW2, and PW3).

Figure 3:
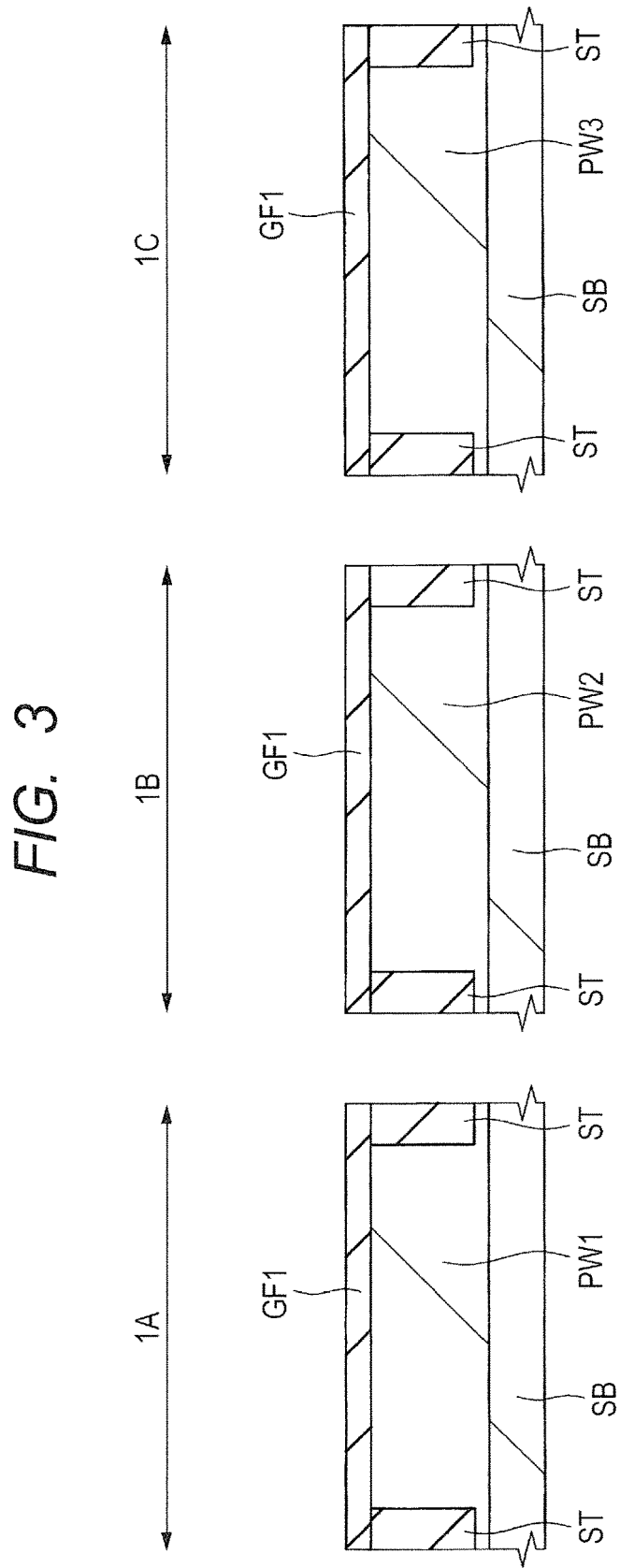
FIG. 3 is a main-portion cross-sectional view of the semiconductor device during the manufacturing process thereof, which is subsequent to FIG. 2.

Next, as shown in FIG. 3, an insulating film GF1 is formed over the top surface of the semiconductor substrate SB (including also the respective top surfaces of the p-type wells PW1, PW2, and PW3).

The insulating film GF1 is an insulating film for the gate insulating film of the MISFET 3 formed in the higher-breakdown-voltage MISFET formation region 1C. The insulating film GF1 is preferably made of a silicon dioxide film and can be formed by thermal oxidation treatment (thermal oxidation method), but can also be formed by forming a thermal oxide film and then further depositing a CVD film (silicon dioxide film formed by a CVD method) over the thermal oxide film. The insulating film GF1 is formed over the semiconductor substrate SB (p-type well PW1) located in the memory region 1A, over the semiconductor substrate SB (p-type well PW2) located in the lower-breakdown-voltage MISFET formation region 1B, and over the semiconductor substrate SB (p-type well PW3) located in the higher-breakdown-voltage MISFET formation region 1C. FIG. 3 shows the case where the insulating film GF1 is formed also over the isolation regions ST. However, when the insulating film GF1 is formed by a thermal oxidation method, the insulating film GF1 is not formed over the isolation regions ST. The thickness (formed film thickness) of the silicon dioxide film as the insulating film GF1 is preferably controlled to be not less than 5 nm, e.g., about 7 to 8 nm.

Figure 4:
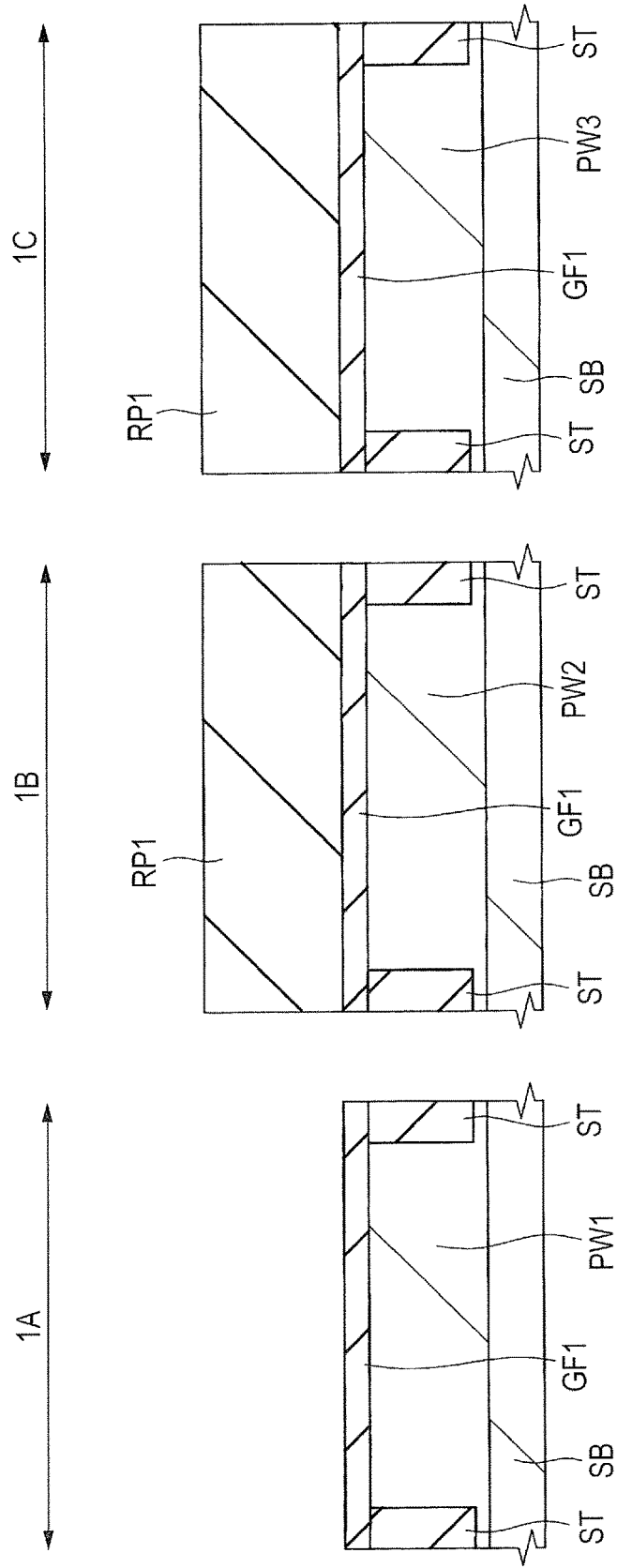
FIG. 4 is a main-portion cross-sectional view of the semiconductor device during the manufacturing process thereof, which is subsequent to FIG. 3.

Next, as shown in FIG. 4, over the semiconductor substrate SB, i.e., over the insulating film GF1, a photoresist pattern RP1 is formed as a mask layer using a photolithographic technique. The photoresist pattern RP1 is formed in each of the lower-breakdown-voltage MISFET formation region 1B and the higher-breakdown-voltage MISFET formation region 1C, but is not formed in the memory region 1A. As a result, the insulating films GF1 located in each of the lower-breakdown-voltage MISFET formation region 1B and the higher-breakdown-voltage MISFET formation region 1C is covered with the photoresist pattern RP1. On the other hand, the insulating film GF1 located in the memory region 1A is uncovered with the photoresist pattern RP1 and exposed.

Figure 5:
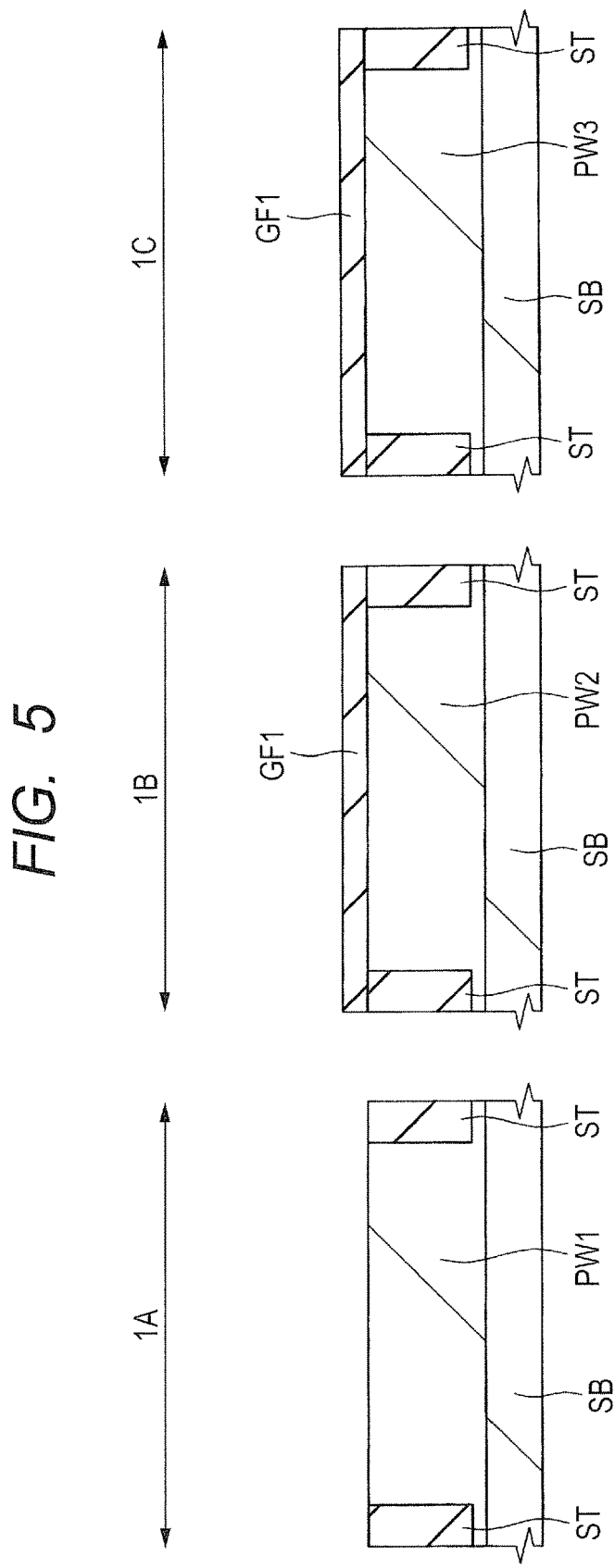
FIG. 5 is a main-portion cross-sectional view of the semiconductor device during the manufacturing process thereof, which is subsequent to FIG. 4.

Next, using the photoresist pattern RP1 as an etching mask, the insulating film GF1 is etched. Thus, the insulating film GF1 is removed from the memory region 1A, while the insulating film GF1 is left in each of the lower-breakdown-voltage MISFET formation region 1B and the higher-breakdown-voltage MISFET formation region 1C. As the etching performed at this time, wet etching can be used appropriately. As an etchant, an etchant with which the insulating film GF1 is likely to be etched and the semiconductor substrate SB is less likely to be etched than the insulating film GF1 is used preferably. For example, a hydrofluoric acid can be used appropriately. In the memory region 1A, as a result of the removal of the insulating film GF1 therefrom, the top surface (silicon surface) of the semiconductor substrate SB (p-type well PW1) is exposed. Subsequently, the photoresist pattern RP1 is removed. FIG. 5 shows this process stage.

Figure 6:
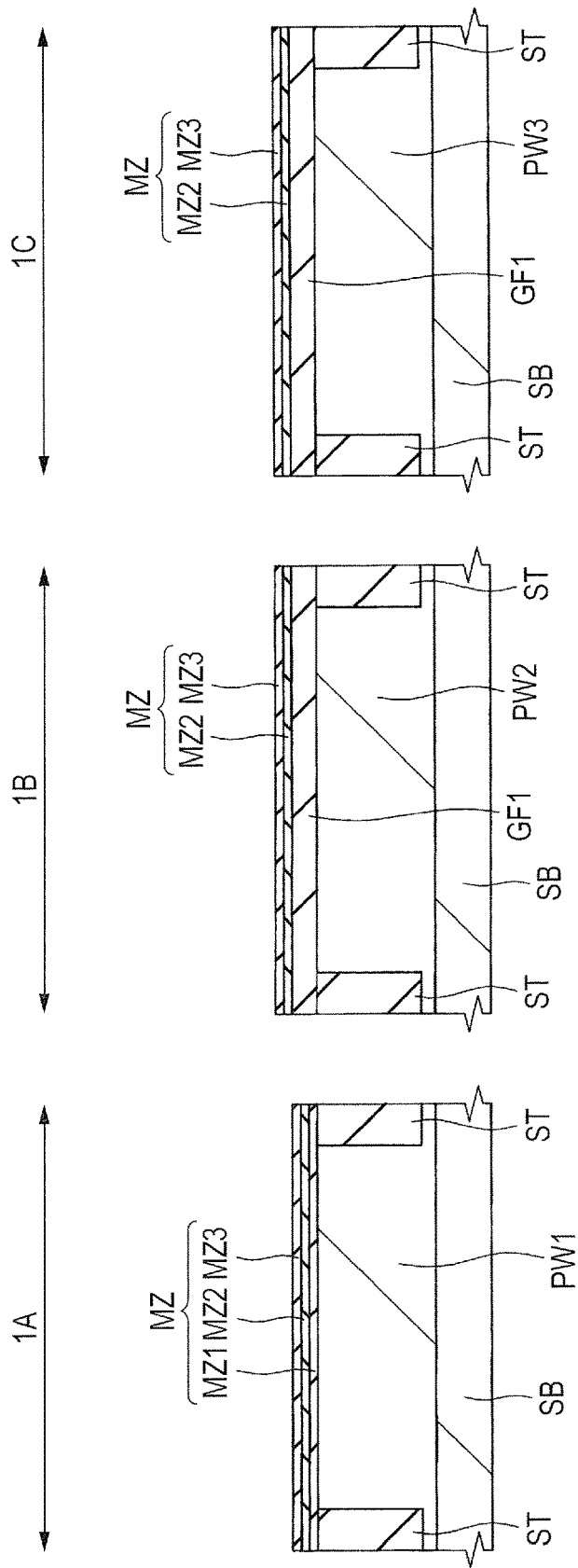
FIG. 6 is a main-portion cross-sectional view of the semiconductor device during the manufacturing process thereof, which is subsequent to FIG. 5.

Next, as shown in FIG. 6, over the main surface of the semiconductor substrate SB, an insulating film (multi-layer insulating film) MZ is formed. At this time, in the memory region 1A, the insulating film MZ is formed over the top surface (silicon surface) of the semiconductor substrate SB (p-type well PW1). In the lower-breakdown-voltage MISFET formation region 1B, the insulating film MZ is formed over the insulating film GF1 over the semiconductor substrate SB (p-type well PW2). In the higher-breakdown-voltage MISFET formation region 1C, the insulating film MZ is formed over the insulating film GF1 over the semiconductor substrate SB (p-type well PW3). The insulating film MZ is a multi-layer insulating film. The multi-layer insulating film mentioned herein corresponds to a multi-layer film including a plurality of insulating films.

The insulating film MZ is an insulating film for the gate insulating film of the memory element MC formed in the memory region 1A and has an inner charge storage portion (charge storage layer). The insulating film MZ includes an insulating film MZ1, an insulating film MZ2 formed over the insulating film MZ1, and an insulating film MZ3 formed over the insulating film MZ2. The insulating film MZ1 is preferably made of a silicon dioxide film. The insulating film MZ2 is preferably made of a silicon nitride film. The insulating film MZ3 is preferably made of a silicon dioxide film. A multi-layer film including a silicon dioxide film, a silicon nitride film, and a silicon dioxide film can also be regarded as an ONO (oxide-nitride-oxide) film.

The step of forming the insulating film MZ includes the step of forming the insulating film MZ1, the step of forming the insulating film MZ2, and the step of forming the insulating film MZ3. The step of forming the insulating film MZ can be performed as follows.

That is, first, the insulating film MZ1 is formed (the step of forming the insulating film MZ1 is performed).

The insulating film MZ1 is made of a silicon dioxide film and can be formed by thermal oxidation treatment (thermal oxidation method). For the thermal oxidation treatment performed at this time, RTO (Rapid Thermal Oxidation) is used more preferably. The thickness (formed film thickness) of the silicon dioxide film as the insulating film MZ1 can be controlled to, e.g., about 1 to 3 nm. In another form, after a silicon dioxide film (insulating film MZ1) is formed by thermal oxidation, thermal nitridation treatment or plasma nitridation treatment is performed. Thus, it is also possible to nitride the silicon dioxide film (insulating film MZ1) and introduce nitrogen into the silicon dioxide film. In that case, the insulating film MZ1 is formed of a silicon oxynitride film.

When the step of forming the insulating film MZ1 (thermal oxidation treatment for forming the insulating film MZ1) is performed, over the top surface (silicon surface) of the semiconductor substrate SB (p-type well PW1) located in the memory region 1A, the insulating film MZ1 is formed. At the process stage immediately before the step of forming the insulating film MZ1 is performed, the outermost surface in each of the lower-breakdown-voltage MISFET formation region 1B and the higher-breakdown-voltage MISFET formation region 1C corresponds to the insulating film GF1. Accordingly, when the step of forming the insulating film MZ1 (thermal oxidation treatment for forming the insulating film MZ1) is performed, in each of the lower-breakdown-voltage MISFET formation region 1B and the higher-breakdown-voltage MISFET formation region 1C, the thickness of the insulating film GF1 is increased, while the insulating film MZ1 is not formed. When the insulating film MZ1 is formed by a thermal oxidation method, the insulating film MZ1 is not formed over the isolation regions ST.

Then, the insulating film MZ2 is formed (the step of forming the insulating film MZ2 is performed). The insulating film MZ2 is made of a silicon nitride film and can be formed using a CVD (Chemical Vapor Deposition) method or the like. The film thickness (formed film thickness) of the silicon nitride film as the insulating film MZ2 can be controlled to, e.g., about 5 to 13 nm. The silicon nitride film can be formed either at a time in one step or in a plurality of steps.

When the step of forming the insulating film MZ2 is performed, in the memory region 1A, the insulating film MZ2 is formed over the insulating film MZ1. In each of the lower-breakdown-voltage MISFET formation region 1B and the higher-breakdown-voltage MISFET formation region 1C, the insulating film MZ2 is formed over the insulating film GF1. The insulating film MZ2 may also be formed over the isolation regions ST.

Then, the insulating film MZ3 is formed (the step of forming the insulating film MZ3 is performed). The insulating film MZ3 is made of a silicon dioxide film and can be formed by a CVD method, a thermal oxidation method, or both of the CVD method and the thermal oxidation method. The thickness (formed film thickness) of the silicon dioxide film as the insulating film MZ3 can be controlled to, e.g., about 2 to 4 nm.

When the step of forming the insulating film MZ3 is performed, in the memory region 1A, the insulating film MZ3 is formed over the insulating film MZ2. In each of the lower-breakdown-voltage MISFET formation region 1B and the higher-breakdown-voltage MISFET formation region 1C also, the insulating film MZ3 is formed over the insulating film MZ2. The insulating film MZ3 may also be formed over the insulating film MZ2 over the isolation regions ST.

Thus, the step of forming the insulating film MZ is performed. When the step of forming the insulating film MZ is ended, in the memory region 1A, the insulating films MZ1, MZ2, and MZ3 are formed successively in ascending order over the semiconductor substrate SB (n-type well PW1). As a result, over the semiconductor substrate SB (p-type well PW1), the insulating film MZ made of the multi-layer film including the insulating films MZ1, MZ2, and MZ3 is formed. In each of the lower-breakdown-voltage MISFET formation region 1B and the higher-breakdown-voltage MISFET formation region 1C, the insulating film MZ made of the multi-layer film including the insulating films MZ2 and MZ3 is formed over the insulating film GF1. The insulating film MZ made of the multi-layer film including the insulating films MZ2 and MZ3 is also formed over the isolation regions ST. That is, in the memory region 1A, the insulating film MZ is made of the multi-layer film including the insulating films MZ1, MZ2, and MZ3 while, in each of the lower-breakdown-voltage MISFET formation region 1B and the higher-breakdown-voltage MISFET formation region 1C, the insulating film MZ is made of the multi-layer film including the insulating films MZ2 and MZ3.

The magnitude (width) of a band gap in each of the insulating films MZ1 and MZ3 is larger than the magnitude (width) of a band gap in the insulating film MZ2. Specifically, the band gap in each of the insulating films MZ1 and MZ3 made of the silicon dioxide film is about 8 to 9 eV and is larger than the band gap (about 5.5 eV) in the silicon nitride film (insulating film MZ2).

Figure 7:
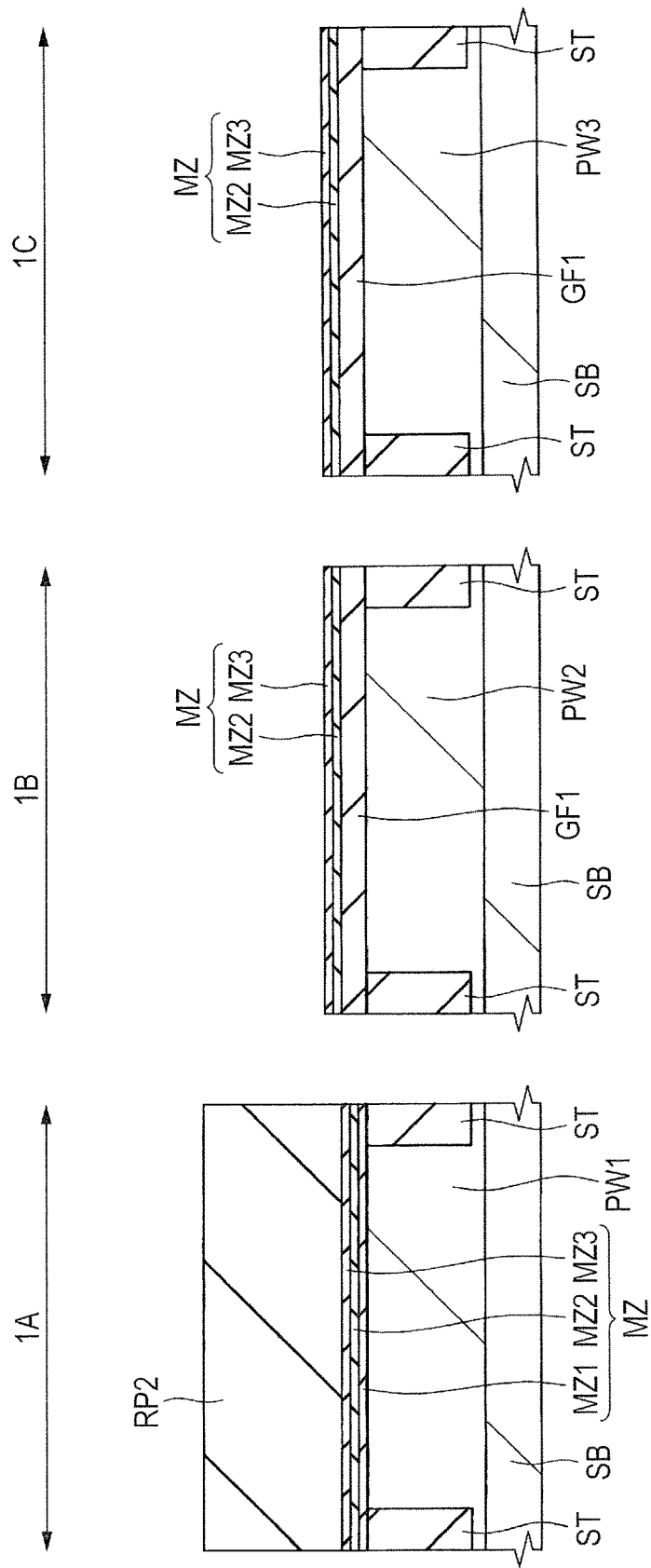
FIG. 7 is a main-portion cross-sectional view of the semiconductor device during the manufacturing process thereof, which is subsequent to FIG. 6.
Figure 8:
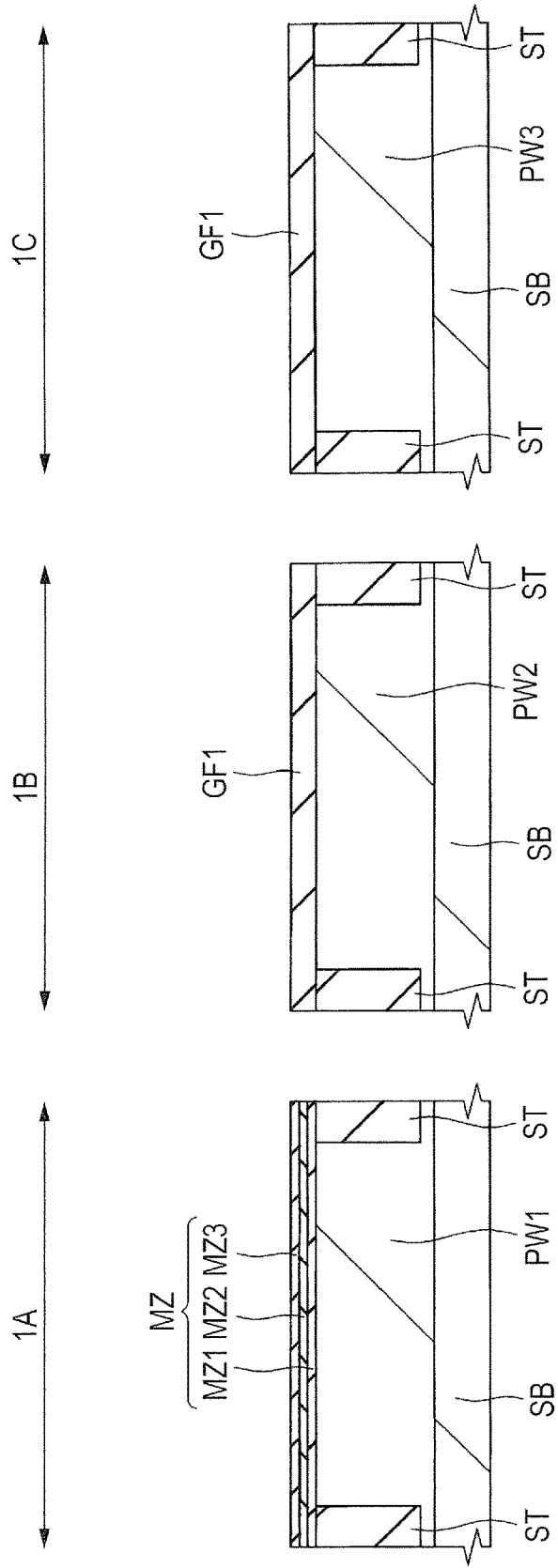
FIG. 8 is a main-portion cross-sectional view of the semiconductor device during the manufacturing process thereof, which is subsequent to FIG. 7.

Next, as shown in FIGS. 7 and 8, the step of removing the insulating film MZ by etching from each of the lower-breakdown-voltage MISFET formation region 1B and the higher-breakdown-voltage MISFET formation region 1C and leaving the insulating film MZ in the memory region 1A is performed. Specifically, this step can be performed as follows.

That is, as shown in FIG. 7, over the semiconductor substrate SB, a photoresist pattern RP2 is formed as a mask layer using a photolithographic technique. The photoresist pattern RP2 is formed in the memory region 1A, but is not formed in either the lower-breakdown-voltage MISFET formation region 1B or the higher-breakdown-voltage MISFET formation region 1C. Consequently, the insulating film MZ in the memory region 1A is covered with the photoresist pattern RP2, while the insulating film MZ in each of the lower-breakdown-voltage MISFET formation region 1B and the higher-breakdown-voltage MISFET formation region 1C is uncovered with the photoresist pattern RP2 and exposed.

Then, using the photoresist pattern RP2 as an etching mask, the insulating film MZ3 is etched to be removed from each of the lower-breakdown-voltage MISFET formation region 1B and the higher-breakdown-voltage MISFET formation region 1C. As the etching performed at this time, wet etching is used preferably. As an etchant, an etchant which allows the silicon dioxide film (MZ3) to be etched at a selectivity higher than that to the silicon nitride film (MZ2), e.g., a hydrofluoric acid can be used appropriately. That is, using the etchant with which the insulating film MZ3 is likely to be etched and the insulating film MZ2 is less likely to be etched than the insulating film MZ3, the insulating film MZ3 is selectively etched to be removed. The insulating film MZ3 located in each of the lower-breakdown-voltage MISFET formation region 1B and the higher-breakdown-voltage MISFET formation region 1C is etched to be removed therefrom. However, the insulating film MZ (including the insulating films MZ3, MZ2, and MZ1) located in the memory region 1A, which is covered with the photoresist pattern RP2, is not removed and remains.

Then, using the photoresist pattern RP2 as an etching mask, the insulating film MZ2 is etched to be removed from each of the lower-breakdown-voltage MISFET formation region 1B and the higher-breakdown-voltage MISFET formation region 1C. As the etching performed at this time, wet etching is used preferably. As an etchant, an etchant which allows the silicon nitride film (insulating film MZ2) to be etched at a selectivity higher than that to the silicon dioxide films (insulating films GF1, MZ1, and MZ3), e.g., a hot phosphoric acid can be used appropriately. That is, using the etchant with which the insulating film MZ2 is likely to be etched and the insulating films GF1 and MZ3 are less likely to be etched than the insulating film MZ2, the insulating film MZ2 is selectively etched to be removed. The insulating film MZ2 located in each of the lower-breakdown-voltage MISFET formation region 1B and the higher-breakdown-voltage MISFET formation region 1C is etched to be removed therefrom. However, the insulating film MZ (including the insulating films MZ3, MZ2, and MZ1) located in the memory region 1A, which is covered with the photoresist pattern RP2, is not removed and remains. Subsequently, the photoresist pattern RP2 is removed. FIG. 8 corresponds to this process stage.

In another form, after the insulating film MZ3 is removed by wet etching from each of the lower-breakdown-voltage MISFET formation region 1B and the higher-breakdown-voltage MISFET formation region 1C using the photoresist pattern RP2 as an etching mask, it is also possible to remove the photoresist pattern RP2 and then remove the insulating film MZ2 by wet etching from each of the lower-breakdown-voltage MISFET formation region 1B and the higher-breakdown-voltage MISFET formation region 1C. FIG. 8 corresponds to this process stage. In this case, when the insulating film MZ2 is wet-etched in each of the lower-breakdown-voltage MISFET formation region 1B and the higher-breakdown-voltage MISFET formation region 1C, the insulating film MZ3 is exposed in the memory region 1A. However, since an etchant with which the insulating films GF1 and MZ3 are less likely to be etched than the insulating film MZ2, e.g., a hot phosphoric acid is used, it is possible to inhibit or prevent the insulating film MZ3 from being etched in the memory region 1A. This allows the insulating film MZ2 to be removed by wet etching from each of the lower-breakdown-voltage MISFET formation region 1B and the higher-breakdown-voltage MISFET formation region 1C and also allows the insulating film MZ3 to be left in the form of a layer in the memory region 1A.

Thus, the step of removing the insulating film MZ by etching from each of the lower-breakdown-voltage MISFET formation region 1B and the higher-breakdown-voltage MISFET formation region 1C and leaving the insulating film MZ in the memory region 1A is performed. Consequently, as shown in FIG. 8, in each of the lower-breakdown-voltage MISFET formation region 1B and the higher-breakdown-voltage MISFET formation region 1C, as a result of the removal of the insulating film MZ therefrom, the insulating film GF1 is exposed. On the other hand, in the memory region 1A, a structure is obtained in which the insulating film MZ made of the multi-layer film including the insulating films MZ1, MZ2, and MZ3 is left.

The end portions (side surfaces) of the foregoing photoresist pattern RP2 are located over the isolation regions ST. In another form, there may also be a case where the end portions (side surfaces) of the photoresist pattern RP2 are not located over the isolation regions ST. In that case, the end portions (side surfaces) of the photoresist pattern RP2 are located over the active region of the memory region 1A. However, in that case also, the photoresist pattern RP2 needs to be formed so as to leave the insulating film MZ in the region where a gate electrode MG (gate electrode for the memory element MC) described later is to be formed. Accordingly, the photoresist pattern RP2 covers the region where the gate electrode MG described later is to be formed.

Figure 9:
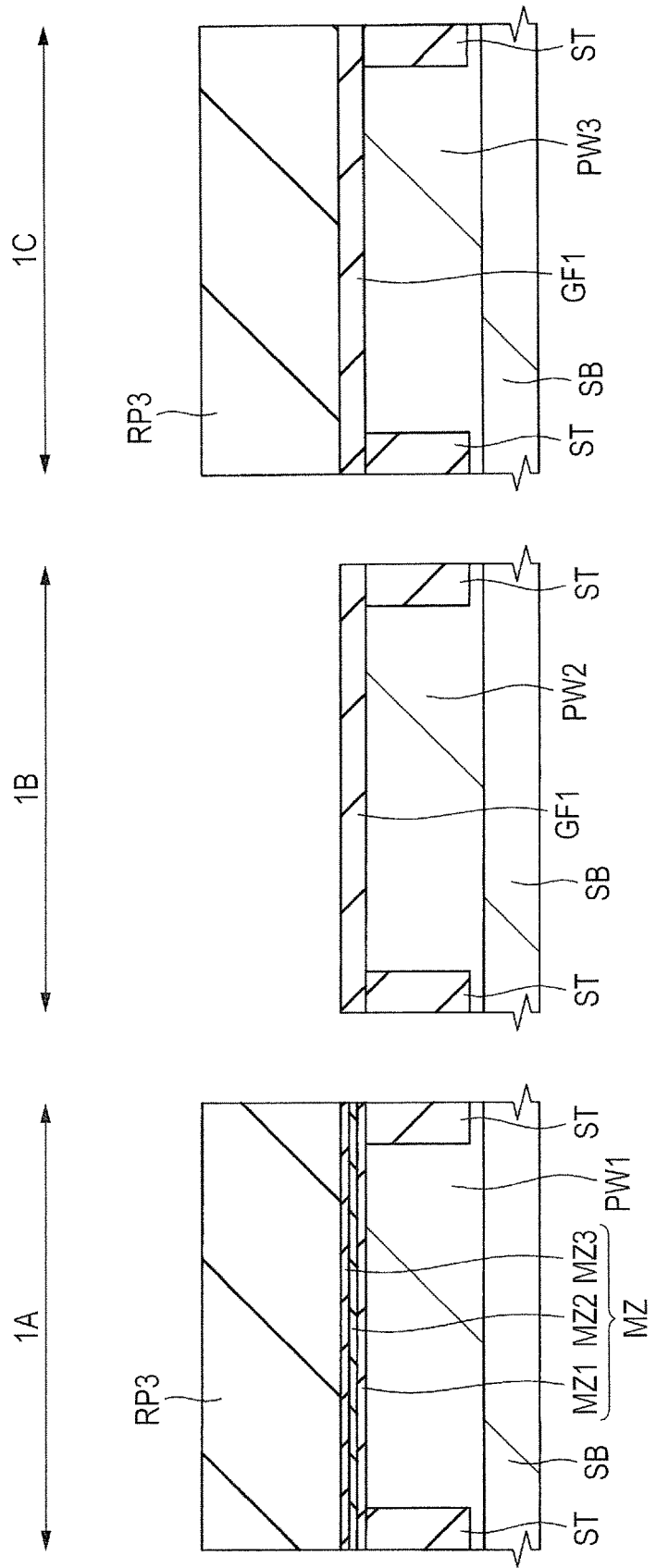
FIG. 9 is a main-portion cross-sectional view of the semiconductor device during the manufacturing process thereof, which is subsequent to FIG. 8.

Next, as shown in FIG. 9, over the semiconductor substrate SB, a photoresist pattern RP3 is formed as a mask layer using a photolithographic technique. The photoresist pattern RP3 is formed in each of the memory region 1A and the higher-breakdown-voltage MISFET formation region 1C, but is not formed in the lower-breakdown-voltage MISFET formation region 1B. As a result, in the memory region 1A, the insulating film MZ is covered with the photoresist pattern RP3 and, in the higher-breakdown-voltage MISFET formation region 1C, the insulating film GF1 is covered with the photoresist pattern RP3. However, in the lower-breakdown-voltage MISFET formation region 1B, the insulating film GF1 is uncovered with the photoresist pattern RP3 and exposed.

Figure 10:
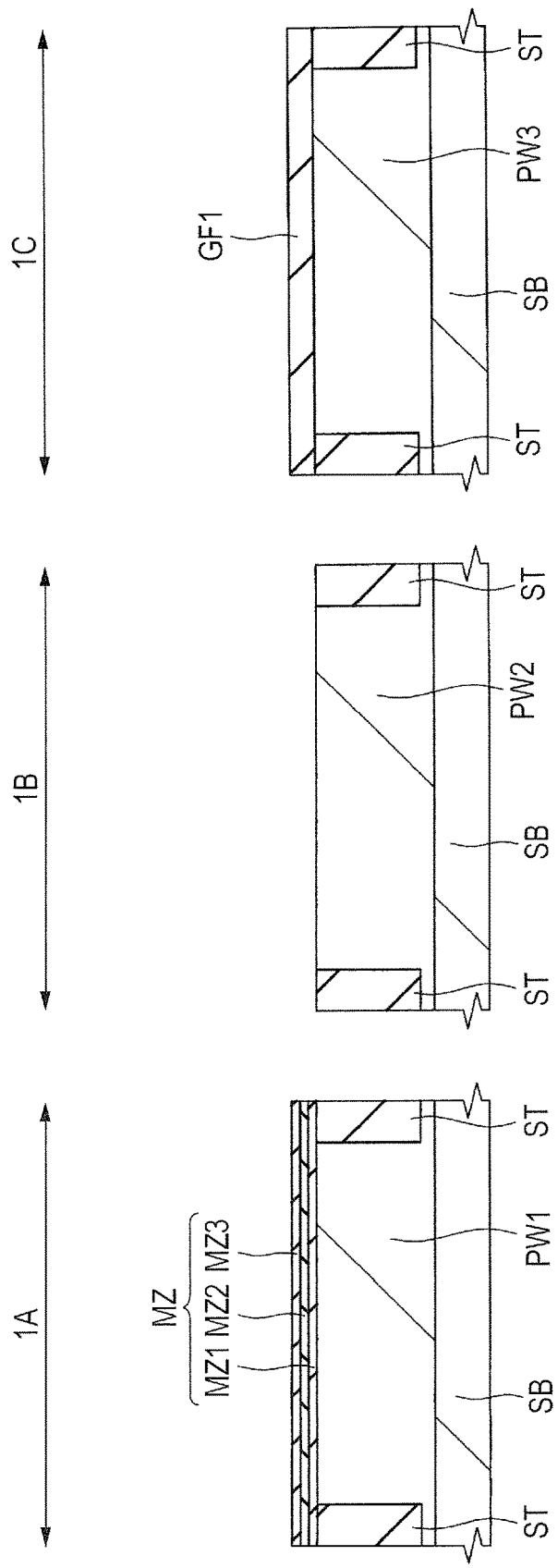
FIG. 10 is a main-portion cross-sectional view of the semiconductor device during the manufacturing process thereof, which is subsequent to FIG. 9.

Next, using the photoresist pattern RP3 as an etching mask, the insulating film GF1 is etched to be removed from the lower-breakdown-voltage MISFET formation region 1B, while the insulating film MZ is left in the memory region 1A and the insulating film GF1 is left in the higher-breakdown-voltage MISFET formation region 1C. As the etching performed at this time, wet etching can be used appropriately. As an etchant, an etchant with which the insulating film GF1 is likely to be etched and the semiconductor substrate SB is less likely to be etched than the insulating film GF1 is used preferably. For example, a hydrofluoric acid can be used appropriately. In the lower-breakdown-voltage MISFET formation region 1B, as a result of the removal of the insulating film GF1 therefrom, the top surface (silicon surface) of the semiconductor substrate SB (p-type well PW2) is exposed. Subsequently, the photoresist pattern RP3 is removed. FIG. 10 shows this process stage.

Figure 11:
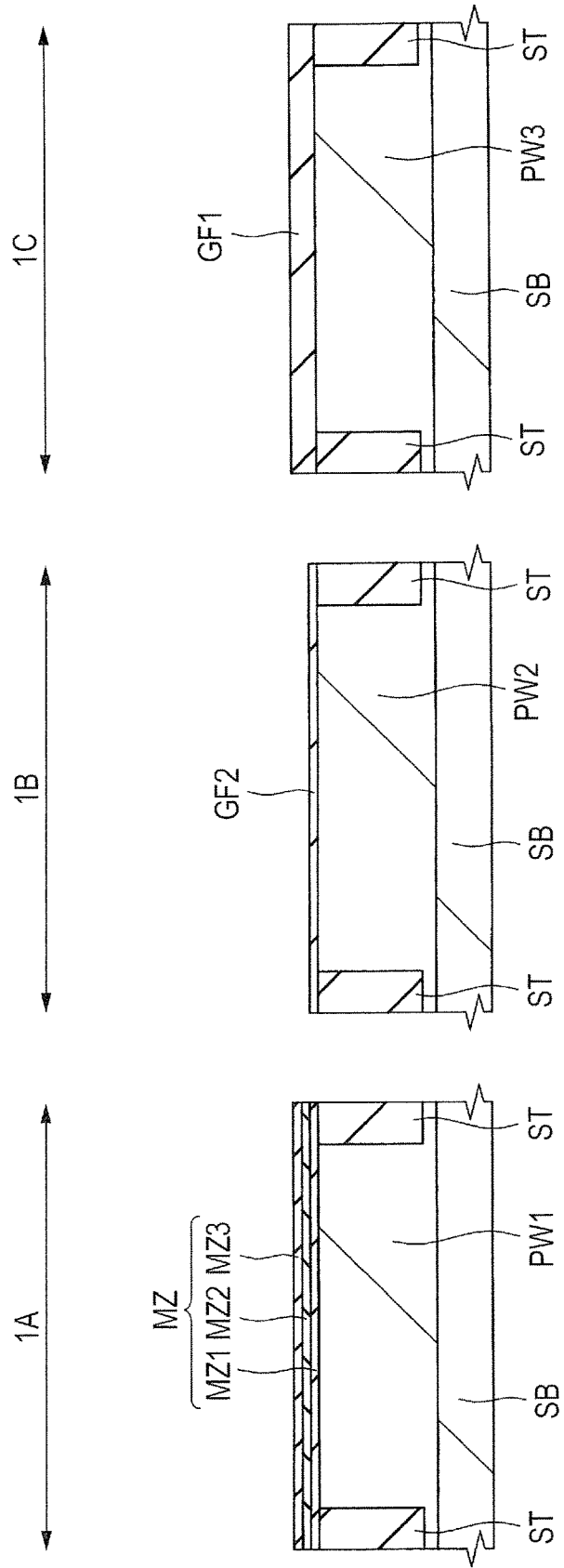
FIG. 11 is a main-portion cross-sectional view of the semiconductor device during the manufacturing process thereof, which is subsequent to FIG. 10.

Next, as shown in FIG. 11, over the top surface of the semiconductor substrate SB (p-type well PW2) located in the lower-breakdown-voltage MISFET formation region 1B, an insulating film GF2 is formed.

The insulating film GF2 is an insulating film for the gate insulating film of the MISFET 2 formed in the lower-breakdown-voltage MISFET formation region 1B. The insulating film GF2 is preferably made of a silicon dioxide film and can be formed by thermal oxidation treatment (thermal oxidation method). The formed film thickness of the insulating film GF2 is smaller than the formed film thickness of the insulating film GF1 in the step shown in FIG. 3 described above and can be controlled to, e.g., about 1 to 4 nm. When the step of forming the insulating film GF2 (thermal oxidation treatment for forming the insulating film GF2) is performed, over the top surface (silicon surface) of the semiconductor substrate SB (p-type well PW2) located in the lower-breakdown-voltage MISFET formation region 1B, the insulating film GF2 is formed. At the process stage immediately before the step of forming the insulating film GF2 is performed, the outermost surface in the memory region 1A corresponds to the insulating film MZ3 and the outermost surface in the higher-breakdown-voltage MISFET formation region 1C corresponds to the insulating film GF1. Accordingly, when the step of forming the insulating film GF2 (thermal oxidation treatment for forming the insulating film GF2) is performed, in the memory region 1A, the thickness of the insulating film MZ3 is increased, while the insulating film GF2 is not formed. In the higher-breakdown-voltage MISFET formation region 1C, the thickness of the insulating film GF1 is increased, while the insulating film GF2 is not formed. Note that, among the insulating films MZ1, MZ2, and MZ3 included in the insulating film MZ, the insulating film MZ3 is influenced (the thickness thereof is increased) by the step of forming the insulating film GF2. Since the insulating film MZ1 is covered with the insulating film MZ2, oxygen is not supplied thereto. Consequently, the insulating film MZ1 is less likely to be influenced by the oxidation step and the thickness of the insulating film MZ1 is scarcely increased.

In this manner, the structure shown in FIG. 11 is obtained. In the structure shown in FIG. 11, in the memory region 1A, the insulating film MZ made of the multi-layer film including the insulating films MZ1, MZ2, and MZ3 is formed over the semiconductor substrate SB (p-type well PW1). In the lower-breakdown-voltage MISFET formation region 1B, the insulating film GF2 is formed over the semiconductor substrate SB (p-type well PW2). In the higher-breakdown-voltage MISFET formation region 1C, the insulating film GF1 is formed over the semiconductor substrate SB (p-type well PW3).

Figure 12:
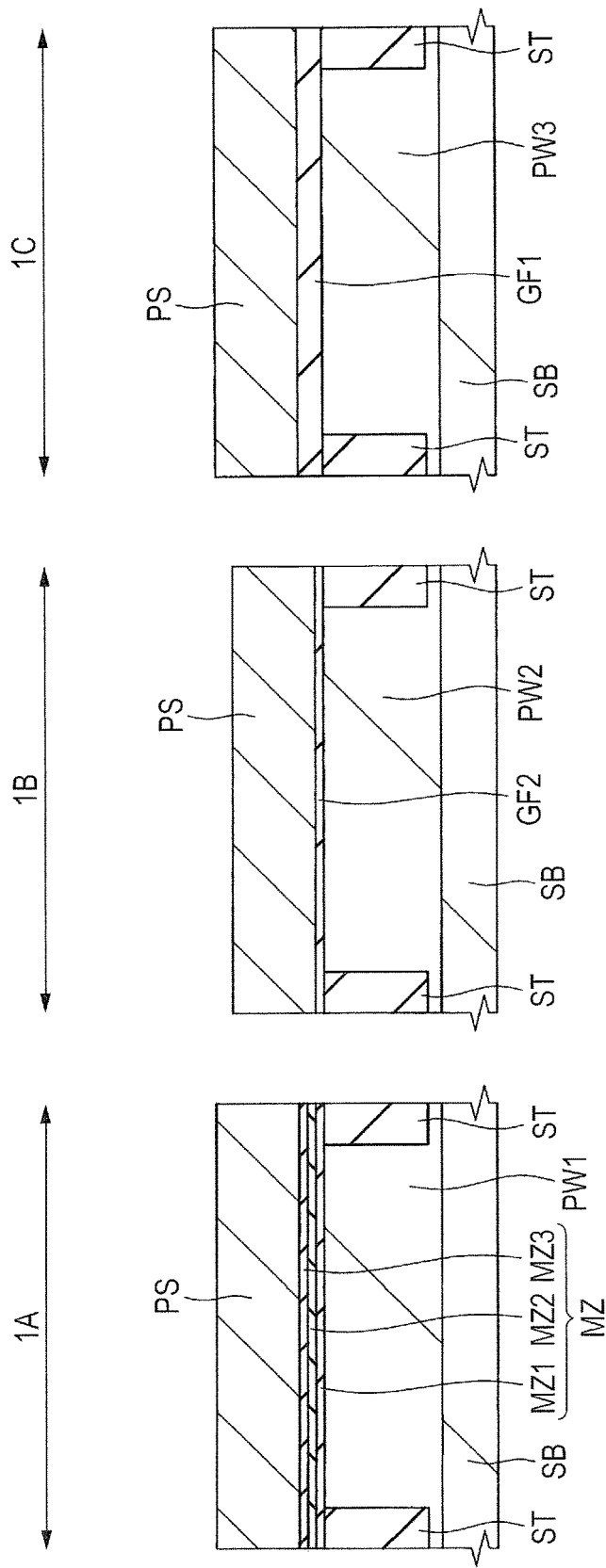
FIG. 12 is a main-portion cross-sectional view of the semiconductor device during the manufacturing process thereof, which is subsequent to FIG. 11.

Next, as shown in FIG. 12, over the main surface (entire main surface) of the semiconductor substrate SB, a silicon film PS is formed as a film (conductive film) for forming gate electrodes. In the memory region 1A, the silicon film PS is formed over the insulating film MZ. In the lower-breakdown-voltage MISFET formation region 1B, the silicon film PS is formed over the insulating film GF2. In the higher-breakdown-voltage MISFET formation region 1C, the silicon film PS is formed over the insulating film GF1. The silicon film PS serves as each of a film for forming the gate electrode MG for the memory element MC, a film for forming a gate electrode GE1 for the MISFET 2, and a film for forming a gate electrode GE2 for the MISFET 3.

The silicon film PS is made of a polycrystalline silicon film and can be formed using a CVD method or the like. The thickness of the silicon film PS is preferably controlled to 30 to 200 nm, e.g., about 100 nm. It is also possible to form an amorphous silicon film as the silicon film PS during the deposition thereof and then change the amorphous silicon film to a polycrystalline silicon film by the subsequent heat treatment. The silicon film PS can be a doped polysilicon film in which an n-type impurity is introduced. In another form, the silicon film PS can also be a doped polysilicon film in which a p-type impurity is introduced or a non-doped polysilicon film in which an impurity is not intentionally introduced. In the case of introducing an n-type or p-type impurity into the silicon film PS, the n-type or p-type impurity can be introduced into the silicon film PS during or after the deposition thereof.

Figure 13:
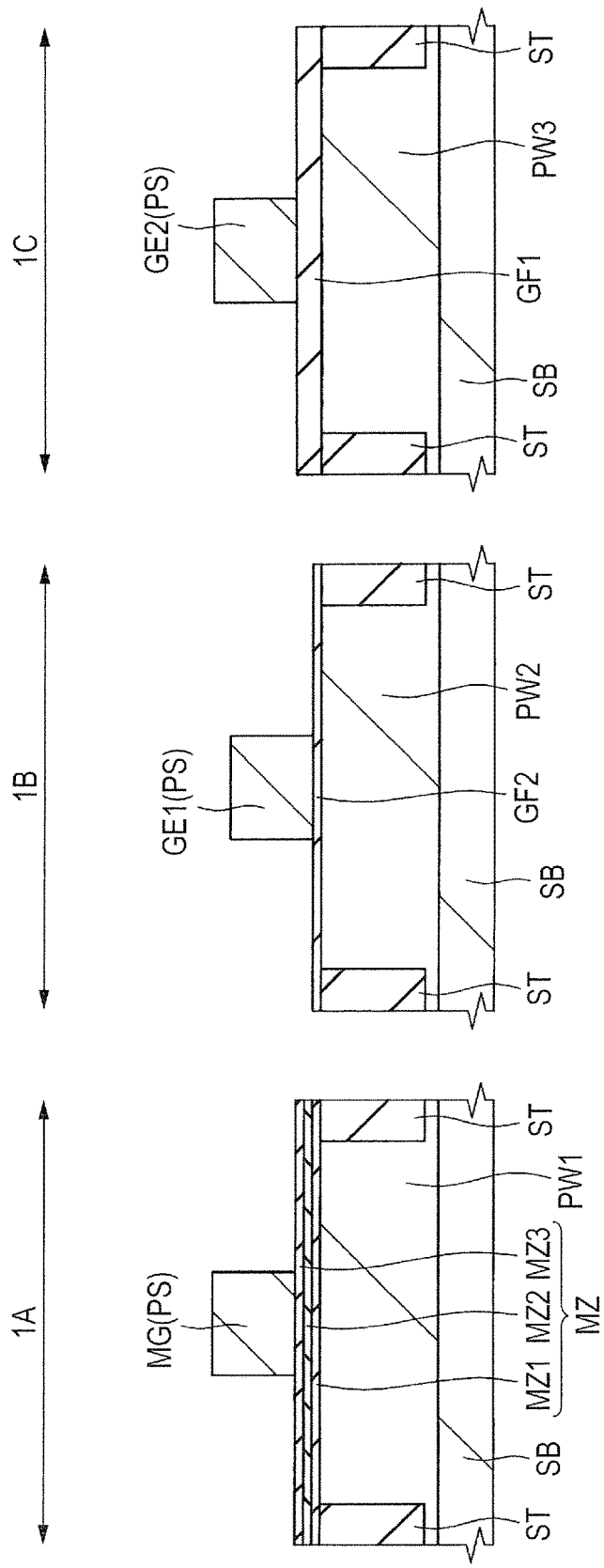
FIG. 13 is a main-portion cross-sectional view of the semiconductor device during the manufacturing process thereof, which is subsequent to FIG. 12.

Next, as shown in FIG. 13, the silicon film PS is patterned using a photolithographic technique or an etching technique to form the gate electrodes MG, GE1, and GE2. For example, this patterning step can be performed as follows.

That is, first, over the silicon film PS, a photoresist pattern (not shown) is formed using a photolithographic technique. The photoresist pattern is formed in the area of the memory region 1A where the gate electrode MG is to be formed, in the area of the lower-breakdown-voltage MISFET formation region 1B where the gate electrode GE1 is to be formed, and in the area of the higher-breakdown-voltage MISFET formation region 1C where the gate electrode GE2 is to be formed. Then, using the photoresist pattern as an etching mask, the silicon film PS is etched (preferably by dry etching) to be patterned. Then, the photoresist pattern is removed. FIG. 13 shows this process stage.

Thus, the silicon film PS is patterned and, as shown in FIG. 13, the gate electrodes MG, GE1, and GE2 each made of the patterned silicon film PS are formed. The gate electrode MG is formed over the insulating film MZ in the memory region 1A. The gate electrode GE1 is formed over the insulating film GF2 in the lower-breakdown-voltage MISFET formation region 1B. The gate electrode GE2 is formed over the insulating film GF1 in the higher-breakdown-voltage MISFET formation region 1C. That is, in the memory region 1A, the gate electrode MG is formed over the semiconductor substrate SB (p-type well PW1) via the insulating film MZ. In the lower-breakdown-voltage MISFET formation region 1B, the gate electrode GE1 is formed over the semiconductor substrate SB (p-type well PW2) via the insulating film GF2. In the higher-breakdown-voltage MISFET formation region 1C, the gate electrode GE2 is formed over the semiconductor substrate SB (p-type well PW3) via the insulating film GF1.

In another form, the gate electrodes MG, GE1, and GE2 can also be formed by forming the silicon film PS, then forming an insulating film for cap insulating films over the silicon film PS, and patterning a multi-layer film including the insulating film and the silicon film. In this case, over the respective gate electrodes MG, GE1, and GE2, the cap insulating films are formed.

Figure 14:
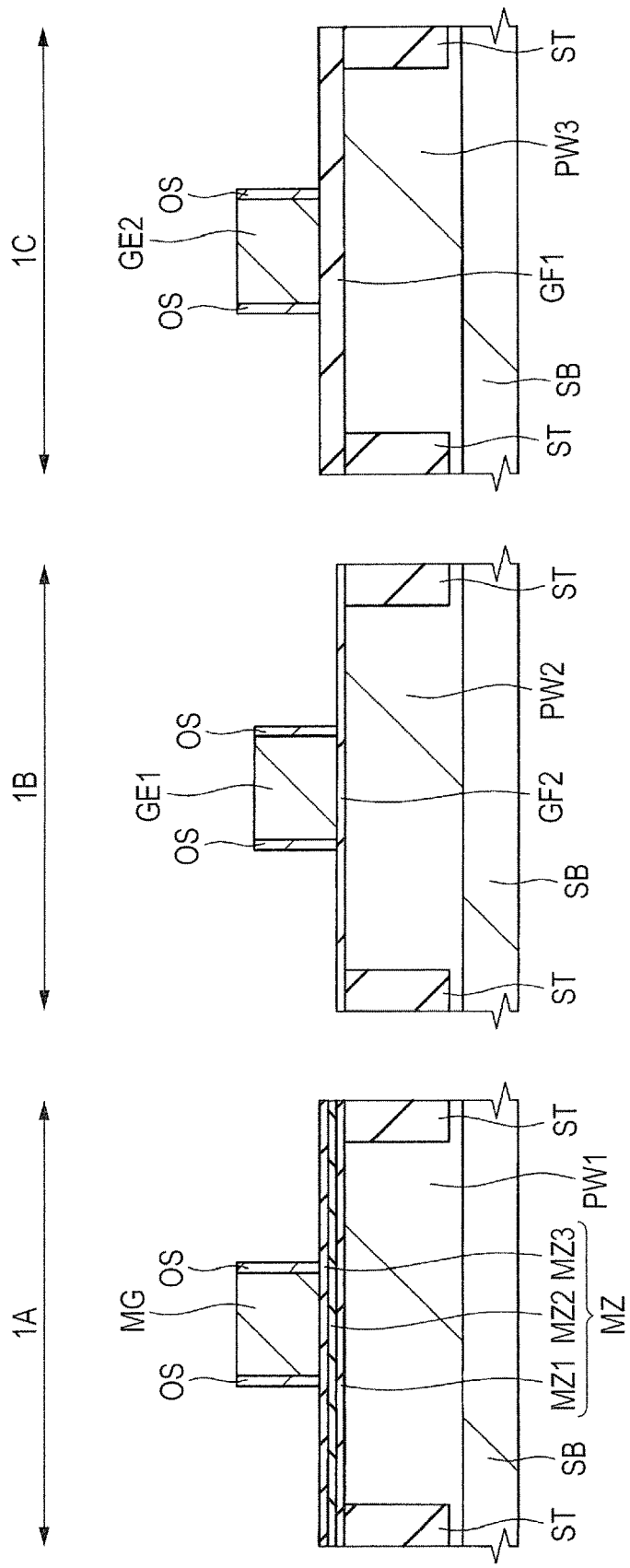
FIG. 14 is a main-portion cross-sectional view of the semiconductor device during the manufacturing process thereof, which is subsequent to FIG. 13.

Next, over the entire main surface of the semiconductor substrate SB, an insulating film (such as e.g., a silicon dioxide film or a multi-layer film including a silicon nitride film and a silicon dioxide film) for forming offset spacers OS is formed using a CVD method or the like. Then, the insulating film for forming the offset spacers OS is etched back using an anisotropic etching technique. As a result, as shown in FIG. 14, the offset spacers (side-wall insulating films) OS are formed over the respective side walls of the gate electrodes MG, GE1, and GE2. In another form, the formation of the offset spacers OS can also be omitted.

Figure 15:
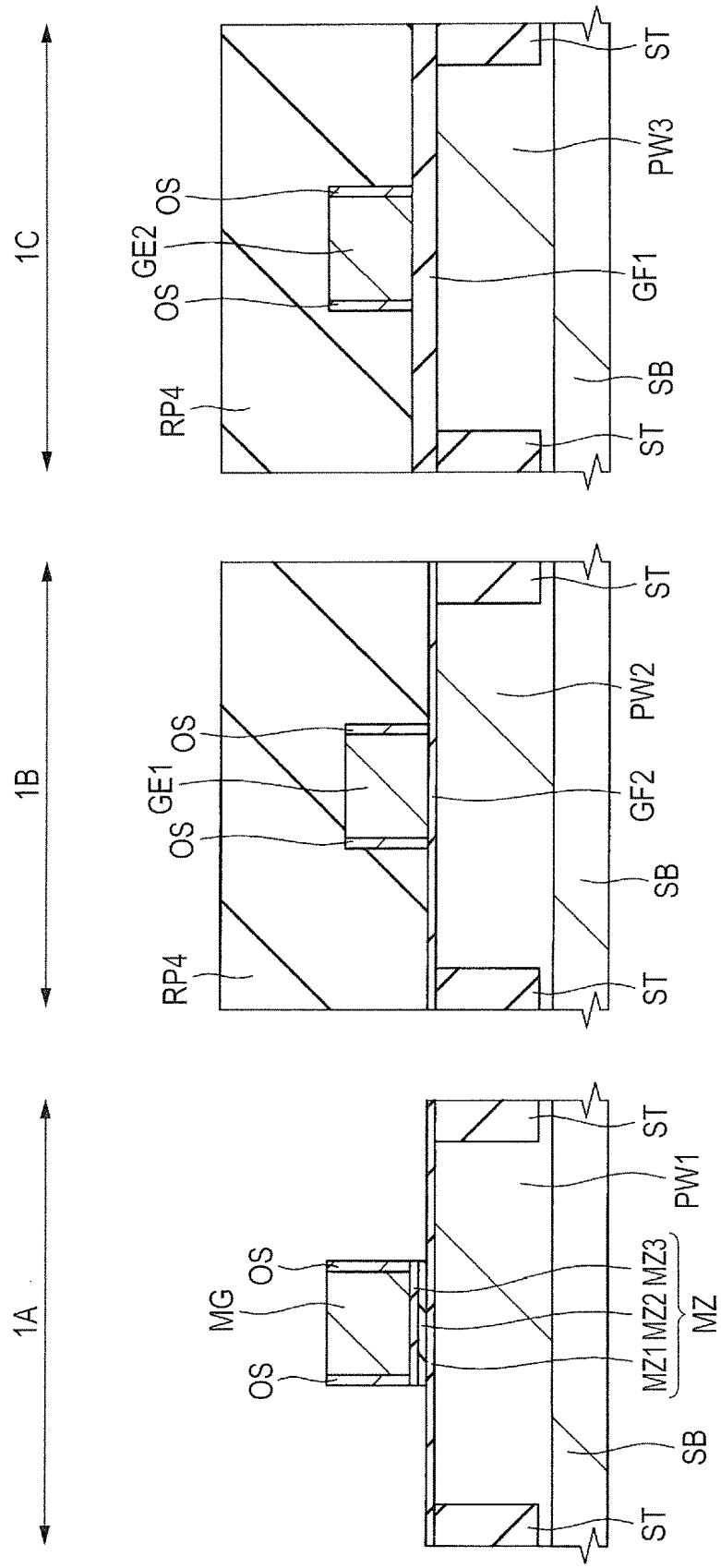
FIG. 15 is a main-portion cross-sectional view of the semiconductor device during the manufacturing process thereof, which is subsequent to FIG. 14.

Next, as shown in FIG. 15, over the semiconductor substrate SB, a photoresist pattern RP4 is formed as a mask layer using a photolithographic technique. The photoresist pattern RP4 covers each of the lower-breakdown-voltage MISFET formation region 1B and the higher-breakdown-voltage MISFET formation region 1C and exposes the memory region 1A.

Next, as shown in FIG. 15, in the memory region 1A, the portions of the insulating films MZ3 and MZ2 which are uncovered with the gate electrode MG are removed by etching. As the etching performed at this time, anisotropic dry etching can be used. Specifically, first, the portion of the insulating film MZ3 which is uncovered with the gate electrode MG is etched to be removed under a condition such that the insulating film MZ2 is less likely to be etched than the insulating film MZ3. Then, the portion of the insulating film MZ2 which is uncovered with the gate electrode MG is etched to be removed under a condition such that the insulating film MZ1 is less likely to be etched than the insulating film MZ2. Preferably, the insulating film MZ1 is caused to function as an etching stopper film and left in the form of a layer. Note that the portion of the insulating film MZ (insulating films MZ3, MZ2, and MZ1) which is covered with the gate electrode MG is not etched and remains. Each of the lower-breakdown-voltage MISFET formation region 1B and the higher-breakdown-voltage MISFET formation region 1C, which are covered with the photoresist pattern RP4, is not etched.

Figure 16:
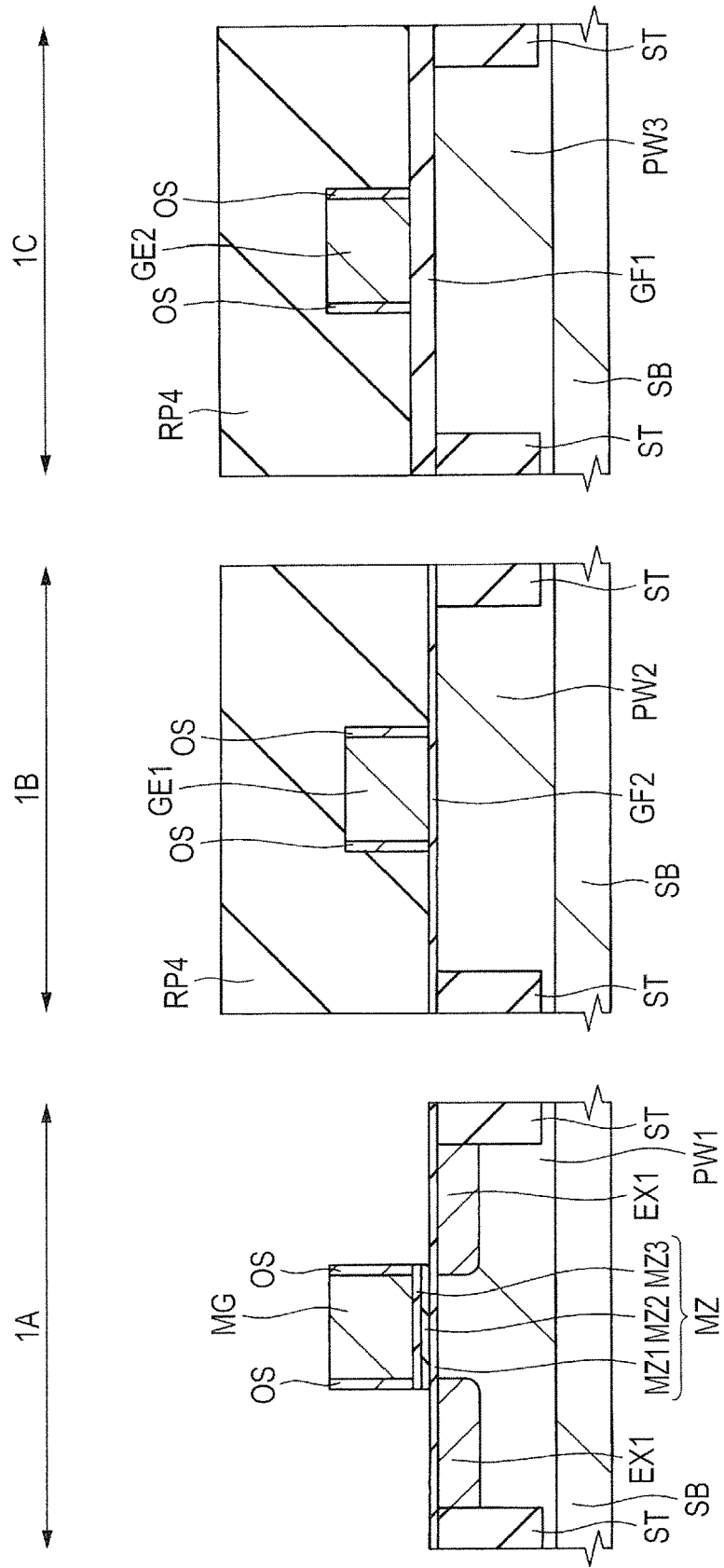
FIG. 16 is a main-portion cross-sectional view of the semiconductor device during the manufacturing process thereof, which is subsequent to FIG. 15.

Next, as shown in FIG. 16, in the semiconductor substrate SB (p-type well PW1) located in the memory region 1A, n⁻-type semiconductor regions EX1 are formed by an ion implantation method or the like.

That is, into the areas of the p-type well PW1 in the memory region 1A which are located on both sides of the gate electrode MG, an n-type impurity such as phosphorus (P) or arsenic (As) is ion-implanted to form the n⁻-type semiconductor regions EX1. During the ion implantation for forming the n⁻-type semiconductor regions EX1, the gate electrode MG and the offset spacers OS can function as a mask. Consequently, the n⁻-type semiconductor regions EX1 are formed by self-alignment with the offset spacers OS over the side walls of the gate electrode MG. During the ion implantation, each of the lower-breakdown-voltage MISFET formation region 1B and the higher-breakdown-voltage MISFET formation region 1C is covered with the photoresist pattern RP4 so that the n-type impurity is implanted neither into the lower-breakdown-voltage MISFET formation region 1B nor into the higher-breakdown-voltage MISFET formation region 1C. Subsequently, the photoresist pattern RP4 is removed.

Figure 17:
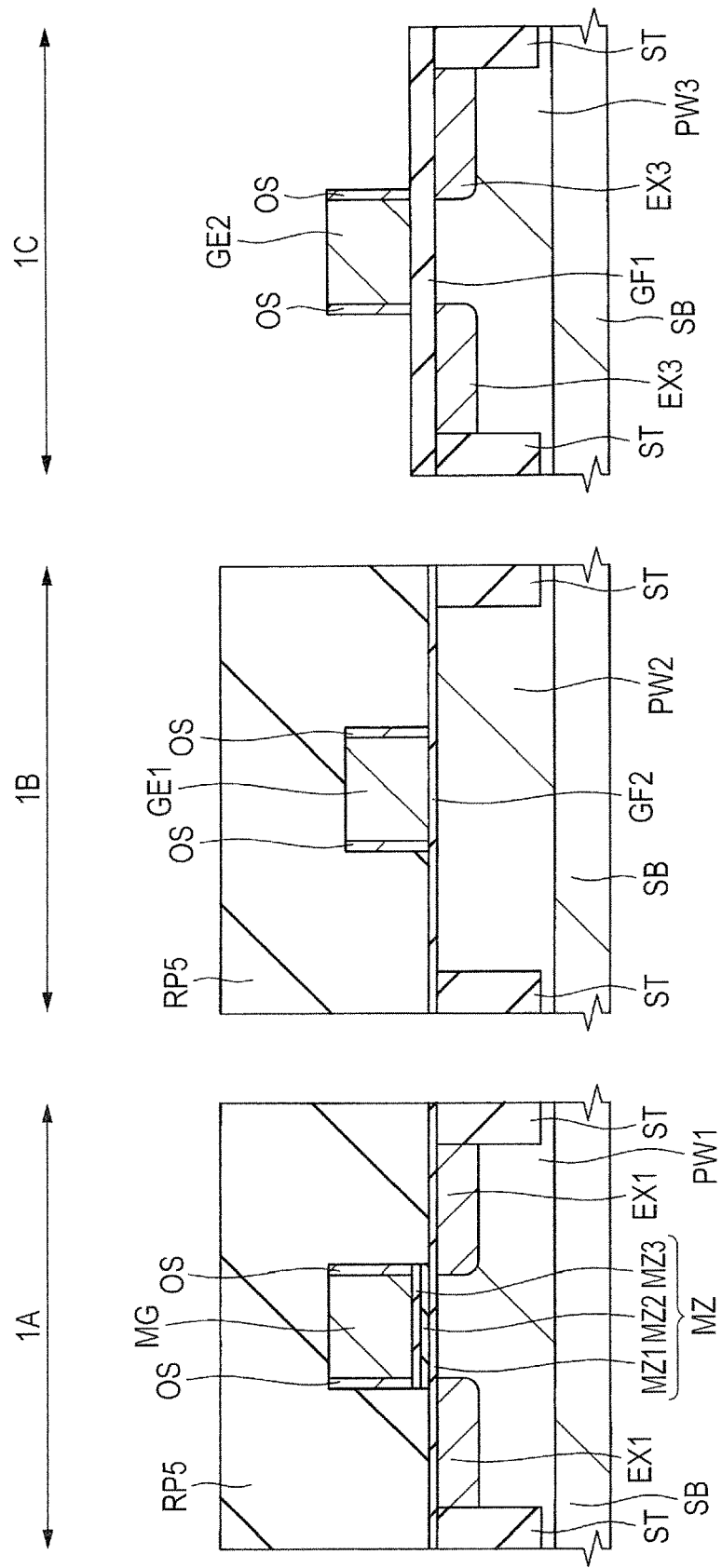
FIG. 17 is a main-portion cross-sectional view of the semiconductor device during the manufacturing process thereof, which is subsequent to FIG. 16.

Next, as shown in FIG. 17, over the semiconductor substrate SB, a photoresist pattern RP5 is formed as a mask layer using a photolithographic technique. The photoresist pattern RP5 covers the memory region 1A and the lower-breakdown-voltage MISFET formation region 1B and exposes the higher-breakdown-voltage MISFET formation region 1C.

Next, as shown in FIG. 17, by an ion implantation method or the like, $n^-$-type semiconductor regions EX3 are formed in the semiconductor substrate SB (p-type well PW3) located in the higher-breakdown-voltage MISFET formation region 1C.

That is, into the areas of the p-type well PW3 in the higher-breakdown-voltage MISFET formation region 1C which are located on both sides of the gate electrode GE2, an n-type impurity such as phosphorus (P) or arsenic (As) is ion-implanted to form the $n^-$-type semiconductor regions EX3. During the ion implantation for forming the $n^-$-type semiconductor regions EX3, the gate electrode GE2 and the offset spacers OS can function as a mask. Consequently, the $n^-$-type semiconductor regions EX3 are formed by self-alignment with the offset spacers OS over the side walls of the gate electrode GE2. Subsequently, the photoresist pattern RP5 is removed.

Figure 18:
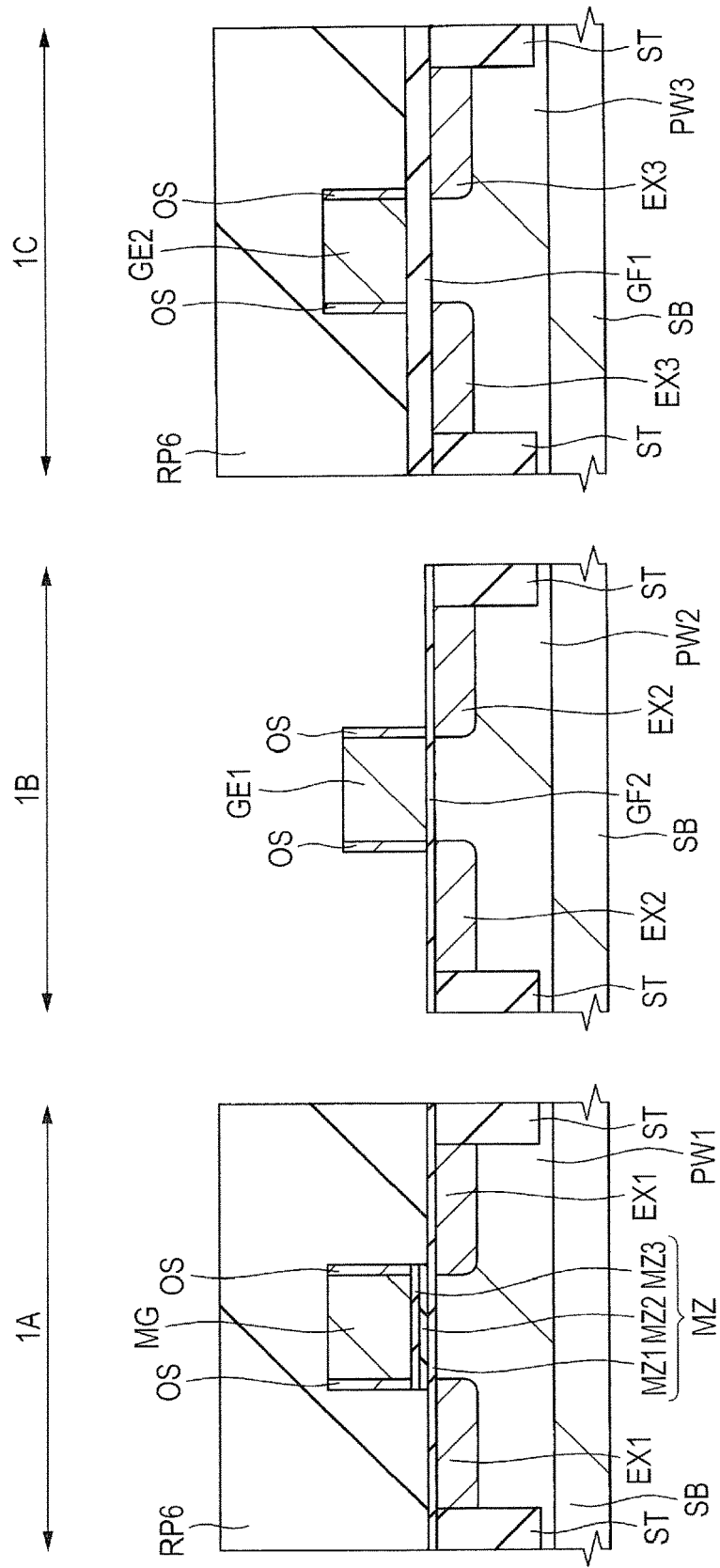
FIG. 18 is a main-portion cross-sectional view of the semiconductor device during the manufacturing process thereof, which is subsequent to FIG. 17.

Next, as shown in FIG. 18, over the semiconductor substrate SB, a photoresist pattern RP6 is formed as a mask layer using a photolithographic technique. The photoresist pattern RP6 covers each of the memory region 1A and the higher-breakdown-voltage MISFET formation region 1C and exposes the lower-breakdown-voltage MISFET formation region 1B.

Next, as shown in FIG. 18, by an ion implantation method or the like, $n^-$-type semiconductor regions EX2 are formed in the semiconductor substrate SB (p-type well PW2) located in the lower-breakdown-voltage MISFET formation region 1B.

That is, into the areas of the p-type well PW2 in the lower-breakdown-voltage MISFET formation region 1B which are located on both sides of the gate electrode GE1, an n-type impurity such as phosphorus (P) or arsenic (As) is ion-implanted to form the $n^-$-type semiconductor regions EX2. During the ion implantation for forming the $n^-$-type semiconductor regions EX2, the gate electrode GE1 and the offset spacers OS can function as a mask. Consequently, the $n^-$-type semiconductor regions EX2 are formed by self-alignment with the offset spacers OS over the side walls of the gate electrode GE1. Subsequently, the photoresist pattern RP6 is removed.

It is also possible to form a combination of any of the $n^-$-type semiconductor regions EX1 in the memory region 1A, the $n^-$-type semiconductor regions EX2 in the lower-breakdown-voltage MISFET formation region 1B, and the $n^-$-type semiconductor regions EX3 in the higher-breakdown-voltage MISFET formation region 1C in the same ion implantation step.

Figure 19:
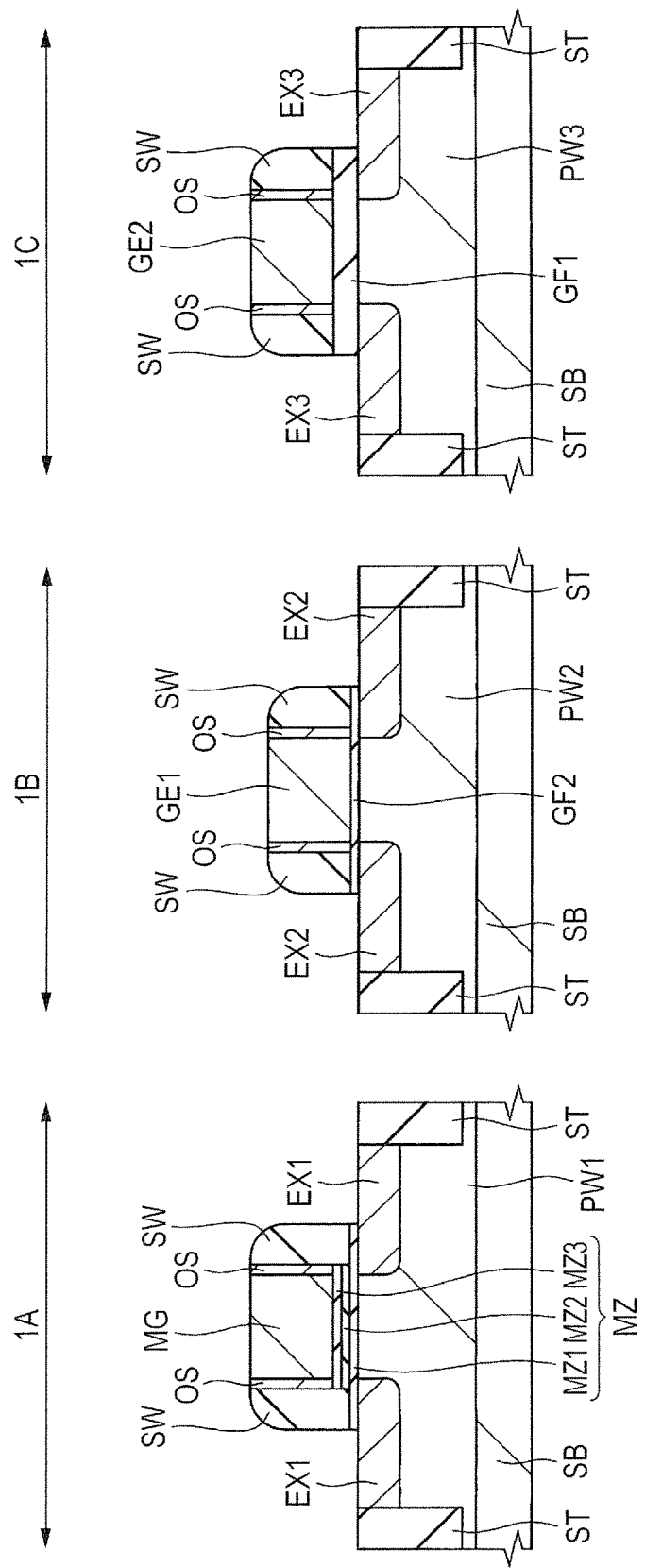
FIG. 19 is a main-portion cross-sectional view of the semiconductor device during the manufacturing process thereof, which is subsequent to FIG. 18.

Next, as shown in FIG. 19, over the respective side walls of the gate electrodes MG, GE1, and GE2, sidewall spacers SW made of an insulating film are formed as side-wall insulating films.

For example, the step of forming the sidewall spacers SW can be performed as follows. That is, over the entire main surface of the semiconductor substrate SB, the insulating film for forming the sidewall spacers SW is formed using a CVD or the like so as to cover the gate electrodes MG, GE1, and GE2. Then, the insulating film is etched back using an anisotropic etching technique. As a result, as shown in FIG. 19, the insulating film for forming the sidewall spacers SW is selectively left over the respective side walls of the gate electrodes MG, GE1, and GE2 to form the sidewall spacers SW.

The portion of the insulating film GF1 which is uncovered with the gate electrode GE1 and the sidewall spacers SW in the lower-breakdown-voltage MISFET formation region 1B and the portion of the insulating film GF2 which is uncovered with the gate electrode GE2 and the sidewall spacers SW in the higher-breakdown-voltage MISFET formation region 1C may be removed by the etch-back step when the sidewall spacers SW are formed. Also, the portion of the insulating film MZ1 which is uncovered with the gate electrode MG and the sidewall spacer SW in the memory region 1A may also be removed by the etch-back step when the sidewall spacers SW are formed.

Figure 20:
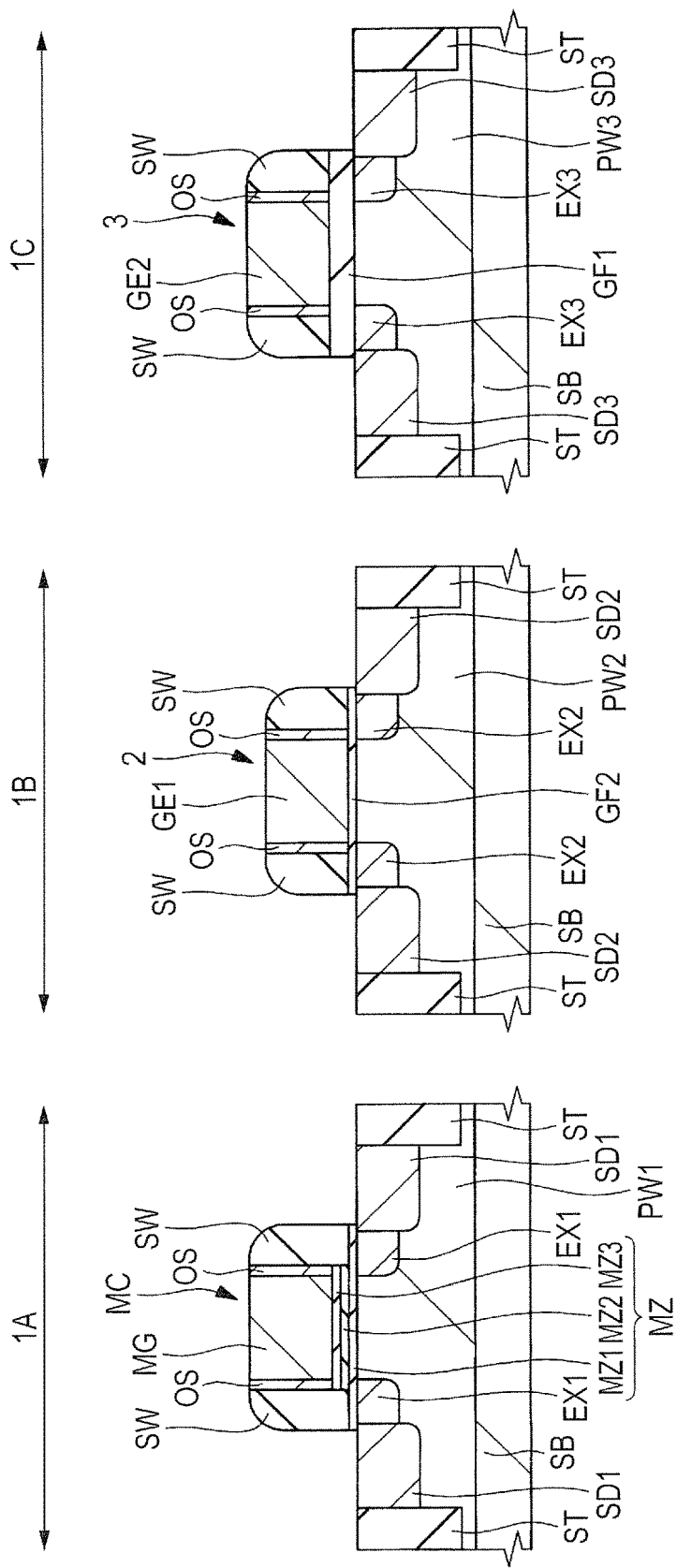
FIG. 20 is a main-portion cross-sectional view of the semiconductor device during the manufacturing process thereof, which is subsequent to FIG. 19.

Next, as shown in FIG. 20, by an ion implantation method or the like, $n^+$-type semiconductor regions SD1 are formed in the semiconductor substrate SB (p-type well PW1) located in the memory region 1A, $n^+$-type semiconductor regions SD2 are formed in the semiconductor substrate SB (p-type well PW2) located in the lower-breakdown-voltage MISFET formation region 1B, and $n^+$-type semiconductor regions SD3 are formed in the semiconductor substrate SB (p-type well PW3) located in the higher-breakdown-voltage MISFET formation region 1C.

That is, in the areas of the p-type well PW1 in the memory region 1A which are located on both sides of the gate electrode MG and the sidewall spacers SW, an n-type impurity such as phosphorus (P) or arsenic (As) is ion-implanted to form the $n^+$-type semiconductor regions SD1. During the ion implantation for forming the $n^+$-type semiconductor regions SD1, the gate electrode MG and the sidewall spacers SW over the side walls thereof can function as a mask. Consequently, the $n^+$-type semiconductor regions SD1 are formed by self-alignment with the side surfaces of the sidewall spacers SW over the side walls of the gate electrode MG. As a result, in the semiconductor substrate SB (p-type well PW1) located in the memory region 1A, on both sides (both sides in a gate length direction) of a structure including the gate electrode MG and the sidewall spacers SW over the side walls thereof, the $n^+$-type semiconductor regions SD1 are formed. The $n^+$-type semiconductor regions SD1 have impurity concentrations higher than those of the $n^-$-type semiconductor regions EX1 and junction depths deeper than those thereof.

Also, in the areas of the p-type well PW2 in the lower-breakdown-voltage MISFET formation region 1B which are located on both sides of the gate electrode GE1 and the sidewall spacers SW, an n-type impurity such as phosphorus (P) or arsenic (As) is ion-implanted to form the $n^+$-type semiconductor regions SD2. During the ion implantation for forming the $n^+$-type semiconductor regions SD2, the gate electrode GE1 and the sidewall spacers SW over the side walls thereof can function as a mask. Consequently, the $n^+$-type semiconductor regions SD2 are formed by self-alignment with the side surfaces of the sidewall spacers SW over the side walls of the gate electrode GE1. As a result, in the semiconductor substrate SB (p-type well PW2) located in the lower-breakdown-voltage MISFET formation region 1B, on both sides (both sides in the gate length direction) of a structure including the gate electrode GE1 and the sidewall spacers SW over the side walls thereof, the $n^+$-type semiconductor regions SD2 are formed. The $n^+$-type semiconductor regions SD2 have impurity concentrations higher than those of the $n^-$-type semiconductor regions EX2 and junction depths deeper than those thereof.

Also, in the areas of the p-type well PW2 in the higher-breakdown-voltage MISFET formation region 1C which are located on both sides of the gate electrode GE2 and the sidewall spacers SW, an n-type impurity such as phosphorus (P) or arsenic (As) is ion-implanted to form the $n^+$-type semiconductor regions SD3. During the ion implantation for forming the $n^+$-type semiconductor regions SD3, the gate electrode GE2 and the sidewall spacers SW over the side walls thereof can function as a mask. Consequently, the $n^+$-type semiconductor regions SD3 are formed by self-alignment with the side surfaces of the sidewall spacers SW over the side walls of the gate electrode GE2. As a result, in the semiconductor substrate SB (p-type well PW3) located in the higher-breakdown-voltage MISFET formation region 1C, on both sides (both sides in the gate length direction) of a structure including the gate electrode GE2 and the sidewall spacers SW over the side walls thereof, the $n^+$-type semiconductor regions SD3 are formed. The $n^+$-type semiconductor regions SD3 have impurity concentrations higher than those of the $n^-$-type semiconductor regions EX3 and junction depths deeper than those thereof.

The $n^+$-type semiconductor regions SD1 in the memory region 1A, the $n^+$-type semiconductor regions SD2 in the lower-breakdown-voltage MISFET formation region 1B, and the $n^+$-type semiconductor regions SD3 in the higher-breakdown-voltage MISFET formation region 1C can be formed by the same ion implantation step, but can also be formed by different ion implantation steps.

In another form, the $n^+$-type semiconductor regions SD1 can also be formed shallower than the $n^-$-type semiconductor regions EX1. In that case, the $n^+$-type semiconductor regions SD1 are formed so as to be enclosed in the $n^-$-type semiconductor regions EX1. Also, the $n^+$-type semiconductor regions SD3 can also be formed shallower than the $n^-$-type semiconductor regions EX3. In that case, the $n^+$-type semiconductor regions SD3 are formed so as to be enclosed in the $n^-$-type semiconductor regions EX3.

Next, activation anneal as heat treatment for activating the impurities introduced heretofore is performed.

Thus, the memory element MC is formed in the memory region 1A, the lower-breakdown-voltage MISFET 2 is formed in the lower-breakdown-voltage MISFET formation region 1B, and the higher-breakdown-voltage MISFET 3 is formed in the higher-breakdown-voltage MISFET formation region 1C. The gate electrode MG functions as the gate electrode of the memory element MC, and the insulating film MZ under the gate electrode MG functions as the gate insulating film of the memory element MC. Also, the gate electrode GE1 functions as the gate electrode of the MISFET 2, and the insulating film GF2 under the gate electrode GE1 functions as the gate insulating film of the MISFET 2. Also, the gate electrode GE2 functions as the gate electrode of the MISFET 3, and the insulating film GF1 under the gate electrode GE2 functions as the gate insulating film of the MISFET 3.

In the semiconductor substrate SB (p-type well PW1) located in the memory region 1A, the $n^-$-type semiconductor regions EX1 and the $n^+$-type semiconductor regions SD1 having impurity concentrations higher than those of the $n^-$-type semiconductor regions EX1 form the n-type semiconductor regions each functioning as the source or drain semiconductor region (source/drain region) of the memory element MC. In the semiconductor substrate SB (p-type well PW2) located in the lower-breakdown-voltage MISFET formation region 1B, the $n^-$-type semiconductor regions EX2 and the $n^+$-type semiconductor regions SD2 having impurity concentrations higher than those of the $n^-$-type semiconductor regions EX2 form the n-type semiconductor regions each functioning as the source or drain semiconductor region (source/drain region) of the MISFET 2. In the semiconductor substrate SB (p-type well PW3) located in the higher-breakdown-voltage MISFET formation region 1C, the $n^-$-type semiconductor regions EX3 and the $n^+$-type semiconductor regions SD3 having impurity concentrations higher than those of the $n^-$-type semiconductor regions EX3 form the n-type semiconductor regions each functioning as the source or drain semiconductor region (source/drain region) of the MISFET 3.

Figure 21:
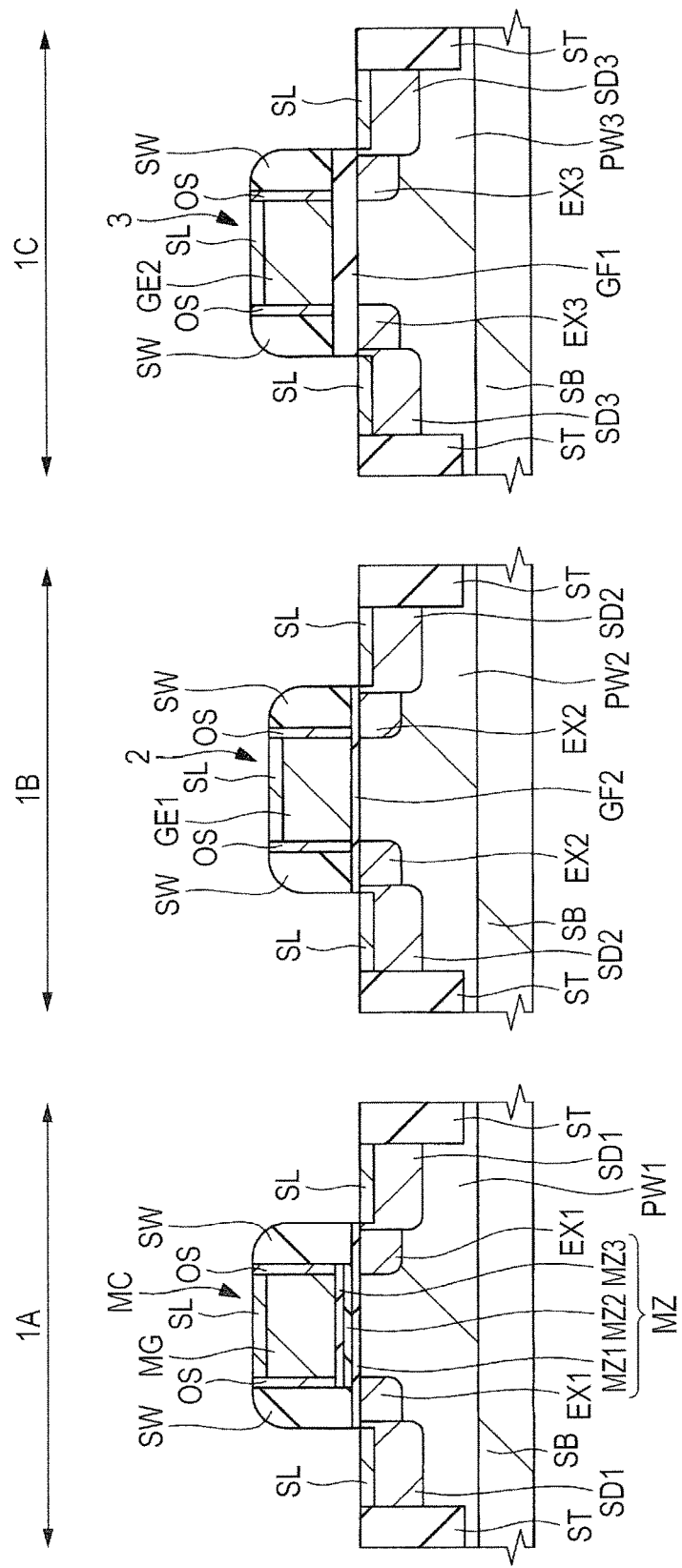
FIG. 21 is a main-portion cross-sectional view of the semiconductor device during the manufacturing process thereof, which is subsequent to FIG. 20.

Next, as shown in FIG. 21, by a Salicide (Self Aligned Silicide) process, metal silicide layers SL are formed. The metal silicide layers SL can be formed as follows.

First, etching is performed as necessary to clean (expose) the respective upper surfaces of the $n^+$-type semiconductor regions SD1, SD2, and SD3 and the respective upper surfaces of the gate electrodes MG, GE1, and GE2. Then, over the main surface of the semiconductor substrate SB, a metal film for forming the metal silicide layers SL is formed so as to cover the gate electrodes MG, GE1, and GE2 and the sidewall spacers SW. The metal film is made of, e.g., a cobalt film, a nickel film, a nickel-platinum alloy film, or the like. Then, heat treatment is performed on the semiconductor substrate SB to cause the respective upper portions of the $n^+$-type semiconductor regions SD1, SD2, and SD3 and the respective upper portions of the gate electrodes MG, GE1, and GE2 to react with the foregoing metal film. As a result, as shown in FIG. 21, the metal silicide layers SL are formed in the respective upper portions of the $n^+$-type semiconductor regions SD1, SD2, and SD3 and the gate electrodes MG, GE1, and GE2. Then, the unreacted metal film is removed. FIG. 21 shows a cross-sectional view at this process stage. By forming the metal silicide layers SL, the contact resistances, diffusion resistances, and the like of the gate electrodes MG, GE1, and GE2 and the $n^+$-type semiconductor regions SD1, SD2, and SD3 can be reduced. When the metal silicide layers SL are unnecessary, the formation thereof can also be omitted.

Figure 22:
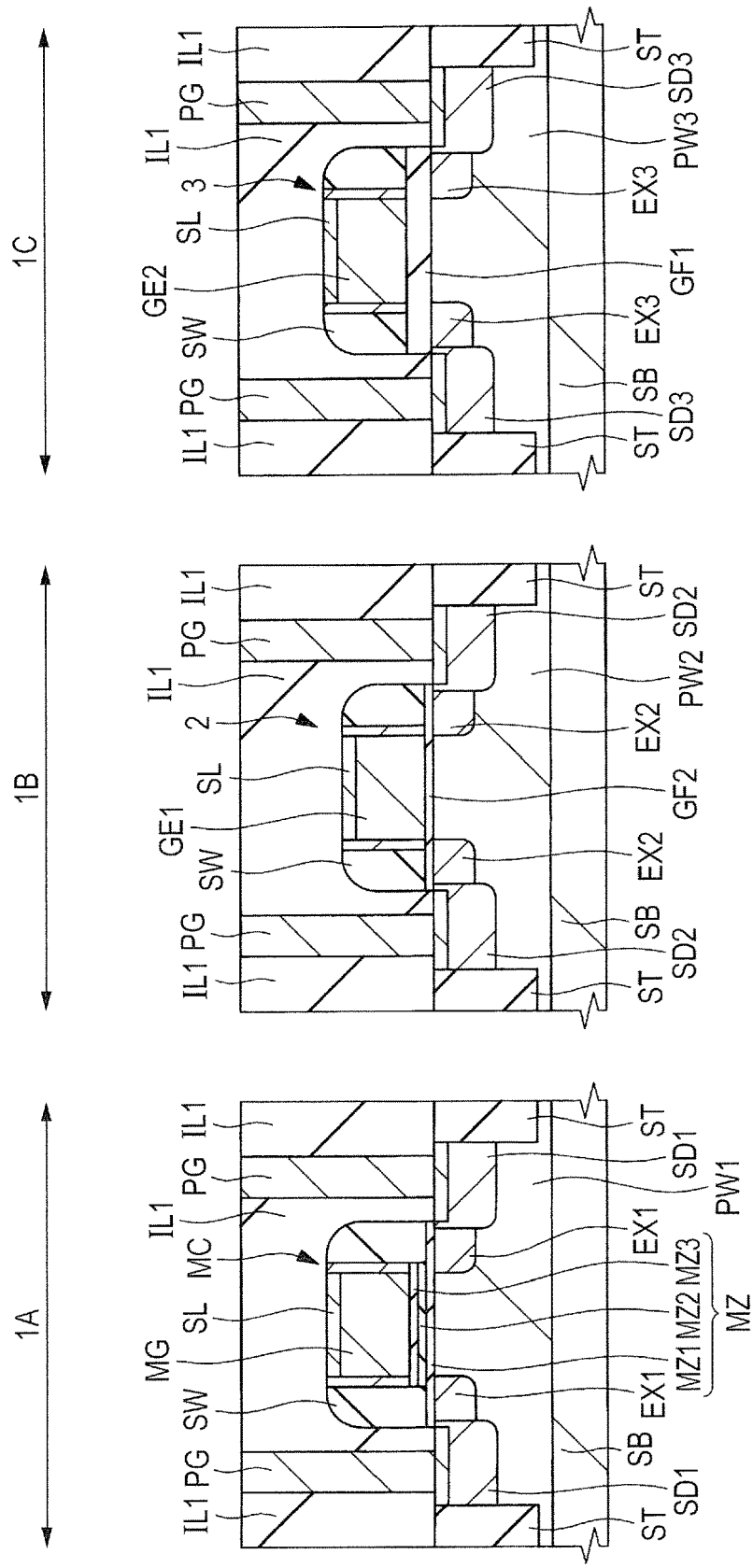
FIG. 22 is a main-portion cross-sectional view of the semiconductor device during the manufacturing process thereof, which is subsequent to FIG. 21.

Next, as shown in FIG. 22, over the entire main surface of the semiconductor substrate SB, an insulating film IL1 is formed as an interlayer insulating film so as to cover the gate electrodes MG, GE1, and GE2 and the sidewall spacers SW. As the insulating film IL1, a single-layer silicon dioxide film, a multi-layer film including a silicon nitride film and a thicker silicon dioxide film over the silicon nitride film, or the like can be used. After the formation of the insulating film IL1, as necessary, the upper surface of the insulating film IL1 can also be polished by a CMP (Chemical Mechanical Polishing) method to be planarized.

Next, using a photoresist pattern (not shown) formed over the insulating film IL1 using a photolithographic method as an etching mask, the insulating film IL1 is dry-etched to be formed with contact holes. Then, in the contact holes, conductive plugs PG made of tungsten (W) or the like are formed. For example, by successively forming a barrier conductor film and a tungsten film over the insulating film IL1 including the insides of the contact holes and then removing the unneeded main conductor film and the unneeded barrier conductor film which are located outside the contact holes by a CMP method, an etch-back method, or the like, the plugs PG can be formed. The plugs PG are electrically coupled to the metal silicide layers SL over the $n^+$-type semiconductor regions SD1, SD2, and SD3, the metal silicide layers SL over the gate electrodes MG, GE1, and GE2, and the like.

Figure 23:
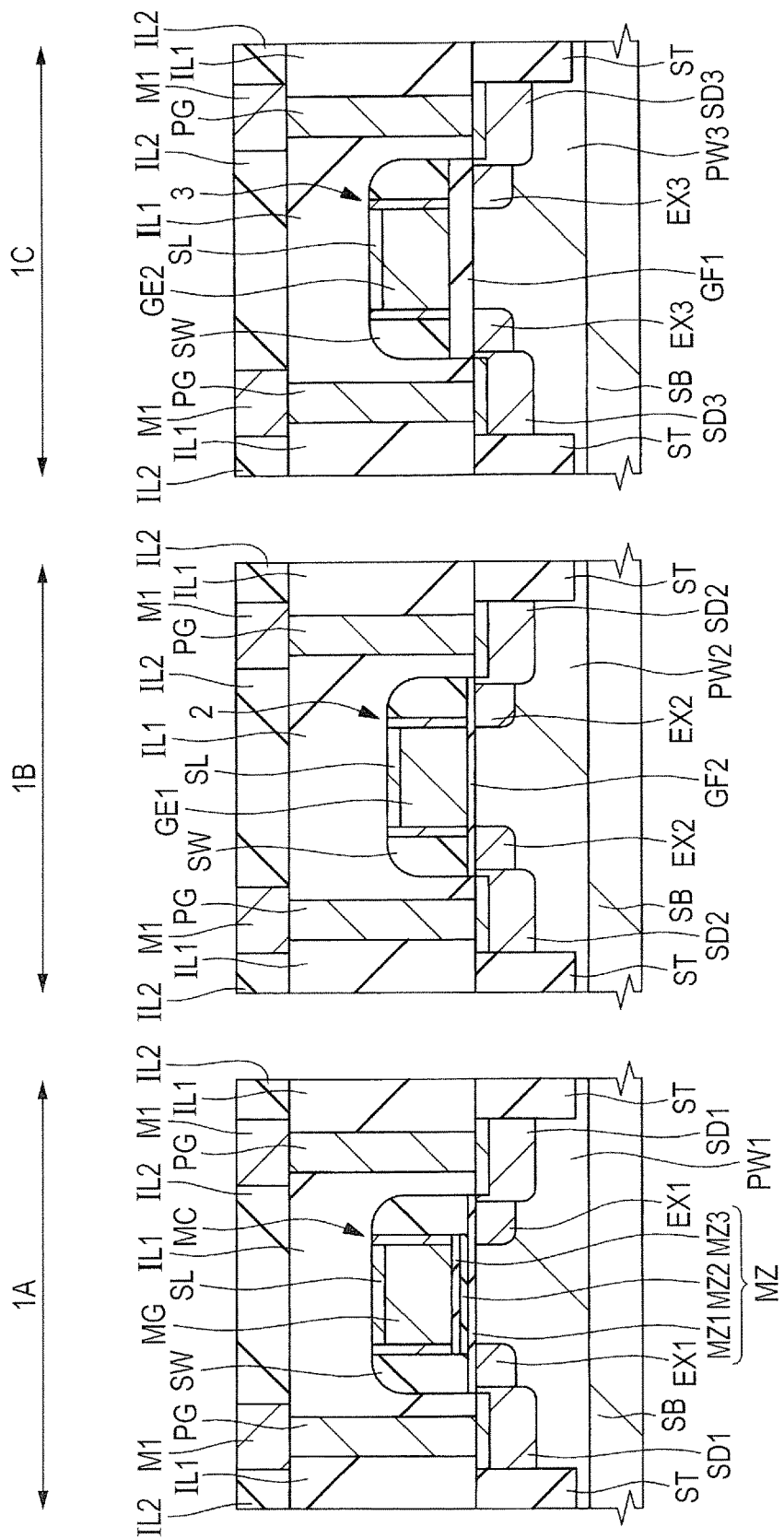
FIG. 23 is a main-portion cross-sectional view of the semiconductor device during the manufacturing process thereof, which is subsequent to FIG. 22.

Next, as shown in FIG. 23, over the insulating film IL1 in which the plugs PG are embedded, an insulating film IL2 is formed and wire trenches are formed in the predetermined regions of the insulating film IL2. Then, in the wire trenches, wires M1 are embedded using a single damascene technique. For example, the wires M1 are copper wires (embedded copper wires) containing copper as a main component. The wires M1 are electrically coupled to the $n^+$-type semiconductor regions SD1, SD2, and SD3, the gate electrodes MG, GE1, and GE2, and the like via the plugs PG.

Then, using a dual damascene method or the like, wires in the second and subsequent layers are formed, but the illustration and description thereof is omitted herein. Note that the wires M1 and the wires in the layers located thereabove are not limited to damascene wires and can also be formed by patterning a conductor film for the wires. For example, the wires M1 and the wires in the layers located thereabove can also be tungsten wires, aluminum wires, or the like.

In this manner, the semiconductor device in Embodiment 1 is manufactured.

<About Structure of Semiconductor Device>

The semiconductor device in Embodiment 1 includes the nonvolatile memory element MC. The memory element MC is a single-gate memory element and formed in the memory region 1A of the semiconductor substrate SB.

Specifically, as shown in FIG. 20 or the like, the memory element MC includes the insulating film MZ formed over the semiconductor substrate SB (over the p-type well PW1) located in the memory region 1A and the gate electrode (memory gate electrode) MG formed over the insulating film MZ. That is, over the top surface of the semiconductor substrate SB (p-type well PW1) located in the memory region 1A, the gate electrode MG is formed via the insulating film MZ functioning as the gate insulating film having the charge storage portion. The memory element MC further includes the sidewall spacers SW formed over the side walls of the gate electrode MG and the source or drain n-type semiconductor regions ($n^-$-type semiconductor regions EX1 and $n^+$-type semiconductor regions SD1) formed in the p-type well PW1 of the semiconductor substrate SB.

The insulating film MZ interposed between the semiconductor substrate SB (p-type well PW1) and the gate electrode MG functions as the gate insulating film and has the inner charge storage portion. The insulating film MZ is made of the multi-layer film (multi-layer insulating film) including the insulating film MZ1, the insulating film MZ2 formed over the insulating film MZ1, and the insulating film MZ3 formed over the insulating film MZ2.

In the insulating film MZ, the insulating film MZ2 has a charge storing function. That is, in the insulating film MZ, the insulating film MZ2 is intended to store charges therein and functions as the charge storage layer (charge storage portion). That is, the insulating film MZ2 is a trapping insulating film formed in the insulating film MZ. The trapping insulating film mentioned herein refers to an insulating film capable of storing charges therein. Accordingly, the insulating film MZ can be regarded as an insulating film having the inner charge storage portion (which is the insulating film MZ2 herein).

In the insulating film MZ, each of the insulating films MZ3 and MZ1 located over and under the insulating film MZ2 as the trapping insulating film can function as a charge blocking layer for confining charges to the trapping insulating film. By using a structure in which the insulating film MZ2 as the trapping insulating film is interposed between the insulating films MZ1 and MZ3 each functioning as the charge blocking layer, charges can be stored in the insulating film MZ2.

In the insulating film MZ, respective band gaps in the insulating film MZ3 over the insulating film MZ2 and the insulating film MZ1 under the insulating film MZ2 need to be larger than a band gap in the charge storage layer (which is the insulating film MZ2 herein) between the insulating films MZ3 and MZ1. That is, the respective band gaps in the insulating films MZ1 and MZ3 are larger than the band gap in the insulating film MZ2 as the trapping insulating film. By satisfying the need, each of the insulating films MZ3 and MZ1 having the insulating film MZ2 as the charge storage layer interposed therebetween is allowed to function as the charge blocking layer. Since a silicon dioxide film has a band gap larger than a band gap in a silicon nitride film, it is possible to use a silicon nitride film as the insulating film MZ2 and use a silicon dioxide film as each of the insulating films MZ1 and MZ3. However, as the insulating film MZ1, a silicon oxynitride film may also be used.

The memory element MC is a field effect transistor including a gate insulating film (which is the insulating film MZ herein) having the inner charge storage portion. By causing charges to be stored or retained in the insulating film MZ2 in the insulating film MZ, information can be stored in the memory element MC.

For example, during a write operation to the memory element MC, electrons are injected into the insulating film MZ2 in the insulating film MZ to bring the memory element MC into a written state. By injecting electrons from the semiconductor substrate (p-type well PW1) into the insulating film MZ2 in the insulating film MZ herein, the memory element MC can be brought into the written state. During an erase operation to the memory element MC, holes (positive holes) are injected into the insulating film MZ2 in the insulating film MZ to bring the memory element MC into an erased state. By injecting holes from the gate electrode MG into the insulating film MZ2 in the insulating film MZ herein, the memory element MC can be brought into the erased state. The injection of charges (which are holes herein) from the gate electrode MG into the insulating film MZ during the erase operation can be performed using FN (Fowler Nordheim) tunneling. During a read operation to the memory element MC, by using the threshold voltage of the memory element MC which is different in the written state and the erased state, it is possible to determine whether the memory element MC is in the written state or the erased state.

The semiconductor device in Embodiment 1 also includes the lower-breakdown-voltage MISFET 2 formed in the lower-breakdown-voltage MISFET formation region 1B of the semiconductor substrate SB and the higher-breakdown-voltage MISFET 3 formed in the higher-breakdown-voltage MISFET formation region 1C of the semiconductor substrate SB.

Specifically, as shown in FIG. 20 or the like, the lower-breakdown-voltage MISFET 2 includes the insulating film GF2 formed over the semiconductor substrate SB (over the p-type well PW2) located in the lower-breakdown-voltage MISFET formation region 1B and the gate electrode GE1 formed over the insulating film GF2. That is, over the top surface of the semiconductor substrate SB (p-type well PW2) located in the lower-breakdown-voltage MISFET formation region 1B, the gate electrode GE1 is formed via the insulating film GF2 functioning as the gate insulating film. The lower-breakdown-voltage MISFET 2 further includes the sidewall spacers SW formed over the side walls of the gate electrode GE1 and the source or drain n-type semiconductor regions ($n^-$-type semiconductor regions EX2 and $n^+$-type semiconductor regions SD2) formed in the p-type well PW2 of the semiconductor substrate SB.

As also shown in FIG. 20 or the like, the higher-breakdown-voltage MISFET 3 includes the insulating film GF1 formed over the semiconductor substrate SB (over the p-type well PW3) located in the higher-breakdown-voltage MISFET formation region 1C and the gate electrode GE2 formed over the insulating film GF1. That is, over the top surface of the semiconductor substrate SB (p-type well PW3) located in the higher-breakdown-voltage MISFET formation region 1C, the gate electrode GE2 is formed via the insulating film GF1 functioning as the gate insulating film. The higher-breakdown-voltage MISFET 3 further includes the sidewall spacers SW formed over the side walls of the gate electrode GE2 and the source or drain n-type semiconductor regions ($n^-$-type semiconductor regions EX3 and $n^+$-type semiconductor regions SD3) formed in the p-type well PW3 of the semiconductor substrate SB.

In the higher-breakdown-voltage MISFET formation region 1C, the thickness of the insulating film GF1 interposed between the gate electrode GE2 and the semiconductor substrate SB (p-type well PW3) is larger than the thickness of the insulating film GF2 interposed between the gate electrode GE1 and the semiconductor substrate SB (p-type well PW2) in the lower-breakdown-voltage MISFET formation region 1B. Accordingly, the MISFET 3 has a breakdown voltage higher than the breakdown voltage of the MISFET 2.

<About Studied Examples>

A description will be given of studied examples studied by the present inventors.

FIGS. 24 to 28 are main-portion cross-sectional views of a semiconductor device in the first studied example studied by the present inventors during the manufacturing process thereof. Referring to FIGS. 24 to 28, a description will be given of the manufacturing process in the first studied example.

Figure 24:
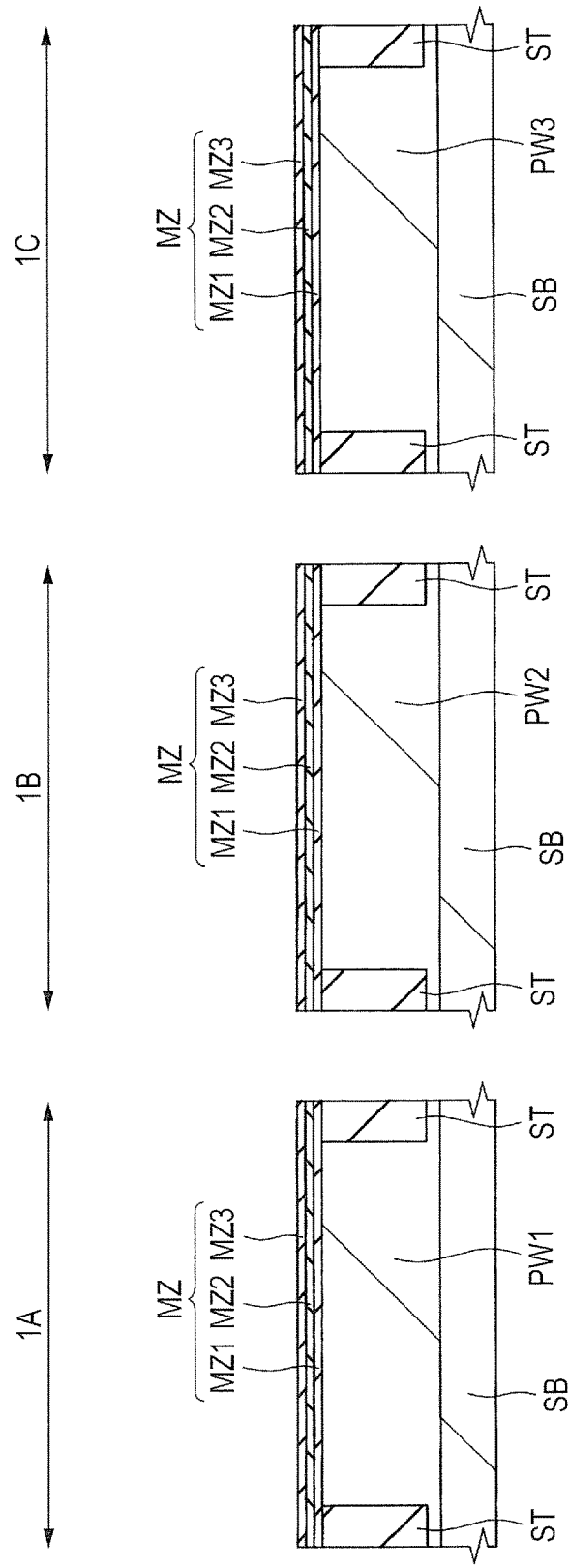
FIG. 24 is a main-portion cross-sectional view of a semiconductor device in a first studied example during the manufacturing process thereof.

After the structure shown in FIG. 2 described above is obtained, in the case of the first studied example, as shown in FIG. 24, the insulating film MZ is formed over the semiconductor substrate SB located in each of the memory region 1A, the lower-breakdown-voltage MISFET formation region 1B, and the higher-breakdown-voltage MISFET 1C. The insulating film MZ is made of a multi-layer film including the insulating film MZ1 (silicon dioxide film), the insulating film MZ2 (silicon nitride film) formed over the insulating film MZ1, and the insulating film MZ3 (silicon dioxide film) formed over the insulating film MZ2.

Figure 25:
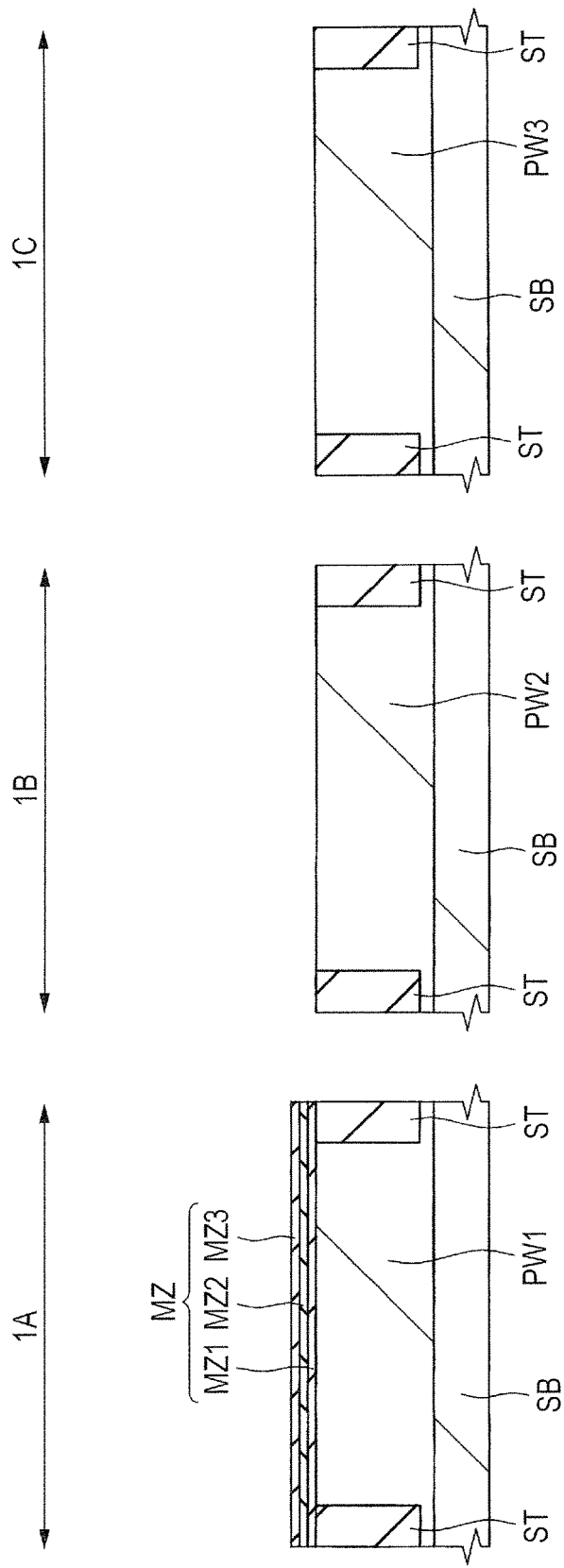
FIG. 25 is a main-portion cross-sectional view of the semiconductor device during the manufacturing process thereof, which is subsequent to FIG. 24.

Then, as shown in FIG. 25, the insulating film MZ is removed by etching from the lower-breakdown-voltage MISFET formation region 1B and the higher-breakdown-voltage MISFET formation region 1C, while the insulating film MZ is left in the memory region 1A. At this time, a photoresist pattern (not shown) which covers the memory region 1A and exposes each of the lower-breakdown-voltage MISFET formation region 1B and the higher-breakdown-voltage MISFET formation region 1C can be used as an etching mask.

Figure 26:
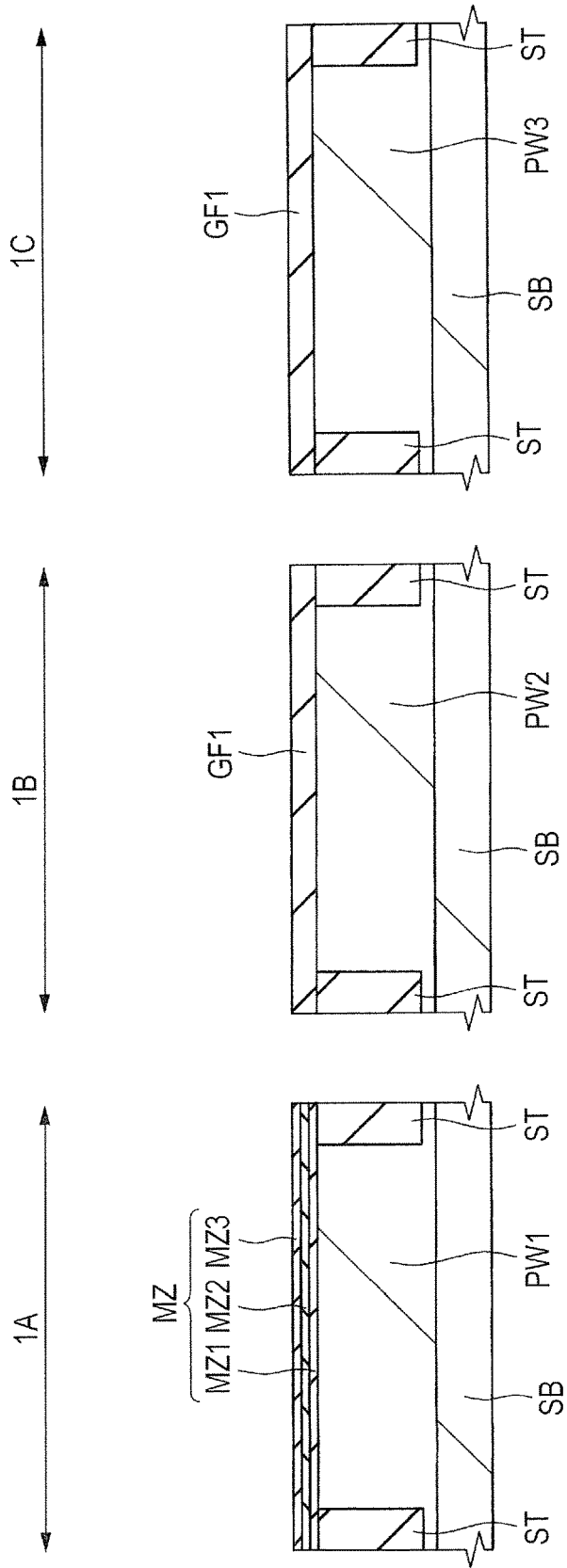
FIG. 26 is a main-portion cross-sectional view of the semiconductor device during the manufacturing process thereof, which is subsequent to FIG. 25.

Then, as shown in FIG. 26, the insulating film GF1 (silicon dioxide film) is formed over the top surface of the semiconductor substrate SB (p-type wells PW2 and PW3) located in each of the lower-breakdown-voltage MISFET formation region 1B and the higher-breakdown-voltage MISFET formation region 1C.

When the step of forming the insulating film GF1 (thermal oxidation treatment for forming the insulating film GF1) is performed, in each of the lower-breakdown-voltage MISFET formation region 1B and the higher-breakdown-voltage MISFET formation region 1C, the insulating film GF1 is formed over the top surface (silicon surface) of the semiconductor substrate SB (p-type wells PW2 and PW3). In the memory region 1A, the thickness of the insulating film MZ3 is increased, while the insulating film GF1 is not formed.

Figure 27:
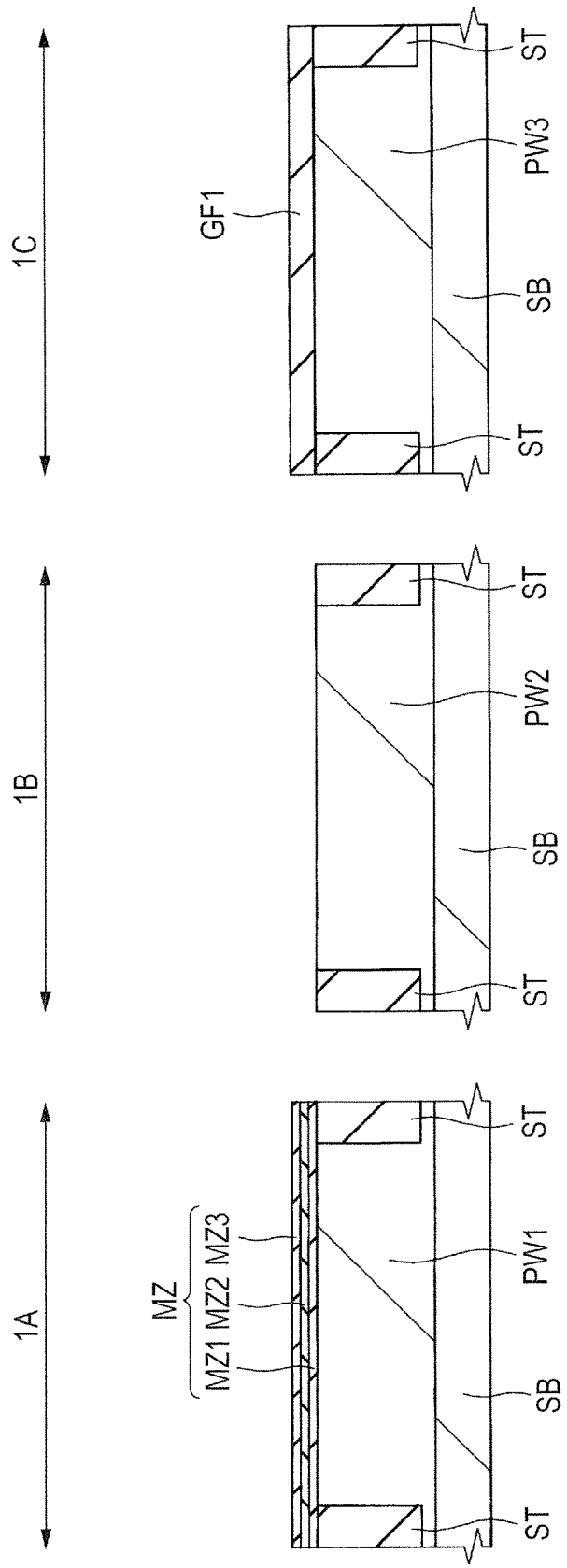
FIG. 27 is a main-portion cross-sectional view of the semiconductor device during the manufacturing process thereof, which is subsequent to FIG. 26.

Then, as shown in FIG. 27, the insulating film GF1 is removed by etching from the lower-breakdown-voltage MISFET formation region 1B, while the insulating film MZ is left in the memory region 1A and the insulating film GF1 is left in the higher-breakdown-voltage MISFET formation region 1C. At this time, a photoresist pattern (not shown) which covers each of the memory region 1A and the higher-breakdown-voltage MISFET formation region 1C and exposes the lower-breakdown-voltage MISFET formation region 1B can be used as an etching mask.

Figure 28:
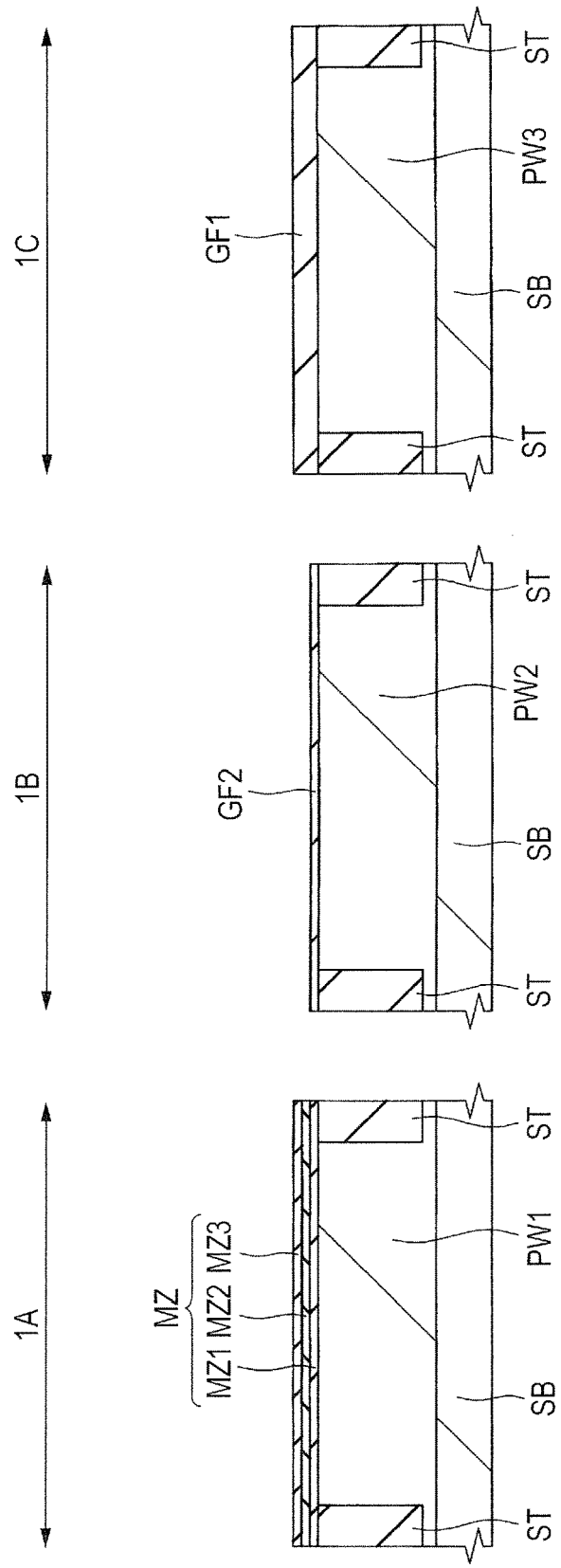
FIG. 28 is a main-portion cross-sectional view of the semiconductor device during the manufacturing process thereof, which is subsequent to FIG. 27.

Then, as shown in FIG. 28, the insulating film GF2 (silicon dioxide film) is formed over the top surface of the semiconductor substrate SB (p-type well PW2) located in the lower-breakdown-voltage MISFET formation region 1B.

When the step of forming the insulating film GF2 (thermal oxidation treatment for forming the insulating film GF2) is performed, in the lower-breakdown-voltage MISFET formation region 1B, the insulating film GF2 is formed over the top surface (silicon surface) of the semiconductor substrate SB (p-type well PW2). In the memory region 1A, the thickness of the insulating film MZ3 is increased, while the insulating film GF2 is not formed. In the higher-breakdown-voltage MISFET formation region 1C, the thickness of the insulating film GF1 is increased, while the insulating film GF2 is not formed.

Thus, the structure shown in FIG. 28 is obtained. In FIG. 28, in the memory region 1A, the insulating film MZ made of the multi-layer film including the insulating films MZ1, MZ2, and MZ3 is formed over the semiconductor substrate SB (p-type well PW1). In the lower-breakdown-voltage MISFET formation region 1B, the insulating film GF2 is formed over the semiconductor substrate SB (p-type well PW2). In the higher-breakdown-voltage MISFET formation region 1C, the insulating film GF1 is formed over the semiconductor substrate SB (p-type well PW3). In the same manner as in the case shown in FIG. 11 described above, in the case shown in FIG. 28 also, the thickness of the insulating film GF1 formed in the higher-breakdown-voltage MISFET formation region 1C is larger than the thickness of the insulating film GF2 formed in the lower-breakdown-voltage MISFET formation region 1B.

Then, in the case of the first studied example also, the process steps shown in FIGS. 12 to 23 described above are performed, but the illustration and description thereof is omitted herein.

FIGS. 29 to 34 are main-portion cross-sectional views of a semiconductor device in the second studied example studied by the present inventors. Referring to FIGS. 29 to 34, a description will be given of the manufacturing process in the second studied example.

Figure 29:
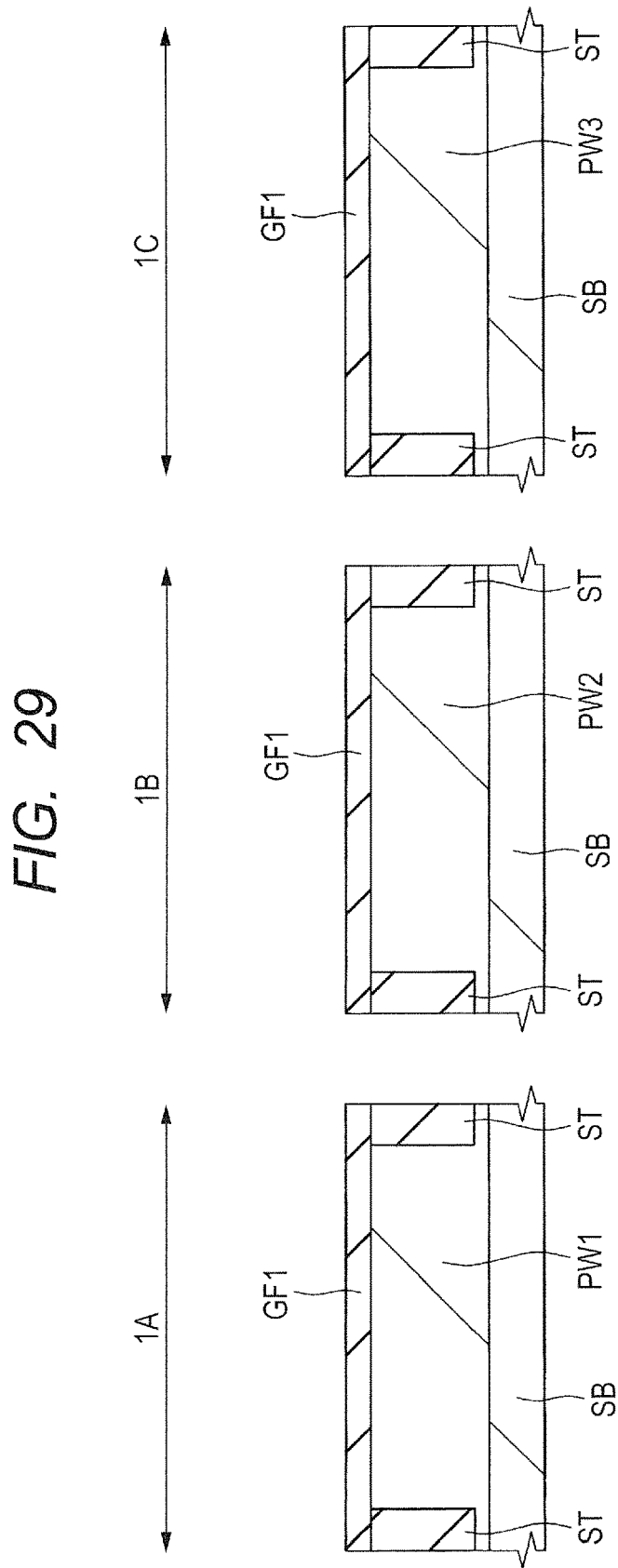
FIG. 29 is a main-portion cross-sectional view of a semiconductor device in a second studied example during the manufacturing process thereof.

After the structure shown in FIG. 2 described above is obtained, in the case of the second studied example, as shown in FIG. 29, the insulating film GF1 (silicon dioxide film) is formed over the semiconductor substrate SB located in each of the memory region 1A, the lower-breakdown-voltage MISFET formation region 1B, and the higher-breakdown-voltage MISFET formation region 1C.

Figure 30:
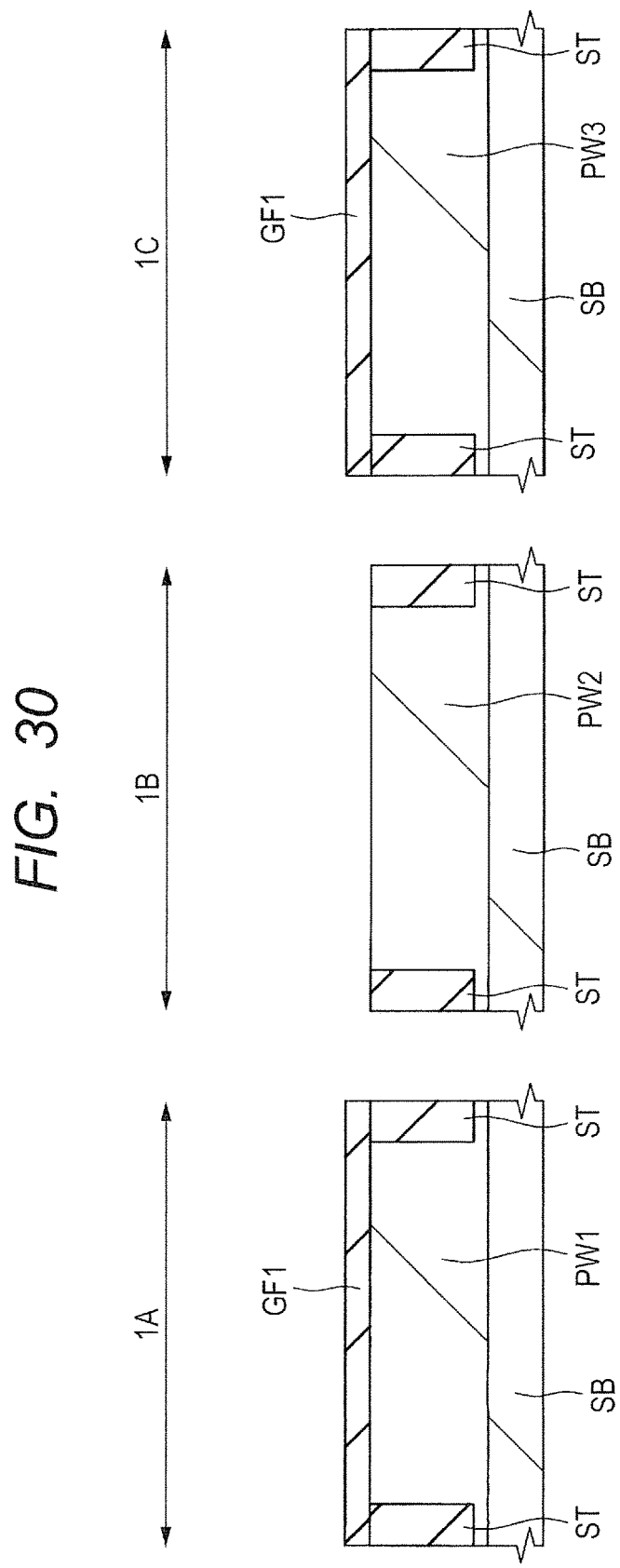
FIG. 30 is a main-portion cross-sectional view of the semiconductor device during the manufacturing process thereof, which is subsequent to FIG. 29.

Then, as shown in FIG. 30, the insulating film GF1 is removed by etching from the lower-breakdown-voltage MISFET formation region 1B, while left in each of the memory region 1A and the higher-breakdown-voltage MISFET formation region 1C. At this time, a photoresist pattern (not shown) which covers each of the memory region 1A and the higher-breakdown-voltage MISFET formation region 1C and exposes the lower-breakdown-voltage MISFET formation region 1B can be used as an etching mask.

Figure 31:
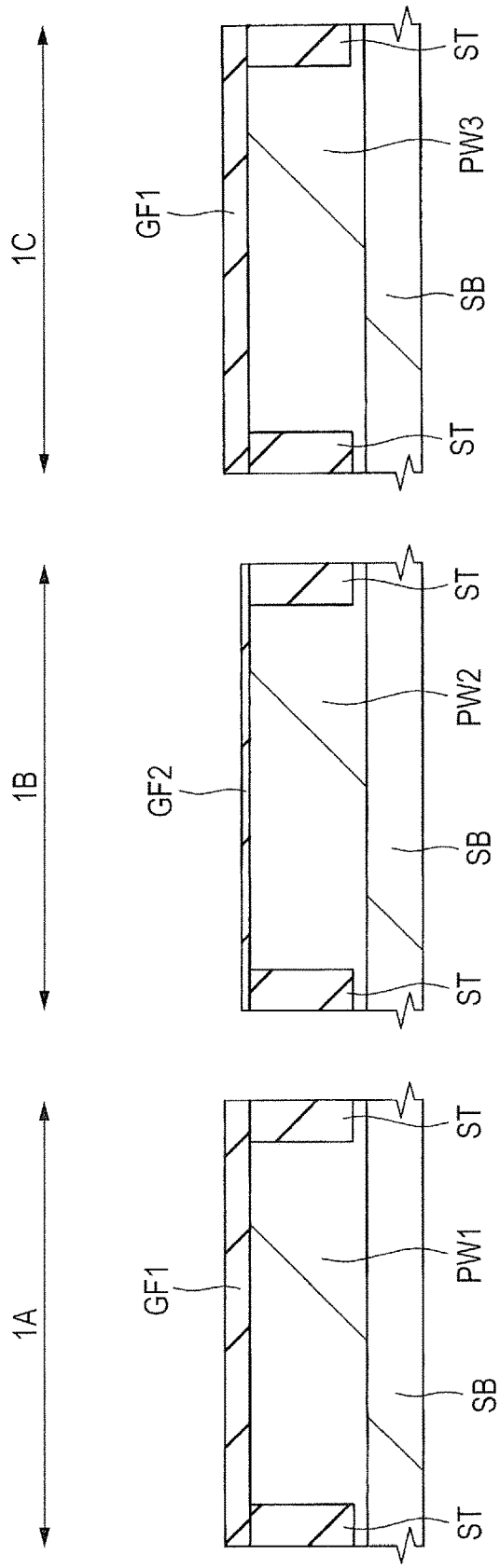
FIG. 31 is a main-portion cross-sectional view of the semiconductor device during the manufacturing process thereof, which is subsequent to FIG. 30.

Then, as shown in FIG. 31, over the top surface of the semiconductor substrate SB (p-type well PW2) located in the lower-breakdown-voltage MISFET formation region 1B, the insulating film GF2 (silicon dioxide film) is formed.

When the step of forming the insulating film GF2 (thermal oxidation treatment for forming the insulating film GF2) is performed, in the lower-breakdown-voltage MISFET formation region 1B, the insulating film GF2 is formed over the top surface (silicon surface) of the semiconductor substrate SB (p-type well PW2). In each of the memory region 1A and the higher-breakdown-voltage MISFET formation region 1C, the thickness of the insulating film GF1 is increased, while the insulating film GF2 is not formed.

Figure 32:
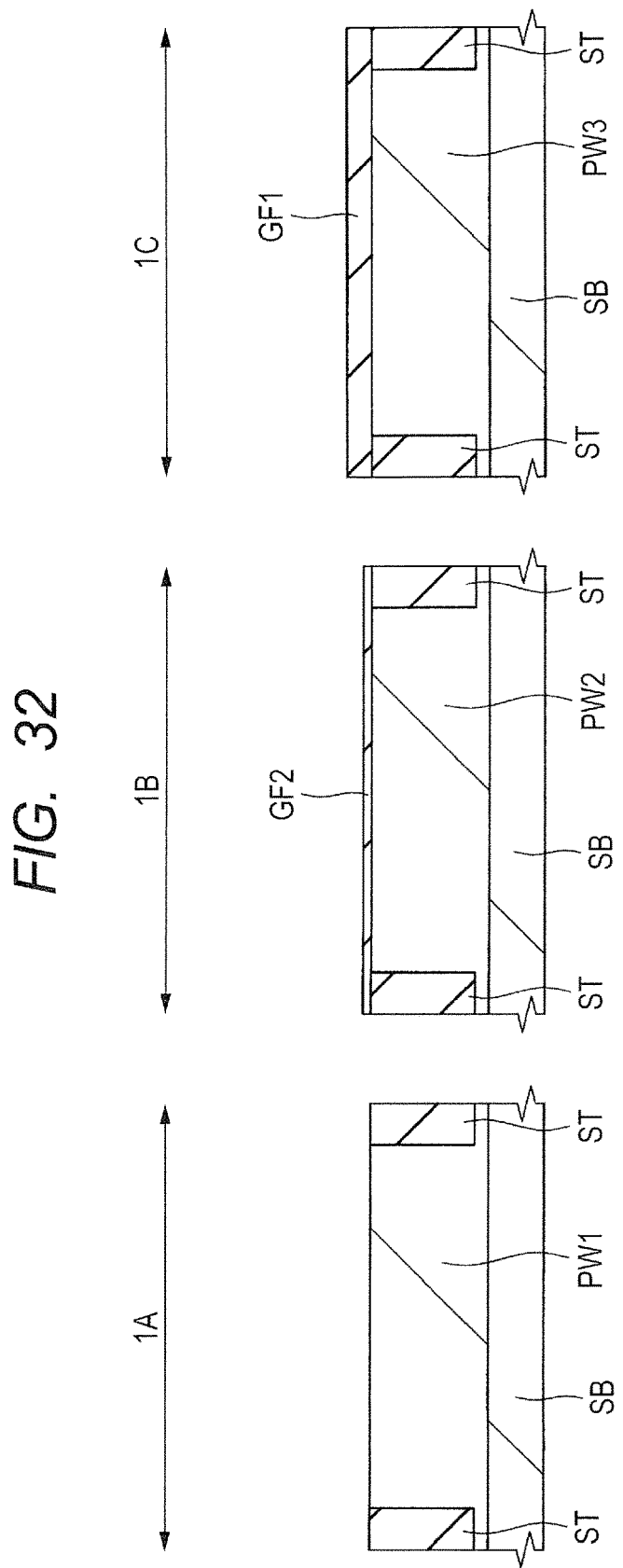
FIG. 32 is a main-portion cross-sectional view of the semiconductor device during the manufacturing process thereof, which is subsequent to FIG. 31.

Then, as shown in FIG. 32, the insulating film GF1 is removed by etching from the memory region 1A, while the insulating film GF2 is left in the lower-breakdown-voltage MISFET formation region 1B and the insulating film GF1 is left in the higher-breakdown-voltage MISFET formation region 1C. At this time, a photoresist pattern (not shown) which covers each of the lower-breakdown-voltage MISFET formation region 1B and the higher-breakdown-voltage MISFET formation region 1C and exposes the memory region 1A can be used as an etching mask.

Figure 33:
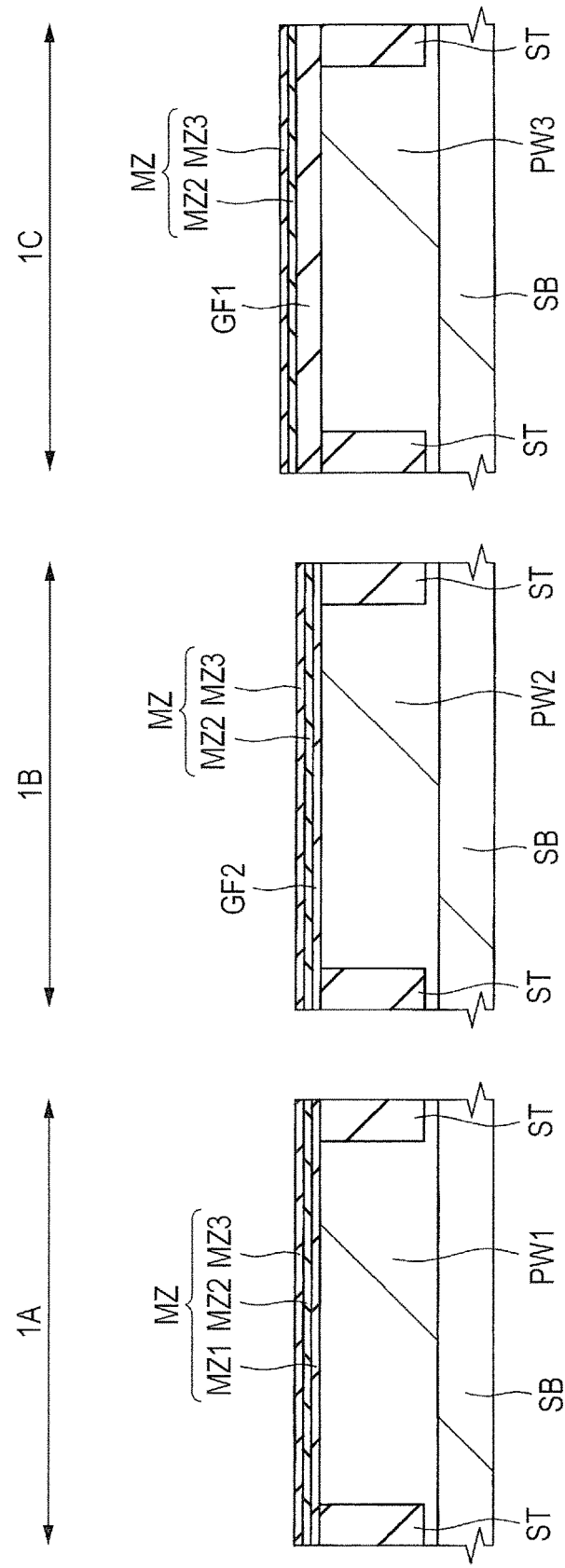
FIG. 33 is a main-portion cross-sectional view of the semiconductor device during the manufacturing process thereof, which is subsequent to FIG. 32.

Then, as shown in FIG. 33, over the main surface of the semiconductor substrate SB, the insulating film MZ is formed. At this time, in the memory region 1A, the insulating film MZ is formed over the top surface (silicon surface) of the semiconductor substrate SB (p-type well PW1). In the lower-breakdown-voltage MISFET formation region 1B, the insulating film MZ is formed over the insulating film GF1 over the semiconductor substrate SB (p-type well PW2). In the higher-breakdown-voltage MISFET formation region 1C, the insulating film MZ is formed over the insulating film GF1 over the semiconductor substrate SB (p-type well PW3). In the memory region 1A, the insulating film MZ is made of a multi-layer film including the insulating film MZ1 (silicon dioxide film), the insulating film MZ2 (silicon nitride film) over the insulating film MZ1, and the insulating film MZ3 (silicon dioxide film) over the insulating film MZ2. In each of the lower-breakdown-voltage MISFET formation region 1B and the higher-breakdown-voltage MISFET formation region 1C, the insulating film MZ is made of a multi-layer film including the insulating film MZ2. (silicon nitride film) and the insulating film MZ3 (silicon dioxide film) over the insulating film MZ2.

Figure 34:
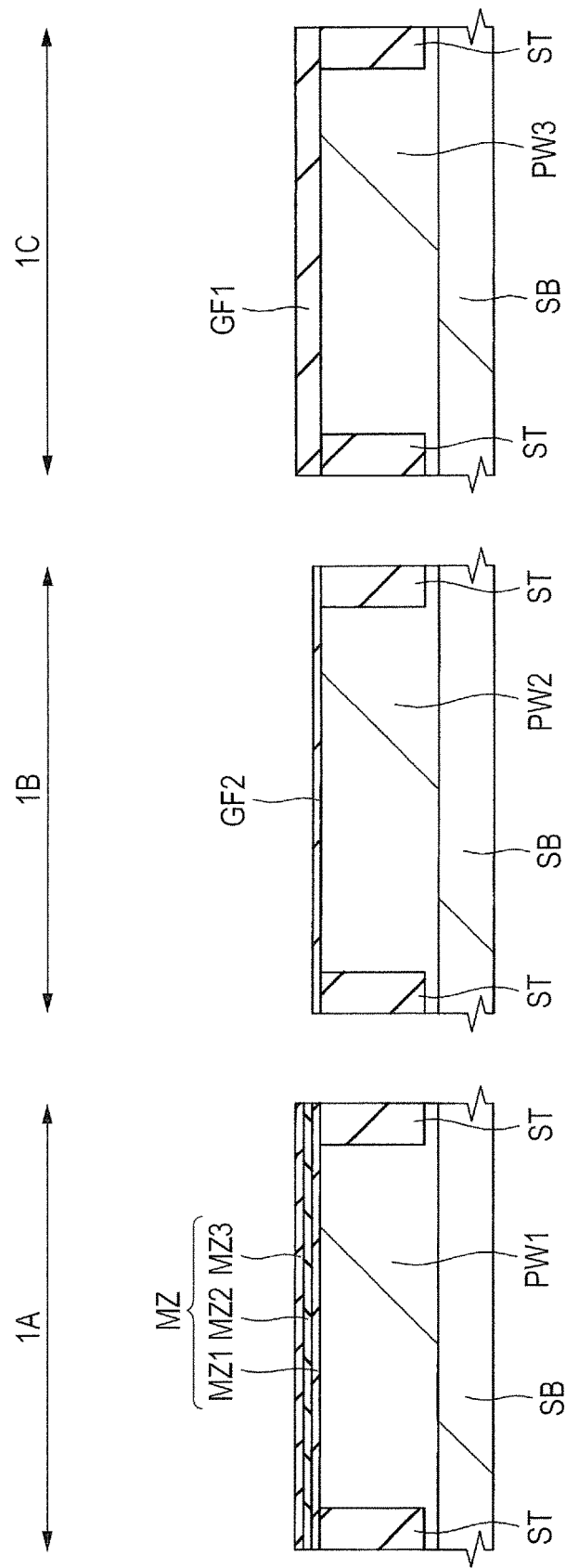
FIG. 34 is a main-portion cross-sectional view of the semiconductor device during the manufacturing process thereof, which is subsequent to FIG. 33.

Then, as shown in FIG. 34, the insulating film MZ is removed by etching from each of the lower-breakdown-voltage MISFET formation region 1B and the higher-breakdown-voltage MISFET formation region 1C, while the insulating film MZ is left in the memory region 1A. At this time, a photoresist pattern (not shown) which covers the memory region 1A and exposes each of the lower-breakdown-voltage MISFET formation region 1B and the higher-breakdown-voltage MISFET formation region 1C can be used as an etching mask.

Thus, the structure shown in FIG. 34 is obtained. in FIG. 34, in the memory region 1A, the insulating film MZ made of the multi-layer film including the insulating films MZ1, MZ2, and MZ3 is formed over the semiconductor substrate SB (p-type well PW1). In the lower-breakdown-voltage MISFET formation region 1B, the insulating film GF2 is formed over the semiconductor substrate (p-type well PW2). In the higher-breakdown-voltage MISFET formation region 1C, the insulating film GF1 is formed over the semiconductor substrate SB (p-type well PW3). In the same manner as in the case shown in FIG. 11 described above, in the case shown in FIG. 34 also, the thickness of the insulating film GF1 formed in the higher-breakdown-voltage MISFET formation region 1C is larger than the thickness of the insulating film GF2 formed in the lower-breakdown-voltage MISFET formation region 1B.

Then, in the case of the second studied example also, the process steps shown in FIGS. 12 to 23 described above are performed, but the illustration and description thereof is omitted herein.

<About Background to Study>

The present inventors have studied a technique for forming the nonvolatile memory element MC and the MISFETs 2 and 3 having the gate insulating films of different thicknesses in the same semiconductor substrate SB. In this case, it can also be considered to individually provide a silicon film for forming the gate electrode (MG) of the nonvolatile memory element MC and a silicon film for forming the gate electrodes (GE1 and GE2) of the MISFETs 2 and 3. However, this complicates the manufacturing process of the semiconductor device and increases the manufacturing cost of the semiconductor device.

Accordingly, the present inventors have studied the technique in which, when the nonvolatile memory element MC and the MISFETs 2 and 3 having the gate insulating films of different thicknesses are formed in the same semiconductor substrate SB, the gate electrode (MG) of the nonvolatile memory element MC, the gate electrode (GE1) of the MISFET 2, and the gate electrode (GE2) of the MISFET 3 can be formed using a common film (corresponding to the foregoing silicon film PS). To implement the technique, after a structure is obtained in which the respective insulating films for the gate insulating films are formed in the memory region 1A, the lower-breakdown-voltage MISFET formation region 1B, and the higher-breakdown-voltage MISFET formation region 1C, it is necessary to form a film (corresponding to the foregoing silicon film PS) for forming the gate electrodes MG, GE1, and GE2.

That is, as shown in FIGS. 11, 28, and 34 described above, it is necessary to obtain the structure in which the insulating film MZ for the gate insulating film of the memory element MC is formed in the memory region 1A, the insulating film GF2 for the gate insulating film of the MISFET 2 is formed in the lower-breakdown-voltage MISFET formation region 1B, and the insulating film GF1 for the gate insulating film of the MISFET 3 is formed in the higher-breakdown-voltage MISFET formation region 1C. After this structure is obtained, the film (corresponding to the foregoing silicon film PS) for forming the gate electrodes MG, GE1, and GE2 is formed and patterned to be able to form the gate electrode MG of the memory element MC, the gate electrode GE1 of the MISFET 2, and the gate electrode GE2 of the MISFET 3.

To obtain the structure in which the insulating film MZ is formed in the memory region 1A, the insulating film GF2 is formed in the lower-breakdown-voltage MISFET formation region 1B, and the insulating film GF1 is formed in the higher-breakdown-voltage MISFET formation region 1C, it can be considered to use various process steps. However, as a result of the study, the present inventors have found that, depending on the order in which the individual films MZ, GF1, and GF2 are formed, various problems may arise.

For example, in the case of the first studied example shown in FIGS. 24 to 28 described above, after the step of forming the insulating film MZ, the step of forming the insulating film GF1 is performed and then the step of forming the insulating film GF2 is performed. Consequently, in the case of the first studied example, the step of forming the insulating film MZ (FIG. 24), the step of removing the insulating film MZ (FIG. 25), the step of forming the insulating film GF1 (FIG. 26), the step of removing the insulating film GF1 (FIG. 27), and the step of forming the insulating film GF2 (FIG. 28) are performed in this order. In the case of the first studied example which forms the insulating films MZ, GF1, and GF2 in this process step order, the following problem may arise.

That is, the insulating film (silicon dioxide film) formed in the step of forming insulating film GF1 has a thickness larger than that of the insulating film formed in the step of forming the insulating film GF2. Accordingly, an oxidizing effect is higher in the step of forming the insulating film GF1. As a result, when the step of forming the insulating film GF1 is performed after the formation of the insulating film MZ as in the first studied example, the insulating film MZ in the memory region 1A is influenced by the step of forming the insulating film GF1, which is disadvantageous in terms of the characteristics of the memory element MC to be formed in the memory region 1A. For example, the insulating film MZ3 of the insulating film MZ in the memory region 1A is oxidized in the step of forming the insulating film GF1 to have an increased thickness. However, when the thickness of the insulating film MZ3 is excessively increased, it may degrade the characteristics of the memory element MC to be formed in the memory region 1A. For example, when the thickness of the insulating film MZ3 is increased, in the memory element MC, charges are less likely to be injected from the gate electrode MG into the insulating film MZ2 of the insulating film MZ. In addition, when the thickness of the insulating film MZ3 in the memory region 1A is increased in the step of forming the insulating film GF1, it is difficult to control the increment of the thickness thereof. Accordingly, performing the step of forming the insulating film GF1 after the formation of the insulating film MZ as in the first studied example results in variations in the thickness of the insulating film MZ (especially the thickness of the insulating film MZ3) and consequently results in variations in the characteristics of the memory element MC. This leads to the degradation of the reliability of the semiconductor device.

In the case of the second studied example shown in FIGS. 29 to 34 described above, after the step of forming the insulating film GF1, the step of forming the insulating film GF2 is performed and then the step of forming the insulating film MZ is performed. Consequently, in the case of the second studied example, the step of forming the insulating film GF1 (FIG. 29), the step of removing the insulating film GF1 (FIG. 30), the step of forming the insulating film GF2 (FIG. 31), the step of removing the insulating film GF1 (FIG. 32), the step of forming the insulating film MZ (FIG. 33), and the step of removing the insulating film MZ (FIG. 34) are performed in this order. In the case of the second studied example which forms the insulating films MZ, GF1, and GF2 in this process step order, the following problem may arise.

That is, when the insulating film MZ is formed last after the formation of the insulating films GF1 and GF2, after the step of forming the insulating film MZ (FIG. 33), it is necessary to remove the insulating film MZ from each of the lower-breakdown-voltage MISFET formation region 1B and the higher-breakdown-voltage MISFET formation region 1C, as shown in FIG. 34. However, in this case, when the insulating film MZ over the insulating film GF2 is intended to be removed by etching from the lower-breakdown-voltage MISFET formation region 1B, the insulating film GF2 may also be more or less etched. That is, when the insulating film MZ over the insulating film GF2 is intended to be removed by etching from the lower-breakdown-voltage MISFET formation region 1B, the insulating film GF2 is exposed to an etchant for removing the insulating film MZ. Accordingly, it is difficult to completely prevent the insulating film GF2 from being etched, and the insulating film GF2 may be more or less etched. Since the insulating film GF2 in the lower-breakdown-voltage MISFET formation region 1B is thin, the insulating film GF2 is significantly influenced by the etching when the insulating film MZ is removed from the lower-breakdown-voltage MISFET formation region 1B. In addition, when the insulating film GF2 is etched by the etching when the insulating film MZ is removed from the lower-breakdown-voltage MISFET formation region 1B, it is difficult to control the amount of the etching thereof. As a result, performing the step of forming the insulating film MZ after the formation of the insulating film GF2 as performed in the second studied example results in variations in the thickness of the insulating film GF2 at the process stage shown in FIG. 34 (i.e., variations in the thickness of the gate insulating film of the MISFET 2) and consequently results in variations in the characteristics of the MISFET 2. This leads to the degradation of the reliability of the semiconductor device.

<About Main Characteristic Features and Effects>

One of the main characteristic features of Embodiment 1 is that the nonvolatile memory element MC and the MISFETs 2 and 3 having the gate insulating films of different thicknesses are formed in the semiconductor substrate SB, and the gate electrode MG of the memory element MC, the gate electrode GE1 of the MISFET 2, and the gate electrode GE2 of the MISFET 3 are formed using a common film (corresponding to the foregoing silicon film PS). Accordingly, after the structure (FIG. 11) is obtained in which the insulating film MZ for the gate insulating film of the memory element MC is formed in the memory region 1A, the insulating film GF2 for the gate insulating film of the MISFET 2 is formed in the lower-breakdown-voltage MISFET formation region 1B, and the insulating film GF1 for the gate insulating film of the MISFET 3 is formed in the higher-breakdown-voltage MISFET formation region 1C, the film (silicon film PS) for forming the gate electrodes MG, GE1, and GE2 is formed.

Another one of the main characteristic features of Embodiment 1 is that, among the insulating films MZ, GF1, and GF2, the insulating film GF1 is formed first and then the insulating films MZ and GF2 are formed in this order. That is, after the step of forming the insulating film GF1, the step of forming the insulating film MZ is performed and then the step of forming the insulating film GF2 is performed. Consequently, in the case of Embodiment 1, the step of forming the insulating film GF1 (FIG. 3), the step of removing the insulating film GF1 (FIG. 5), the step of forming the insulating film MZ (FIG. 6), the step of removing the insulating film MZ (FIG. 8), the step of removing the insulating film GF1 (FIG. 10), and the step of forming the insulating film GF2 (FIG. 11) are performed in this step. This can ease such problems as described in association with the foregoing first and second studied examples.

That is, since the insulating film (silicon dioxide film) formed in the step of forming the insulating film GF1 has a thickness larger than that of the insulating film formed in the step of forming the insulating film GF2, an oxidizing effect is higher in the step of forming the insulating film GF1. Accordingly, when the step of forming the insulating film GF1 is performed after the step of forming the insulating film MZ as in the foregoing first studied example, the insulating film MZ in the memory region 1A is influenced by the step of forming the insulating film GF1. This may adversely affect the characteristics of the memory element MC and vary the characteristics of the memory element MC.

By contrast, in Embodiment 1, the step of forming the insulating film GF1 is performed before the step of forming the insulating film MZ. This can prevent the insulating film MZ in the memory region 1A from being influenced by the step of forming the insulating film GF1. Therefore, it is possible to prevent problems resulting from the influence exerted on the insulating film MZ in the memory region 1A by the step of forming the insulating film GF1.

In Embodiment 1, the step of forming the insulating film GF2 is performed after the step of forming the insulating film MZ. As a result, the insulating film MZ in the memory region 1A may be influenced by the step of forming the insulating film GF2. However, since the insulating film (silicon dioxide film) formed in the step of forming the insulating film GF2 has a thickness smaller than that of the insulating film formed in the step of forming the insulating film GF1, the oxidizing effect is lower in the step of forming the insulating film GF2. Accordingly, in Embodiment 1, the step of forming the insulating film GF2 is performed after the step of forming the insulating film MZ. However, since the formed insulating film GF2 has a smaller thickness, even when the insulating film MZ in the memory region 1A is influenced by the step of forming the insulating film GF2, the influence exerted on the insulating film MZ in the memory region 1A is not significant and is limited.

When the insulating film MZ is formed last after the formation of the insulating films GF1 and GF2 as in the foregoing second studied example, after the step of forming the insulating film MZ (FIG. 33), the insulating film MZ needs to be removed by etching from each of the lower-breakdown-voltage MISFET formation region 1B and the higher-breakdown-voltage MISFET formation region 1C, as shown in FIG. 34. By the etching performed at this time, the insulating film GF2 in the lower-breakdown-voltage MISFET formation region 1B may also be etched. This results in variations in the thickness of the insulating film GF2 at the process stage shown in FIG. 34, i.e., variations in the thickness of the gate insulating film of the MISFET 2 and consequently results in variations in the characteristics of the MISFET 2.

By contrast, in Embodiment 1, after the step of forming the insulating film MZ, the step of forming the insulating film GF2 is performed. That is, in Embodiment 1, the insulating film GF2 is formed last after the formation of the insulating films MZ and GF1. Accordingly, after the step of forming the insulating film MZ (FIG. 6), the insulating film MZ needs to be removed from each of the lower-breakdown-voltage MISFET formation region 1B and the higher-breakdown-voltage MISFET formation region 1C, as shown in FIG. 8. However, at this process stage, the insulating film GF2 has not been formed yet. Accordingly, the insulating film GF2 is not influenced by the etching when the insulating film MZ is removed from each of the lower-breakdown-voltage MISFET formation region 1B and the higher-breakdown-voltage MISFET formation region 1C. This allows the thickness of the insulating film GF2 in the lower-breakdown-voltage MISFET formation region 1B to be precisely controlled to an intended value. Therefore, it is possible to precisely control the thickness of the gate insulating film (insulating film GF2) of the MISFET 2 to an intended value and suppress or prevent variations in the characteristics of the MISFET 2.

In Embodiment 1, after the step of forming the insulating film GF1, the step of forming the insulating film MZ is performed. As a result, after the step of forming the insulating film MZ (FIG. 6), the insulating film MZ needs to be removed by etching from each of the lower-breakdown-voltage MISFET formation region 1B and the higher-breakdown-voltage MISFET formation region 1C, as shown in FIG. 8. By the etching performed at this time, the insulating film GF1 in each of the lower-breakdown-voltage MISFET formation region 1B and the higher-breakdown-voltage MISFET formation region 1C may also be more or less etched. However, the insulating film GF1 in the lower-breakdown-voltage MISFET formation region 1B is removed thereafter. Accordingly, even when the insulating film GF1 in the lower-breakdown-voltage MISFET formation region 1B is more or less etched when the insulating film MZ is removed by etching from each of the lower-breakdown-voltage MISFET formation region 1B and the higher-breakdown-voltage MISFET formation region 1C, no problem arises. In addition, since the insulating film GF1 in the higher-breakdown-voltage MISFET formation region 1C, which will serve as the gate insulating film of the MISFET 3 later, has a large thickness, even when the insulating film GF1 in the higher-breakdown-voltage MISFET formation region 1C is more or less etched when the insulating film MZ is removed by etching from each of the lower-breakdown-voltage MISFET formation region 1B and the higher-breakdown-voltage MISFET formation region 1C, a problem is less likely to occur. That is, when the insulating film GF1 is formed, the thickness thereof is relatively large. Accordingly, even when the insulating film GF1 is influenced by the etching when the insulating film MZ is removed from each of the lower-breakdown-voltage MISFET formation region 1B and the higher-breakdown-voltage MISFET formation region 1C, the influence exerted on the insulating film GF1 is not significant and is limited so that a problem is less likely to arise. That is, when the thicker insulating film GF1 and the thinner insulating film GF2 are influenced by the etching during the removal of the insulating film MZ, the influence exerted on the thinner insulating film GF2 is relatively large. Accordingly, in Embodiment 1, the step of forming the insulating film MZ is performed before the step of forming the insulating film GF2 to prevent the thinner insulating film GF2 from being influenced by the etching during the removal of the insulating film MZ.

Thus, in Embodiment 1, the insulating film GF1 thicker than the insulating film GF2 is formed before the step of forming the insulating film MZ and the thinner insulating film GF2 is formed after the step of forming the insulating film MZ. This can prevent the step of forming the insulating film GF1 from influencing the insulating film MZ and reliably control the structure of the gate insulating film of the memory element MC to an intended configuration. As a result, it is possible to reliably provide the memory element MC with intended characteristics and reliably prevent variations in the characteristics of the memory element MC. In addition, since it is possible to prevent the step of removing the insulating film MZ from influencing the thinner insulating film GF2, it is possible to reliably provide the MISFET 2 using the thinner insulating film GF2 as the gate insulating film with intended characteristics and reliably prevent variations in the characteristics of the MISFET 2. This can improve the performance of the semiconductor device including the nonvolatile memory element MC and the MISFETs 2 and 3 having the gate insulating films of different thicknesses and also improve the reliability thereof.

In the case of the foregoing second studied example, after the insulating film MZ is removed by etching from each of the lower-breakdown-voltage MISFET formation region 1B and the higher-breakdown-voltage MISFET formation region 1C, the silicon film PS is formed. However, when a pinhole is formed in the insulating film GF2 in the lower-breakdown-voltage MISFET formation region 1B by the etching during the removal of the insulating film MZ, a leakage current may flow between the gate electrode GE1 of the MISFET 2 and the channel region.

By contrast, in the case of Embodiment 1, after the step of forming the insulating film GF2, the silicon film PS is formed. Accordingly, even when a pinhole is formed in the insulating film GF1 by the etching during the removal of the insulating film MZ, the pinhole in the insulating film GF1 can be eliminated by the step of forming the insulating film GF2 (thermal oxidation treatment for forming the insulating film GF2). This can reliably prevent a pinhole from being formed in the gate insulating film of each of the MISFETs 2 and 3 and thus inhibit or prevent a leakage current from flowing between the gate electrode and the channel region in each of the MISFETs 2 and 3. As a result, the reliability of the semiconductor device can further be improved.

Embodiment 2

A method of manufacturing a semiconductor device in Embodiment 2 will be described with reference to FIGS. 35 to 58. FIGS. 35 to 58 are main-portion cross-sectional views of the semiconductor device in Embodiment 2 during the manufacturing process thereof. FIGS. 35 to 58 show the main-portion cross-sectional views of the memory region 1A, the lower-breakdown-voltage MISFET formation region 1B, the higher-breakdown-voltage MISFET formation region 1C, and an intermediate-breakdown-voltage MISFET formation region 1D.

The memory region 1A, the lower-breakdown-voltage MISFET formation region 1B, and the higher-breakdown-voltage MISFET formation region 1C are the same as in Embodiment 1 described above, while the intermediate-breakdown-voltage MISFET formation region 1D is a region where an intermediate-breakdown-voltage MISFET 4 for a peripheral circuit is to be formed. Note that the operating voltage of the higher-breakdown-voltage MISFET 3 is higher than the operating voltage of the intermediate-breakdown-voltage MISFET 4, and the operating voltage of the intermediate-breakdown-voltage MISFET 4 is higher than the operating voltage of the lower-breakdown-voltage MISFET 2. As will be described later, the thickness of the gate insulating film of the higher-breakdown-voltage MIS-FET 3 is thicker than the thickness of the gate insulating film of the intermediate-breakdown-voltage MISFET 4, and the thickness of the gate insulating film of the intermediate-breakdown-voltage MISFET 4 is thicker than the thickness of the gate insulating film of the lower-breakdown-voltage MISFET 2.

The memory region 1A, the lower-breakdown-voltage MISFET formation region 1B, the higher-breakdown-voltage MISFET formation region 1C, and the intermediate-breakdown-voltage MISFET formation region 1D are present in the same semiconductor substrate SB. That is, the memory region 1A, the lower-breakdown-voltage MISFET formation region 1B, the higher-breakdown-voltage MISFET formation region 1C, and the intermediate-breakdown-voltage MISFET formation region 1D correspond to the different two-dimensional regions of the main surface of the same semiconductor substrate SB.

Figure 35:
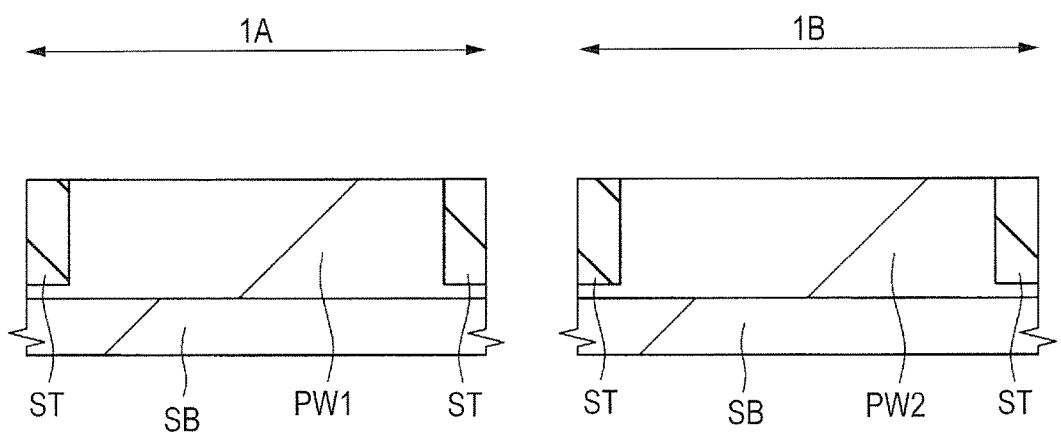
FIG. 35 is a main-portion cross-sectional view of a semiconductor device in another embodiment during the manufacturing process thereof.
Figure 36:
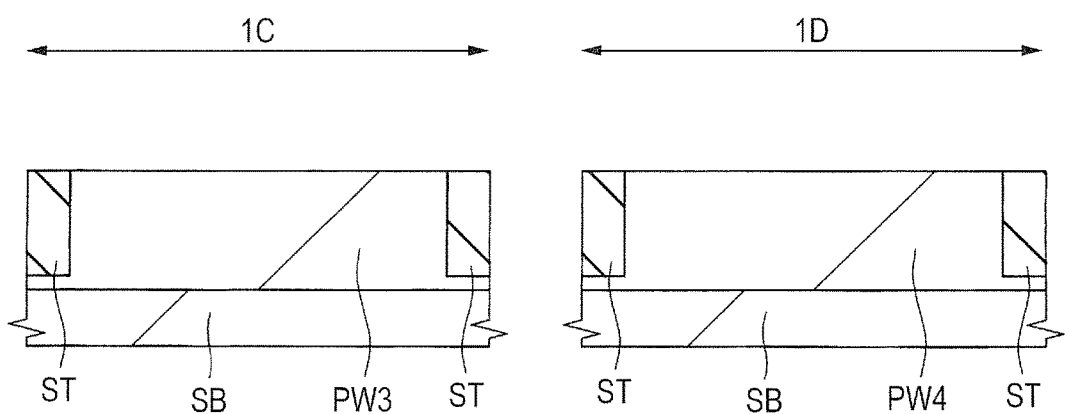
FIG. 36 is a main-portion cross-sectional view of the semiconductor device during the manufacturing process thereof, which is similar to FIG. 35.
Figure 37:
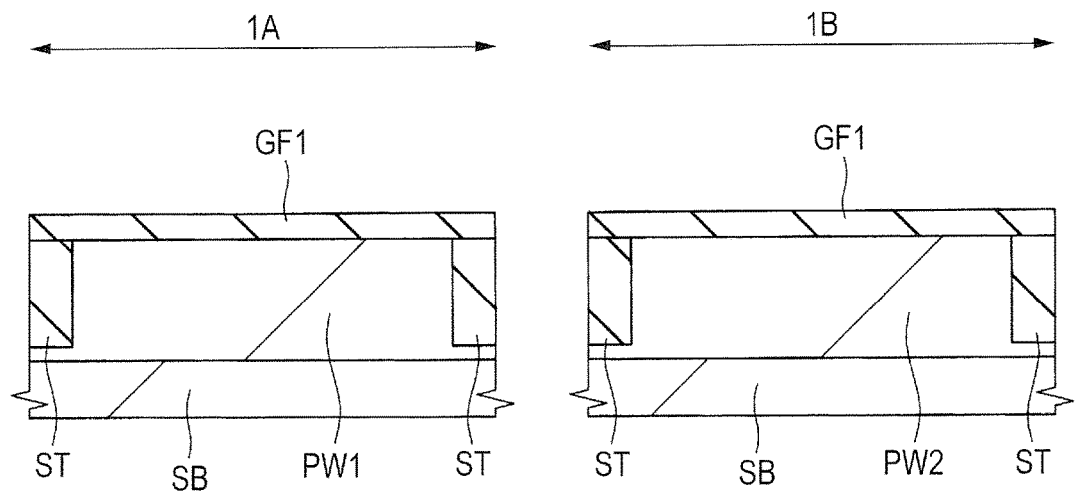
FIG. 37 is a main-portion cross-sectional view of the semiconductor device during the manufacturing process thereof, which is subsequent to FIG. 35.
Figure 38:
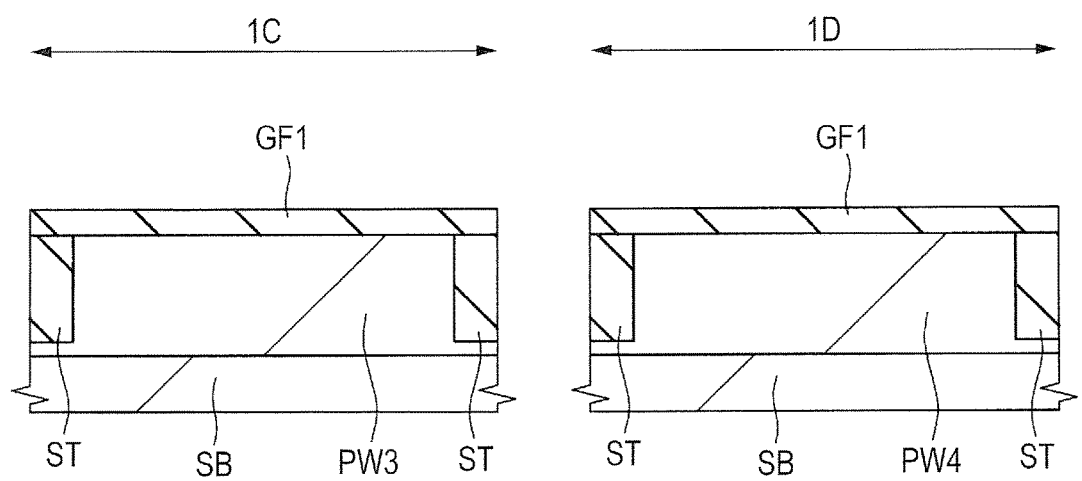
FIG. 38 is a main-portion cross-sectional view of the semiconductor device during the manufacturing process thereof, which is similar to FIG. 37.

To manufacture the semiconductor device, the semiconductor substrate (semiconductor wafer) SB is provided and then, as shown in FIGS. 35 and 36, the isolation regions ST defining active regions in the main surface of the semiconductor substrate SB are formed. Then, using an ion implantation method, the p-type well PW1 is formed in the memory region 1A of the semiconductor substrate SB, the p-type well PW2 is formed in the lower-breakdown-voltage MISFET formation region 1B, the p-type well PW3 is formed in the higher-breakdown-voltage MISFET formation region 1C, and a p-type well PW4 is formed in the intermediate-breakdown-voltage MISFET formation region 1D. As a result, the structure shown in each of FIGS. 35 and 36 corresponding to FIG. 2 described above is obtained.

Next, the top surface of the semiconductor substrate SB is cleaned, and then the insulating film GF1 is formed over the top surface of the semiconductor substrate SB (including also the respective top surfaces of the p-type wells PW1, PW2, PW3, and PW4). As a result, the structure shown in each of FIGS. 37 and 38 corresponding to FIG. 3 described above is obtained. The insulating film GF1 is formed over the semiconductor substrate SB located in the memory region 1A (p-type well PW1), over the semiconductor substrate SB located in the lower-breakdown-voltage MISFET formation region 1B (p-type well PW2), over the semiconductor substrate SB located in the higher-breakdown-voltage MISFET formation region 1C (p-type well PW3), and over the semiconductor substrate SB located in the intermediate-breakdown-voltage MISFET formation region 1D (p-type well PW4). In the same manner as in Embodiment 1 described above, the insulating film GF1 is an insulating film for the gate insulating film of the MISFET 3 formed in the higher-breakdown-voltage MISFET formation region 1C. A method of forming the insulating film GF1 and the material of the insulating film GF1 are the same as in Embodiment 1 described above. The thickness (formed film thickness) of the silicon dioxide film as the insulating film GF1 can be controlled to, e.g., about 9 to 13 mm.

Figure 39:
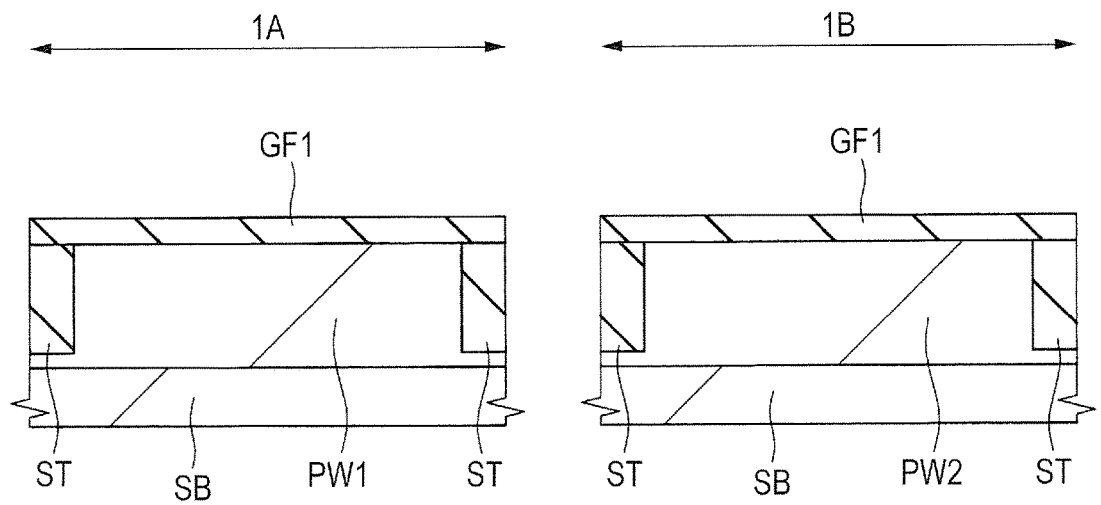
FIG. 39 is a main-portion cross-sectional view of the semiconductor device during the manufacturing process thereof, which is subsequent to FIG. 37.
Figure 40:
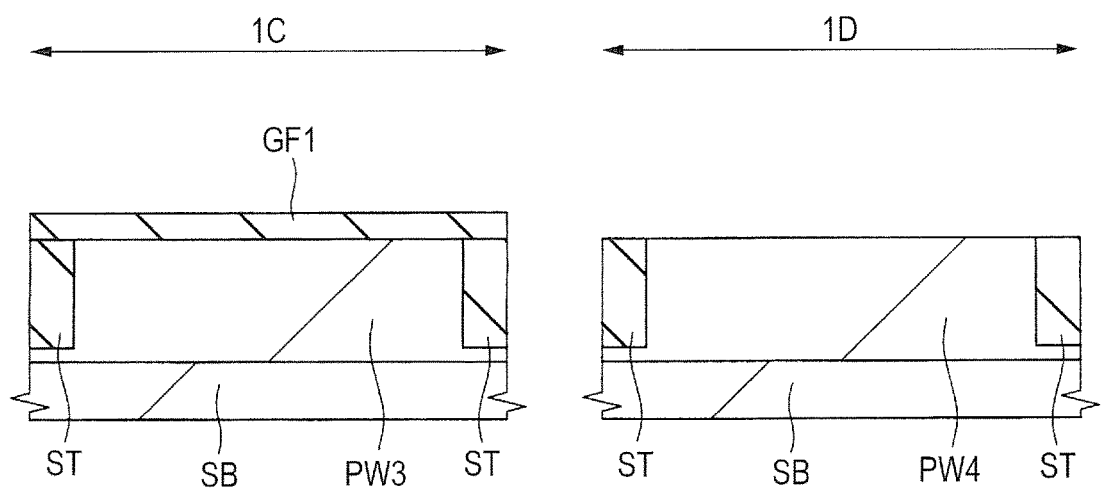
FIG. 40 is a main-portion cross-sectional view of the semiconductor device during the manufacturing process thereof, which is similar to FIG. 39.

Next, a photoresist pattern (not shown) which covers each of the memory region 1A, the lower-breakdown-voltage MISFET formation region 1B, and the higher-breakdown-voltage MISFET formation region 1C and exposes the intermediate-breakdown-voltage MISFET formation region 1D is formed. Then, using the photoresist pattern as an etching mask, the insulating film GF1 is etched. By the etching, the insulating film GF1 is removed from the intermediate-breakdown-voltage MISFET formation region 1D, while the insulating film GF1 is left in each of the memory region 1A, the lower-breakdown-voltage MISFET formation region 1B, and the higher-breakdown-voltage MISFET formation region 1C. In the intermediate-breakdown-voltage MISFET formation region 1D, as a result of the removal of the insulating film GF1 therefrom, the top surface (silicon surface) of the semiconductor substrate SB (p-type well PW4) is exposed. As the etching performed at this time, wet etching can be used appropriately. As an etchant, e.g., a hydrofluoric acid can be used appropriately. Subsequently, the photoresist pattern is removed. FIGS. 39 and 40 show this process stage.

Figure 41:
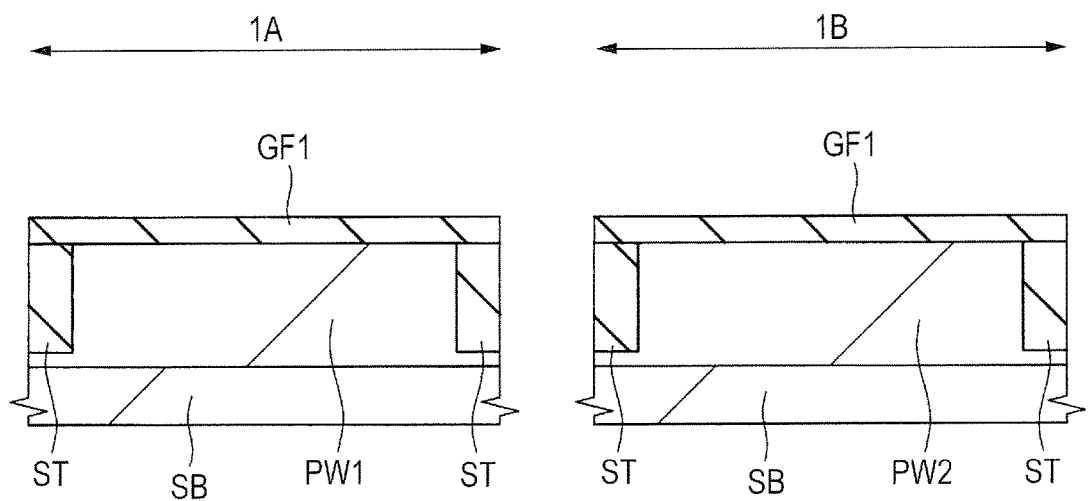
FIG. 41 is a main-portion cross-sectional view of the semiconductor device during the manufacturing process thereof, which is subsequent to FIG. 39.
Figure 42:
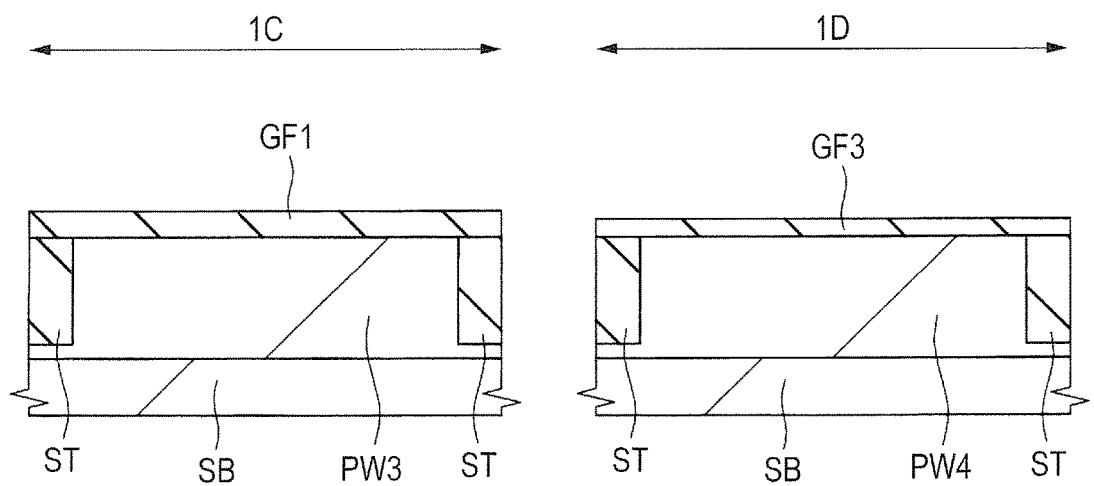
FIG. 42 is a main-portion cross-sectional view of the semiconductor device during the manufacturing process thereof, which is similar to FIG. 41.

Next, as shown in FIGS. 41 and 42, over the top surface of the semiconductor substrate SB located in the intermediate-breakdown-voltage MISFET formation region 1D (p-type well PW4), an insulating film GF3 is formed.

The insulating film GF3 is an insulating film for the gate insulating film of the MISFET 4 formed in the intermediate-breakdown-voltage MISFET formation region 1D. The insulating film GF3 is preferably made of a silicon dioxide film and can be formed by thermal oxidation treatment (thermal oxidation method). The formed film thickness of the insulating film GF3 is smaller than the formed film thickness of the insulating film GF1 in the process step shown in FIGS. 37 and 38 described above and can be controlled to, e.g., about 7 to 8 nm. When the step of forming the insulating film GF3 (thermal oxidation treatment for forming the insulating film GF3) is performed, over the top surface (silicon surface) of the semiconductor substrate SB (p-type well PW4) located in the intermediate-breakdown-voltage MISFET formation region 1D, the insulating film GF3 is formed. Also, when the step of forming the insulating film GF3 (thermal oxidation treatment for forming the insulating film GF3) is performed, in each of the memory region 1A, the lower-breakdown-voltage MISFET formation region 1B, and the higher-breakdown-voltage MISFET formation region 1C, the thickness of the insulating film GF1 is increased, while the insulating film GF3 is not formed.

Figure 43:
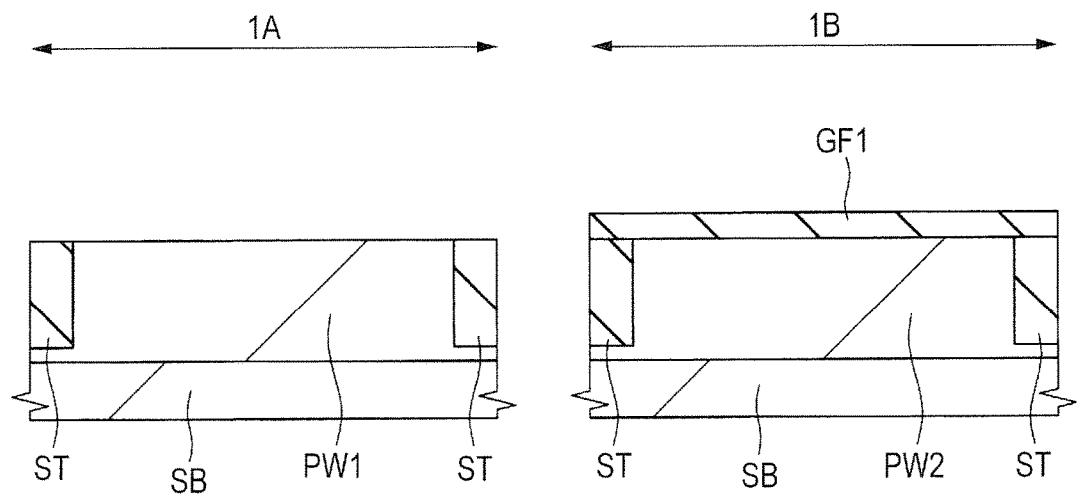
FIG. 43 is a main-portion cross-sectional view of the semiconductor device during the manufacturing process thereof, which is subsequent to FIG. 41.
Figure 44:
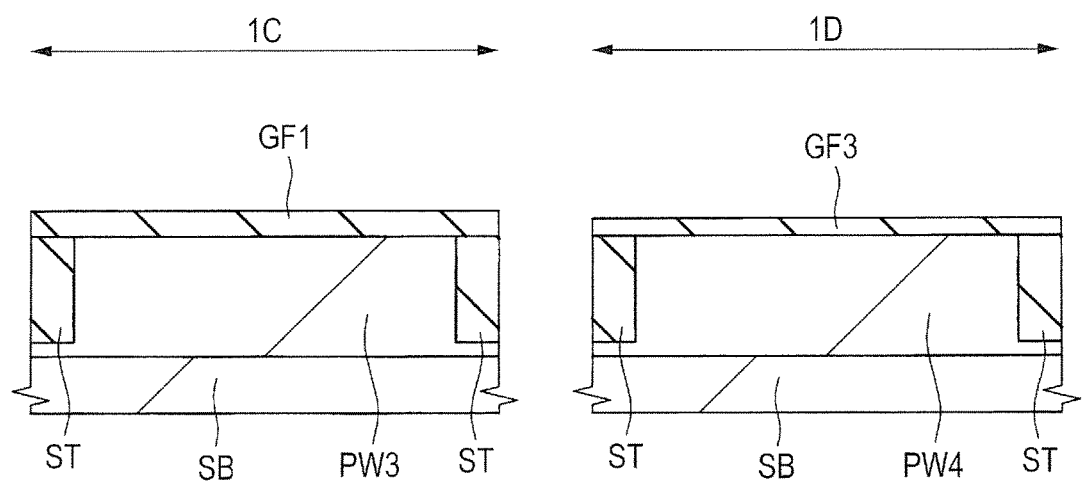
FIG. 44 is a main-portion cross-sectional view of the semiconductor device during the manufacturing process thereof, which is similar to FIG. 43.

Next, a photoresist pattern (not shown) which covers each of the lower-breakdown-voltage MISFET formation region 1B, the higher-breakdown-voltage MISFET formation region 1C, and the intermediate-breakdown-voltage MISFET formation region 1D and exposes the memory region 1A is formed. Then, using the photoresist pattern as an etching mask, the insulating film GF1 is etched. By the etching, the insulating film GF1 is removed from the memory region 1A, while the insulating film GF1 is left in each of the lower-breakdown-voltage MISFET formation region 1B and the higher-breakdown-voltage MISFET formation region 1C and the insulating film GF3 is left in the intermediate-breakdown-voltage MISFET formation region 1D. In the memory region 1A, as a result of the removal of the insulating film GF1 therefrom, the top surface (silicon surface) of the semiconductor substrate SB (p-type well PW1) is exposed. As the etching performed at this time, wet etching can be used appropriately. As an etchant, e.g., a hydrofluoric acid can be used appropriately. Subsequently, the photoresist pattern is removed. FIGS. 43 and 44 show this process stage.

Figure 45:
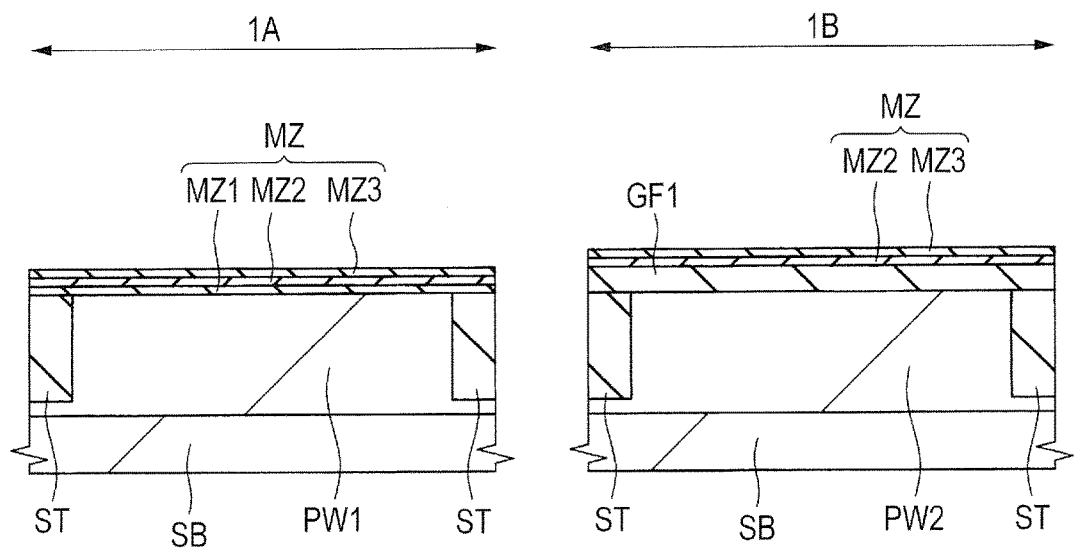
FIG. 45 is a main-portion cross-sectional view of the semiconductor device during the manufacturing process thereof, which is subsequent to FIG. 43.
Figure 46:
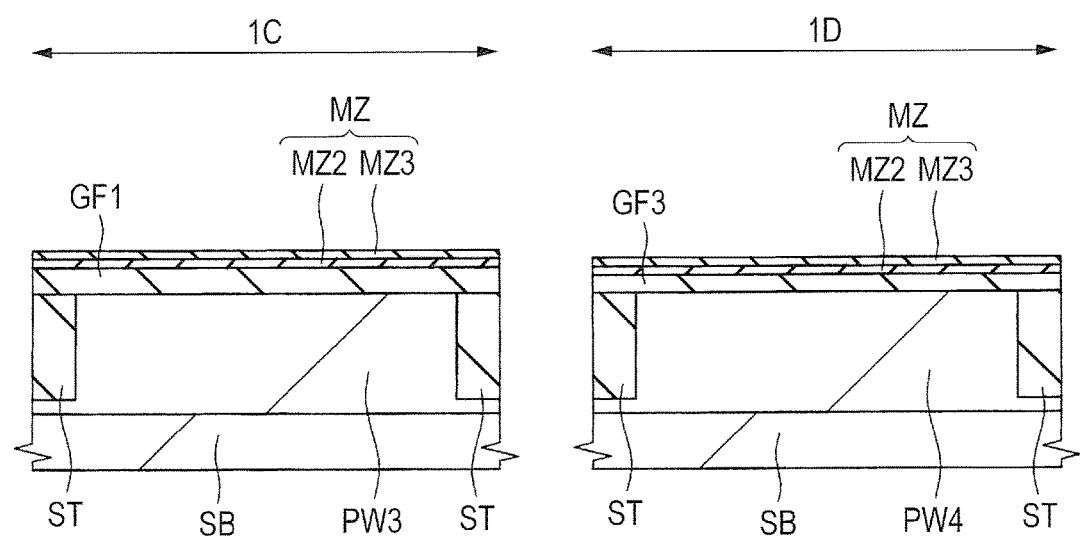
FIG. 46 is a main-portion cross-sectional view of the semiconductor device during the manufacturing process thereof, which is similar to FIG. 45.

Next, as shown in FIGS. 45 and 46, over the main surface of the semiconductor substrate SB, the insulating film (multi-layer insulating film) MZ is formed. At this time, in the memory region 1A, the insulating film MZ is formed over the top surface (silicon surface) of the semiconductor substrate SB (p-type well PW1). In the lower-breakdown-voltage MISFET formation region 1B, the insulating film MZ is formed over the insulating film GF1 over the semiconductor substrate SB (p-type well PW2). In the higher-breakdown-voltage MISFET formation region 1C, the insulating film MZ is formed over the insulating film GF1 over the semiconductor substrate SB (p-type well PW3). In the intermediate-breakdown-voltage MISFET formation region 1D, the insulating film MZ is formed over the insulating film GF3 over the semiconductor substrate SB (p-type well PW4). The configuration of the insulating film MZ and a method of forming the insulating film MZ are the same as in Embodiment 1 described above. Accordingly, in the memory region 1A, the insulating film MZ is made of a multi-layer film including the insulating film MZ1, the insulating film MZ2 over the insulating film MZ1, and the insulating film MZ3 over the insulating film MZ2. In the intermediate-breakdown-voltage MISFET formation region 1D, the insulating film MZ is made of a multi-layer film including the insulating film MZ2 and the insulating film MZ3 over the insulating film MZ2, similarly to the insulating film MZ in each of the lower-breakdown-voltage MISFET formation region 1B and the higher-breakdown-voltage MISFET formation region 1C. In the same manner as in Embodiment 1 described above, a band gap in each of the insulating films MZ1 and MZ3 is larger than a band gap in the insulating film MZ2.

Figure 47:
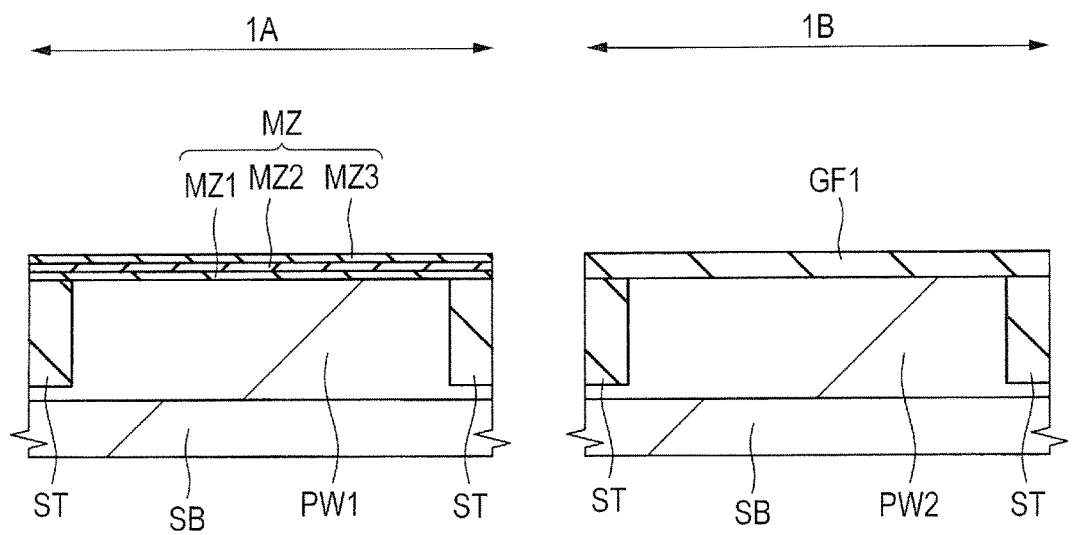
FIG. 47 is a main-portion cross-sectional view of the semiconductor device during the manufacturing process thereof, which is subsequent to FIG. 45.
Figure 48:
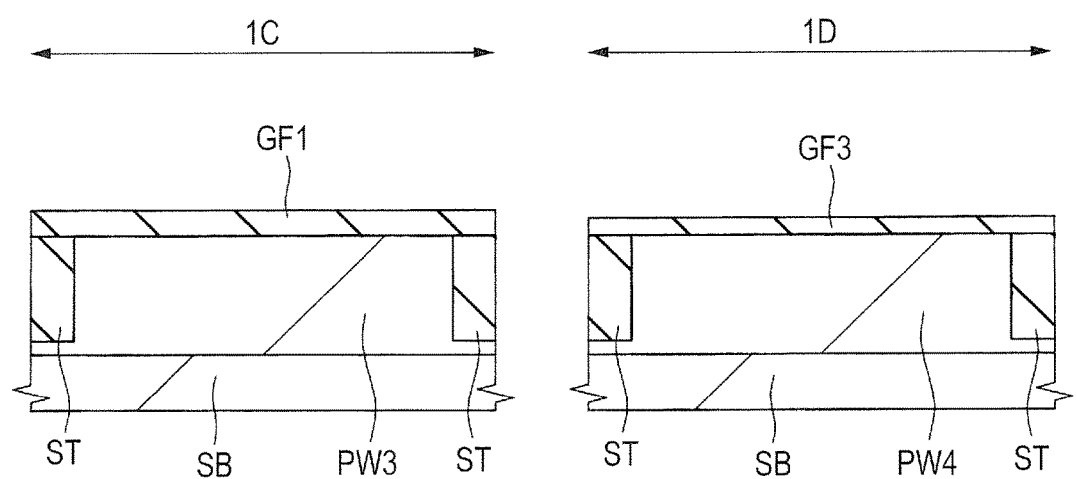
FIG. 48 is a main-portion cross-sectional view of the semiconductor device during the manufacturing process thereof, which is similar to FIG. 47.

Next, as shown in FIGS. 47 and 48, the step of removing the insulating film MZ by etching from each of the lower-breakdown-voltage MISFET formation region 1B, the higher-breakdown-voltage MISFET formation region 1C, and the intermediate-breakdown-voltage MISFET formation region 1D and leaving the insulating film MZ in the memory region 1A is performed. This process step can be performed in the same manner as in Embodiment 1 described above (process step shown in FIGS. 7 and 8 described above).

Specifically, this process step can be performed as follows.

First, a photoresist pattern (not shown) which covers the memory region 1A and exposes each of the lower-breakdown-voltage MISFET formation region 1B, the higher-breakdown-voltage MISFET formation region 1C, and the intermediate-breakdown-voltage MISFET formation region 1D is formed. Then, using the photoresist pattern as an etching mask, the insulating film MZ3 is etched to be removed from each of the lower-breakdown-voltage MISFET formation region 1B, the higher-breakdown-voltage MISFET formation region 1C, and the intermediate-breakdown-voltage MISFET formation region 1D. As the etching performed at this time, wet etching is used preferably. As an etchant, the same etchant (e.g., hydrofluoric acid) as used in Embodiment 1 described above can be used. Then, using the foregoing photoresist pattern as an etching mask, the insulating film MZ2 is etched to be removed from each of the lower-breakdown-voltage MISFET formation region 1B, the higher-breakdown-voltage MISFET formation region 1C, and the intermediate-breakdown-voltage MISFET formation region 1D. As the etching performed at this time, wet etching is used preferably. As an etchant, the same etchant (e.g., hot phosphoric acid) as used in Embodiment 1 described above can be used. Subsequently, the foregoing photoresist pattern is removed.

In another embodiment, it is also possible to remove the insulating film MZ3 from each of the lower-breakdown-voltage MISFET formation region 1B, the higher-breakdown-voltage MISFET formation region 1C, and the intermediate-breakdown-voltage MISFET formation region 1D using the foregoing resist pattern, subsequently remove the foregoing photoresist pattern, and then remove the insulating film MZ2 from each of the lower-breakdown-voltage MISFET formation region 1B, the higher-breakdown-voltage MISFET formation region 1C, and the intermediate-breakdown-voltage MISFET formation region 1D. In this case, the insulating film MZ2 is removed by wet etching from each of the lower-breakdown-voltage MISFET formation region 1B, the higher-breakdown-voltage MISFET formation region 1C, and the intermediate-breakdown-voltage MISFET formation region 1D. At this time, since an etchant (e.g., hot phosphoric acid) with which the insulating films GF1 and MZ3 are less likely to be etched than the insulating film MZ2 is used, it is possible to inhibit or prevent the insulating film MZ3 from being etched in the memory region 1A.

Thus, as shown in FIG. 47, a structure is obtained in which, in each of the lower-breakdown-voltage MISFET formation region 1B and the higher-breakdown-voltage MISFET formation region 1C, as a result of the removal of the insulating film MZ therefrom, the insulating film GF1 is exposed and, in the intermediate-breakdown-voltage MISFET formation region 1D, as a result of the removal of the insulating film MZ therefrom, the insulating film GF3 is exposed while, in the memory region 1A, the insulating film MZ made of the multi-layer film including the insulating films MZ1, MZ2, and MZ3 remains.

Figure 49:
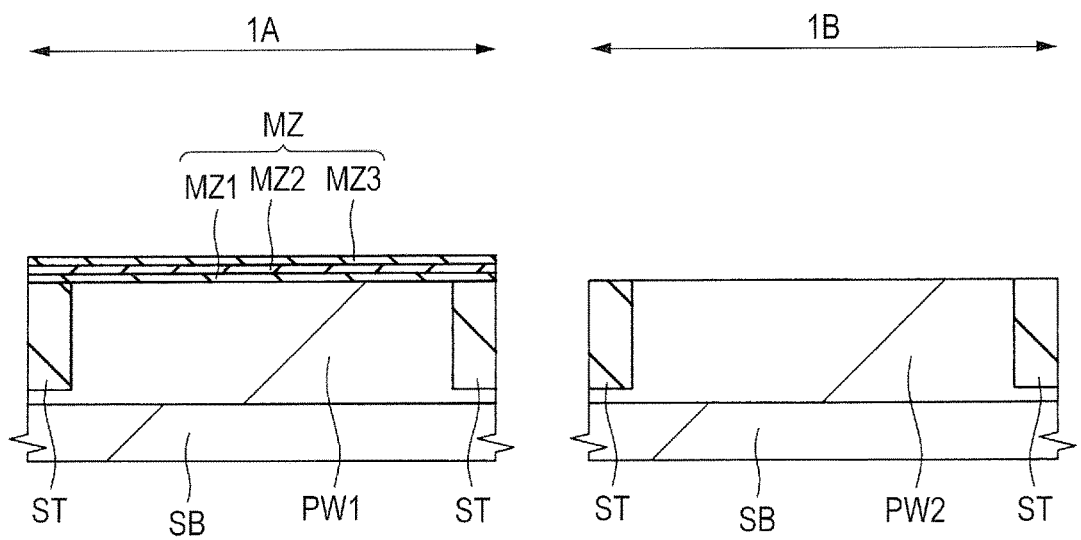
FIG. 49 is a main-portion cross-sectional view of the semiconductor device during the manufacturing process thereof, which is subsequent to FIG. 47.
Figure 50:
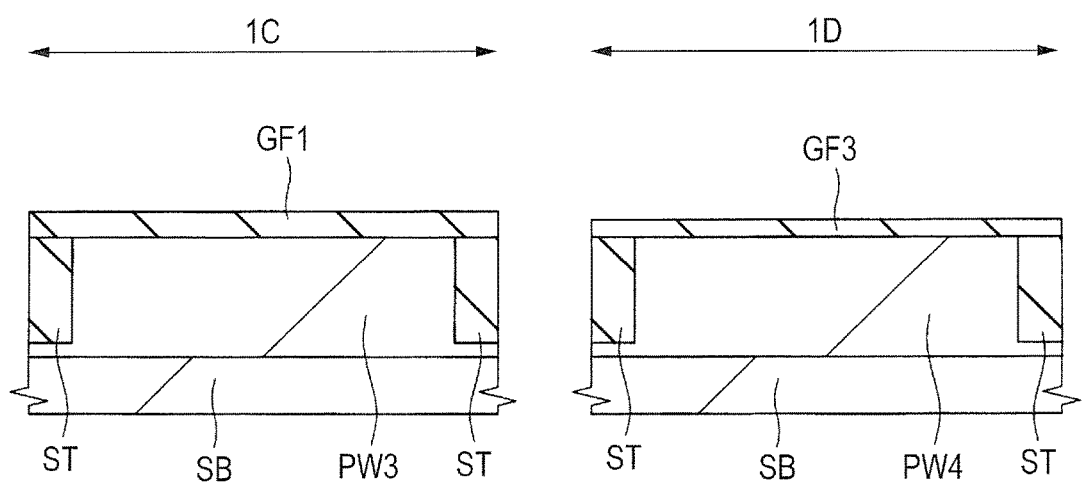
FIG. 50 is a main-portion cross-sectional view of the semiconductor device during the manufacturing process thereof, which is similar to FIG. 49.

Next, a photoresist pattern (not shown) which covers each of the memory region 1A, the higher-breakdown-voltage MISFET formation region 1C, and the intermediate-breakdown-voltage MISFET formation region 1D and exposes the lower-breakdown-voltage MISFET formation region 1B is formed. Then, using the photoresist pattern as an etching mask, the insulating film GF1 is removed by etching from the lower-breakdown-voltage MISFET formation region 1B. By the etching, the insulating film GF1 is removed from the lower-breakdown-voltage MISFET formation region 1B, while the insulating film MZ is left in the memory region 1A, the insulating film GF1 is left in the higher-breakdown-voltage MISFET formation region 1C, and the insulating film GF3 is left in the intermediate-breakdown-voltage MISFET formation region 1D. In the lower-breakdown-voltage MISFET formation region 1B, as a result of the removal of the insulating film GF1 therefrom, the top surface (silicon surface) of the semiconductor substrate SB (p-type well PW1) is exposed. As the etching performed at this time, wet etching can be used appropriately. As an etchant, e.g., a hydrofluoric acid can be used appropriately. Subsequently, the photoresist pattern is removed. FIGS. 49 and 50 show this process stage.

Figure 51:
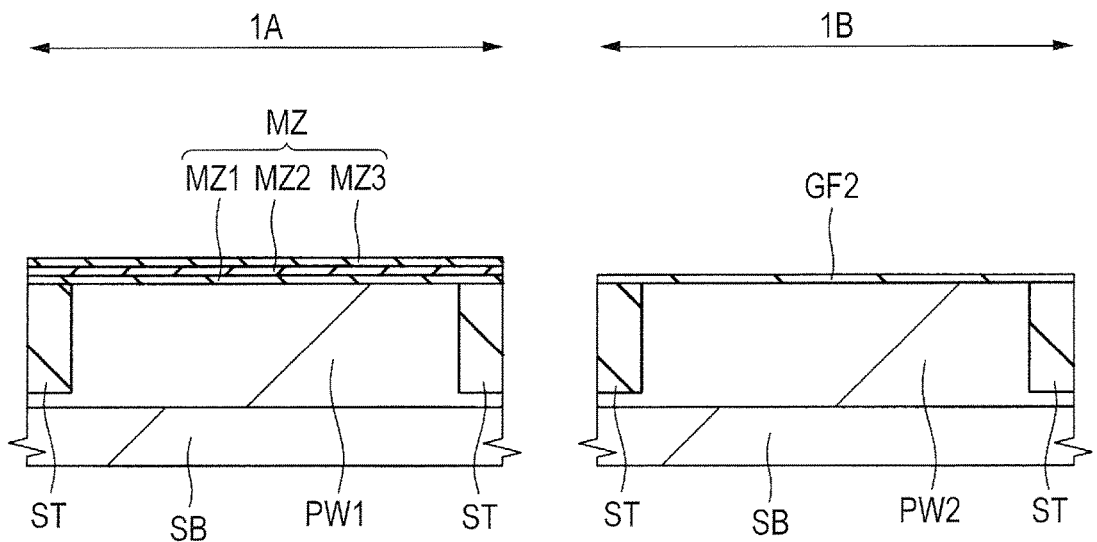
FIG. 51 is a main-portion cross-sectional view of the semiconductor device during the manufacturing process thereof, which is subsequent to FIG. 49.
Figure 52:
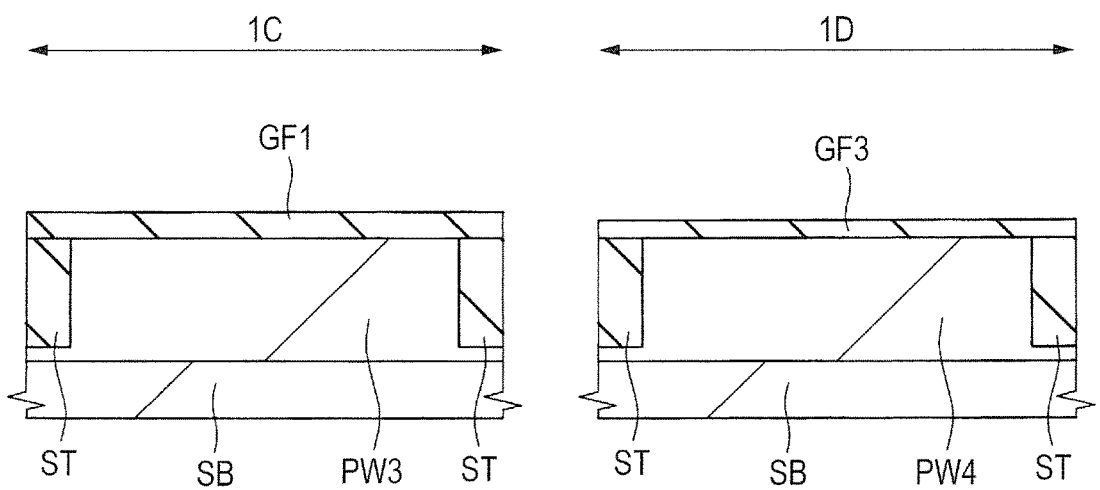
FIG. 52 is a main-portion cross-sectional view of the semiconductor device during the manufacturing process thereof, which is similar to FIG. 51.

Next, as shown in FIGS. 51 and 52, over the top surface of the semiconductor substrate SB (p-type well PW2) located in the lower-breakdown-voltage MISFET formation region 1B, the insulating film GF2 is formed.

In the same manner as in Embodiment 1 described above, the insulating film GF2 is an insulating film for the gate insulating film of the MISFET 2 formed in the lower-breakdown-voltage MISFET formation region 1B. A method of forming the insulating film GF2 and the material of the insulating film GF2 are the same as in Embodiment 1 described above. The formed film thickness of the insulating film GF2 is smaller than the formed film thickness of the insulating film GF3 in the process step shown in FIGS. 41 and 42 described above and can be controlled to, e.g., about 1 to 4 nm. When the step of forming the insulating film GF2 (thermal oxidation treatment for forming the insulating film GF2) is performed, over the top surface (silicon surface) of the semiconductor substrate SB (p-type well PW2) located in the lower-breakdown-voltage MISFET formation region 1B, the insulating film GF2 is formed. Also, when the step of forming the insulating film GF2 (thermal oxidation treatment for forming the insulating film GF2) is performed, in the memory region 1A, the thickness of the insulating film MZ3 is increased, while the insulating film GF2 is not formed. In the higher-breakdown-voltage MISFET formation region 1C, the thickness of the insulating film GF1 is increased, while the insulating film GF2 is not formed. In the intermediate-breakdown-voltage MISFET formation region 1D, the thickness of the insulating film GF3 is increased, while the insulating film GF2 is not formed.

Thus, the structure shown in FIGS. 51 and 52 is obtained. In the structure shown in FIGS. 51 and 52, in the memory region 1A, the insulating film MZ made of the multi-layer film including the insulating films MZ1, MZ2, and MZ3 is formed over the semiconductor substrate SB (p-type well PW1). In the lower-breakdown-voltage MISFET formation region 1B, the insulating film GF2 is formed over the semiconductor substrate SB (p-type well PW2). In the higher-breakdown-voltage MISFET formation region 1C, the insulating film GF1 is formed over the semiconductor substrate SB (p-type well PW3). In the intermediate-breakdown-voltage MISFET formation region 1D, the insulating film GF3 is formed over the semiconductor substrate SB (p-type well PW4). At this process stage, the thickness of the insulating film GF1 in the higher-breakdown-voltage MISFET formation region 1C is larger than the thickness of the insulating film GF3 in the intermediate-breakdown-voltage MISFET formation region 1D, and the thickness of the insulating film GF3 in the intermediate-breakdown-voltage MISFET formation region 1D is larger than the thickness of the insulating film GF2 in the lower-breakdown-voltage MISFET formation region 1B.

Figure 53:
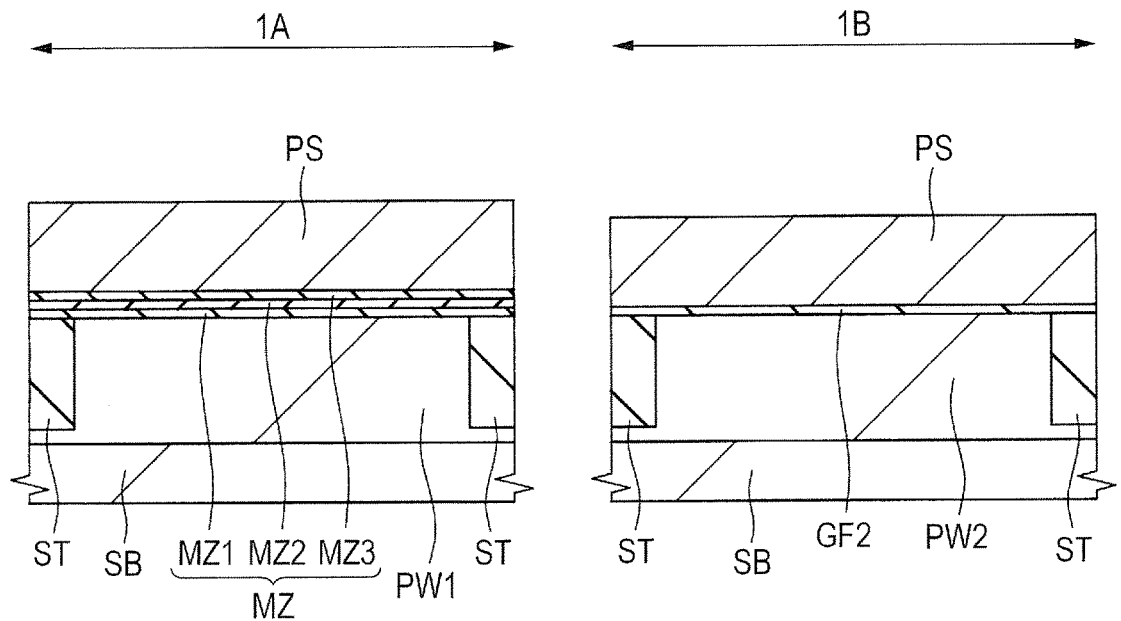
FIG. 53 is a main-portion cross-sectional view of the semiconductor device during the manufacturing process thereof, which is subsequent to FIG. 51.
Figure 54:
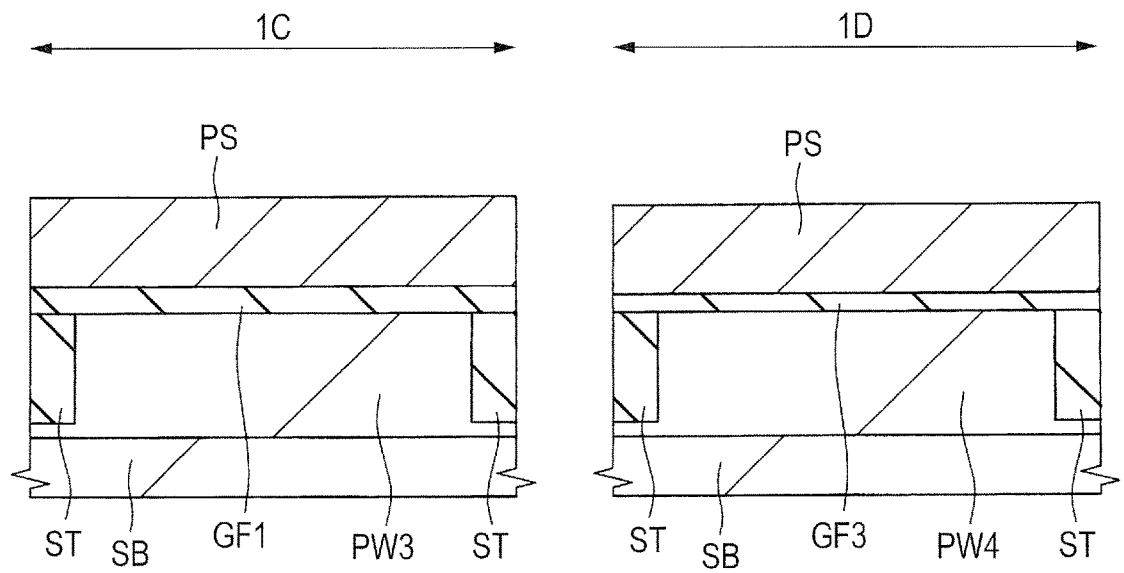
FIG. 54 is a main-portion cross-sectional view of the semiconductor device during the manufacturing process thereof, which is similar to FIG. 53.

Next, as shown in FIGS. 53 and 54, over the main surface (entire main surface) of the semiconductor substrate SB, the silicon film PS is formed as a film (conductive film) for forming the gate electrodes MG, GE1, GE2, and GE3. A method of forming the silicon film PS and the material of the silicon film PS are the same as in Embodiment 1 described above. In the memory region 1A, the silicon film PS is formed over the insulating film MZ. In the lower-breakdown-voltage MISFET formation region 1B, the silicon film PS is formed over the insulating film GF2. In the higher-breakdown-voltage MISFET formation region 1C, the silicon film PS is formed over the insulating film GF1. In the intermediate-breakdown-voltage MISFET formation region 1D, the silicon film PS is formed over the insulating film GF3.

Figure 55:
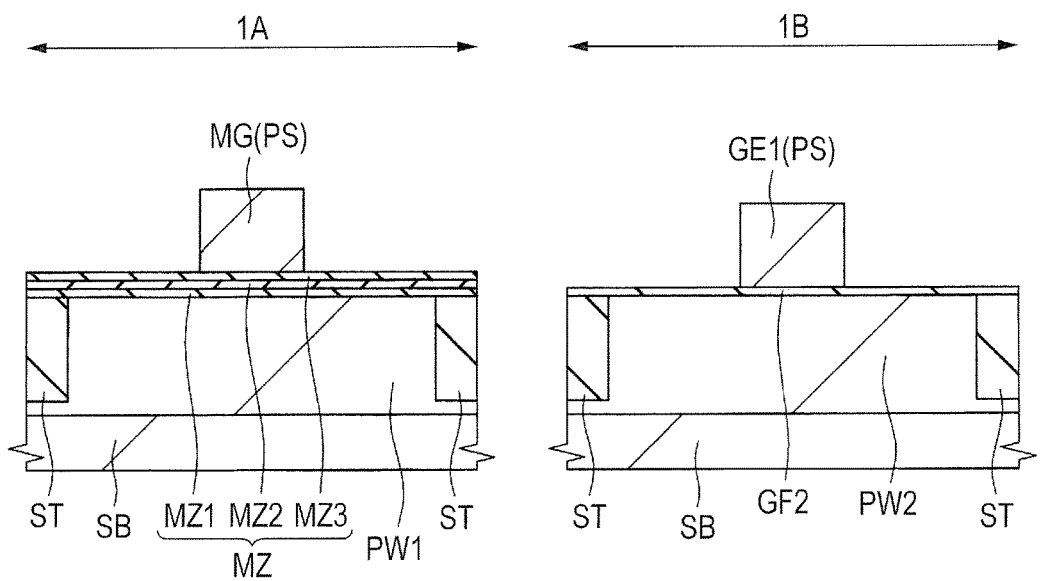
FIG. 55 is a main-portion cross-sectional view of the semiconductor device during the manufacturing process thereof, which is subsequent to FIG. 53.
Figure 56:
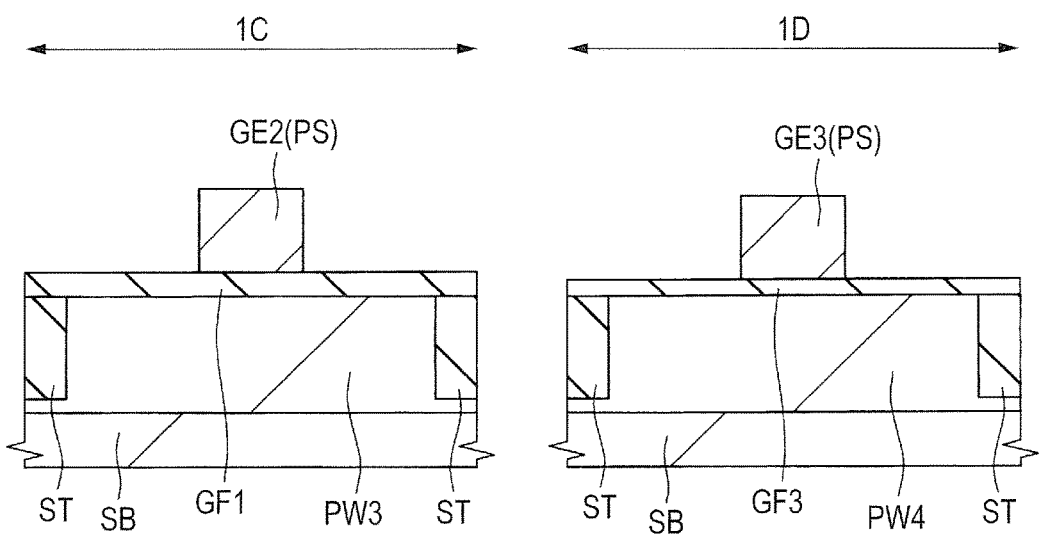
FIG. 56 is a main-portion cross-sectional view of the semiconductor device during the manufacturing process thereof, which is similar to FIG. 55.

Next, as shown in FIGS. 55 and 56, the silicon film PS is patterned using a photolithographic technique and an etching technique to form the gate electrodes MG, GE1, GE2, and GE3. The patterning step can be performed in the same manner as in Embodiment 1 described above. The gate electrodes MG, GE1, GE2, and GE3 are made of the patterned silicon film PS.

The gate electrode MG is formed over the insulating film MZ in the memory region 1A. The gate electrode GE1 is formed over the insulating film GF2 in the lower-breakdown-voltage MISFET formation region 1B. The gate electrode GE2 is formed over the insulating film GF1 in the higher-breakdown-voltage MISFET formation region 1C. The gate electrode GE3 is formed over the insulating film GF3 in the intermediate-breakdown-voltage MISFET formation region 1D. That is, in the memory region 1A, the gate electrode MG is formed over the semiconductor substrate SB (p-type well PW1) via the insulating film MZ. In the lower-breakdown-voltage MISFET formation region 1B, the gate electrode GE1 is formed over the semiconductor substrate SB (p-type well PW2) via the insulating film GF2. In the higher-breakdown-voltage MISFET formation region 1C, the gate electrode GE2 is formed over the semiconductor substrate SB (p-type well PW3) via the gate insulating film GF1. In the intermediate-breakdown-voltage MISFET formation region 1D, the gate electrode GE3 is formed over the semiconductor substrate SB (p-type well PW4) via the insulating film GF3.

In another form, it is also possible to form an insulating film for cap insulating films over the silicon film PS, then pattern a multi-layer film including the insulating film and the silicon film, and thus form the respective cap insulating films over the gate electrodes MG, GE1, GE2, and GE3.

The following process steps are basically the same as the process steps shown in FIGS. 14 to 23 described above in Embodiment 1 described above.

That is, in the same manner as in the process step shown in FIG. 14 described above in Embodiment 1 described above, the offset spacers OS are formed as necessary over the respective side walls of the gate electrodes MG, GE1, GE2, and GE3. Then, in the same manner as in the process step shown in FIG. 15 described above in Embodiment 1 described above, in the memory region 1A, the portions of the insulating films MZ3 and MZ2 which are uncovered with the gate electrode MG are removed by etching. Then, in the same manner as in the process steps shown in FIGS. 16 to 18 described above, using an ion implantation method, the n$^-$-type semiconductor regions EX1, EX2, EX3, and EX4 are formed. Since the n$^-$-type semiconductor regions EX1, EX2, and EX3 are the same as in Embodiment 1 described above, a repeated description thereof is omitted herein. When the n$^-$-type semiconductor regions EX4 are formed, the gate electrode GE3 and the offset spacers OS function as a mask. As a result, the n$^-$-type semiconductor regions EX4 are formed on both sides (on both sides in a gate length direction) of the gate electrode GE3 in the semiconductor substrate SB (p-type well PW4) in the intermediate-breakdown-voltage MISFET formation region 1D.

Figure 57:
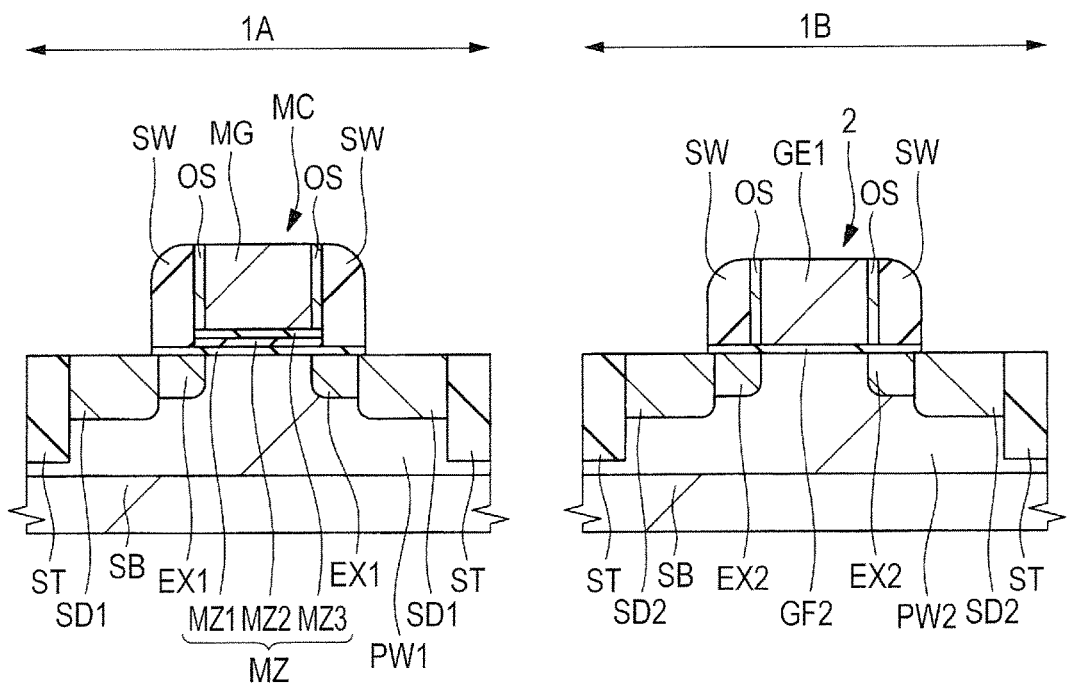
FIG. 57 is a main-portion cross-sectional view of the semiconductor device during the manufacturing process thereof, which is subsequent to FIG. 55.
Figure 58:
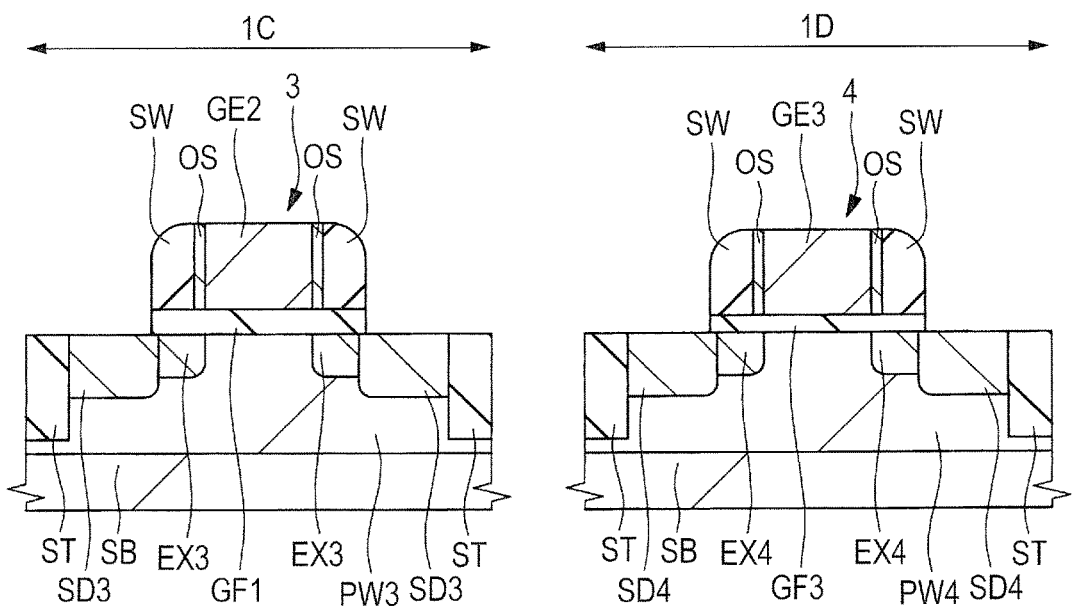
FIG. 58 is a main-portion cross-sectional view of the semiconductor device during the manufacturing process thereof, which is similar to FIG. 57.

Then, in the same manner as in the process step shown in FIG. 19 described above, over the respective side walls of the gate electrodes MG, GE1, GE2, and GE3, the sidewall spacers SW are formed. Then, in the same manner as in the process step shown in FIG. 20 described above, using an ion implantation method, the n$^+$-type semiconductor regions SD1, SD2, SD3, and SD4 are formed. Since the n$^+$-type semiconductor regions SD1, SD2, and SD3 are the same as in Embodiment 1 described above, a repeated description thereof is omitted herein. When the n$^+$-type semiconductor regions SD4 are formed, the gate electrode GE3 and the sidewall spacers SW over the respective side walls thereof function as a mask. As a result, the n$^+$-type semiconductor regions SD4 are formed on both sides (on both sides in the gate length direction) of a structure including the gate electrode MG and the sidewall spacers SW over the respective side walls thereof in the semiconductor substrate SB (p-type well PW4) in the intermediate-breakdown-voltage MISFET formation region 1D. Then, activation anneal is performed. In this manner, the structure shown in FIGS. 57 and 58 is obtained.

Thus, the memory element MC is formed in the memory region 1A, the lower-breakdown-voltage MISFET 2 is formed in the lower-breakdown-voltage MISFET formation region 1B, the higher-breakdown-voltage MISFET 3 is formed in the higher-breakdown-voltage MISFET formation region 1C, and the intermediate-breakdown-voltage MISFET 4 is formed in the intermediate-breakdown-voltage MISFET formation region 1D. The respective configurations of the memory element MC, the lower-breakdown-voltage MISFET 2, and the higher-breakdown-voltage MISFET 3 are basically the same as described above in Embodiment 1. The gate electrode GE3 functions as the gate electrode of the intermediate-breakdown-voltage MISFET 4, and the insulating film GF3 under the gate electrode GE3 functions as the gate insulating film of the MISFET 4. The n$^-$-type semiconductor regions EX4 and the n$^+$-type semiconductor regions SD4 having impurity concentrations higher than those of the n$^-$-type semiconductor regions EX4 form n-type semiconductor regions each functioning as the source or drain semiconductor region (source/drain region) of the MISFET 4. The thickness of the insulating film GF1 interposed between the gate electrode GE2 and the semiconductor substrate SB is larger than the thickness of the insulating film GF3 interposed between the gate electrode GE3 and the semiconductor substrate SB. The thickness of the insulating film GF3 interposed between the gate electrode GE3 and the semiconductor substrate SB is larger than the thickness of the insulating film GF2 interposed between the gate electrode GE1 and the semiconductor substrate SB.

Then, in the same manner as in Embodiment 1 described above, the foregoing metal silicide layers SL, the foregoing insulating film IL1, the foregoing plugs PG, the foregoing insulating film IL2, and the foregoing wires M1 are formed, though the illustration and repeated description thereof is omitted herein.

In Embodiment 2 also, by applying thereto the same technical idea as applied to Embodiment 1 described above and thus inventively improving the manufacturing process thereof, such effects as described above in Embodiment 1 can be obtained.

That is, in Embodiment 2, the nonvolatile memory element MC and the MISFETs 2, 3, and 4 having gate insulating films of different thicknesses are formed in the same semiconductor substrate SB, and the respective gate electrodes MG, GE1, GE2, and GE3 thereof are formed using a common film (corresponding to the foregoing silicon film PS). Accordingly, after a structure is obtained in which the insulating film MZ is formed in the memory region 1A, the insulating film GF2 is formed in the lower-breakdown-voltage MISFET formation region 1B, the insulating film GF1 is formed in the higher-breakdown-voltage MISFET formation region 1C, and the insulating film GF3 is formed in the intermediate-breakdown-voltage MISFET formation region 1D (FIGS. 51 and 52), the film (silicon film PS) for forming the gate electrodes MG, GE1, GE2, and GE3 is formed.

In addition, in Embodiment 2, the insulating film GF1 is formed first among the insulating films MZ, GF1, GF2, and GF3, and then the insulating films GF3, MZ, and GF2 are formed in this order. This can ease problems as described in association with the foregoing first and second studied examples.

That is, among the insulating films GF1, GF2, and GF3, the insulating film GF1 is the thickest, the insulating film GF3 is the next thickest, and the insulating film GF2 is the thinnest. Accordingly, among the step of forming the insulating film GF1, the step of forming the insulating film GF2, and the step of forming the insulating film GF3, the step of forming the insulating film GF1 has the highest oxidizing effect, the step of forming the insulating film GF3 has the next highest oxidizing effect, and the step of forming the insulating film GF2 has the lowest oxidizing effect. Consequently, in Embodiment 2, after the step of forming the insulating film GF1 and the step of forming the insulating film GF3 are performed in this order, the step of forming the insulating film MZ is performed. This can prevent the insulating film MZ in the memory region 1A from being influenced by the step of forming the insulating film GF1 and the step of forming the insulating film GF3. As a result, it is possible to prevent a problem (problem as described in association with the foregoing first studied example) resulting from the influence exerted on the insulating film MZ in the memory region 1A by the step of forming the insulating film GF1 and the step of forming the insulating film GF3.

Also, in Embodiment 2, after the step of forming the insulating film MZ, the step of forming the insulating film GF2 is performed. Accordingly, the insulating film MZ in the memory region 1A may possibly be influenced by the step of forming the insulating film GF2. However, the insulating film GF2 formed in the step of forming the insulating film GF2 is thin. Consequently, even when the insulating film MZ in the memory region 1A is influenced by the step of forming the insulating film MZ2, the influence exerted on the insulating film MZ in the memory region 1A is not significant and is limited. Therefore, a problem is less likely to arise.

The case is assumed where, unlike in Embodiment 2, the insulating film MZ is formed last after the formation of the insulating films GF1, GF2, and GF3. In this case, after the step of forming the insulating film MZ, the insulating film MZ needs to be removed by etching from each of the lower-breakdown-voltage MISFET formation region 1B, the higher-breakdown-voltage MISFET formation region 1C, and the intermediate-breakdown-voltage MISFET formation region 1D. By the etching performed at this time, the insulating film GF2 in the lower-breakdown-voltage MISFET formation region 1B may also be etched. This results in variations in the thickness of the insulating film GF2, i.e., variations in the thickness of the gate insulating film of the MISFET 2 and consequently results in variations in the characteristics of the MISFET 2, as described in association with the foregoing second studied example.

By contrast, in Embodiment 2, after the step of forming the insulating film MZ is performed, the step of forming the insulating film GF2 is performed. This can prevent the insulating film GF2 from being influenced by the etching when the insulating film MZ is removed from each of the lower-breakdown-voltage MISFET formation region 1B, the higher-breakdown-voltage MISFET formation region 1C, and the intermediate-breakdown-voltage MISFET formation region 1D. This allows the thickness of the insulating film GF2 in the lower-breakdown-voltage MISFET formation region 1B to be precisely controlled to an intended value. As a result, it is possible to control the thickness of the gate insulating film (insulating film GF2) of the MISFET 2 to an intended value and inhibit or prevent variations in the characteristics of the MISFET 2.

Thus, in Embodiment 2, the insulating film GF2 having the smallest thickness among the insulating films GF1, GF2, and GF3 is formed after the step of forming the insulating film MZ, while the other insulating films GF1 and GF3 are formed before the step of forming the insulating film MZ. This can prevent the step of forming the insulating film GF1 and the step of forming the insulating film GF3 from influencing the insulating film MZ and thus reliably control the structure of the gate insulating film of the memory element MC to an intended configuration. Accordingly, it is possible to reliably provide the memory element NC with intended characteristics and reliably prevent variations in the characteristics of the memory element MC. In addition, since it is possible to prevent the step of removing the insulating film MZ from influencing the thin insulating film GF2, it is possible to reliably provide the MISFET 2 using the thin insulating film GF2 as the gate insulating film with intended characteristics and reliably prevent variations in the characteristics of the MISFET 2. As a result, it is possible to improve the performance of the semiconductor device including the nonvolatile memory element MC and the MISFETs 2, 3, and 4 having the gate insulating films of different thicknesses and improve the reliability thereof.

In the case of Embodiment 2, after the step of forming the insulating film GF2, the silicon film PS is formed. Accordingly, even when pinholes are formed in the insulating films GF1 and GF3 in the etching when the insulating film MZ is removed, the pinholes in the insulating films GF1 and GF3 can be eliminated in the step of forming the insulating film GF2 (thermal oxidation treatment for forming the insulating film GF2). This can reliably prevent a pinhole from being formed in the gate insulating film of each of the MISFETs 2, 3, and 4. As a result, it is possible to improve the reliability of the semiconductor device.

The following is the summary of Embodiments 1 and 2 described above.

That is, a nonvolatile memory element (MC) and a plurality of types of MISFETs having respective gate insulating films of different thicknesses are formed in the same semiconductor substrate (SB). In this case, the memory element (MC) and the foregoing plurality of types of MISFETs are formed using a common film (corresponding to the foregoing silicon film PS). Accordingly, it is necessary to obtain a structure (the structure shown in FIG. 11 described above or the structure shown in FIGS. 51 and 52 described above) in which, in the respective regions where the memory element and the foregoing plurality of types of MISFETs are to be formed, appropriate gate insulating films are formed. Among the foregoing plurality of types of MISFETs, the MISFET having the thinnest gate insulating film is referred to herein as a lower-breakdown-voltage transistor. An insulating film (corresponding to the foregoing insulating film GF2) for the gate insulating film of the lower-breakdown-voltage transistor is formed after an insulating film (corresponding to the foregoing insulating film MZ) for the gate insulating film of the memory element (MC) is formed. Insulating films (corresponding to the foregoing insulating films GF1 and GF3) for the gate insulating films of those of the plurality of types of MISFETs other than the lower-breakdown-voltage transistor are formed before an insulating film (corresponding to the foregoing insulating film MZ) for the gate insulating film of the memory element (MC) is formed. This can precisely control the thickness of the gate insulating film of the lower-breakdown-voltage transistor to an intended value and can reliably control the structure of the gate insulating film of the memory element (MC) to an intended configuration. As a result, it is possible to improve the performance of the semiconductor device and the reliability thereof.

Embodiment 3

A method of manufacturing a semiconductor device in Embodiment 3 will be described with reference to FIGS. 59 to 80. FIGS. 59 to 80 are main-portion cross-sectional views of the semiconductor device in Embodiment 3 during the manufacturing process thereof. FIGS. 59 to 80 show main-portion cross-sectional views of a memory region 1A1, a memory region 1A2, the lower-breakdown-voltage MISFET formation region 1B, and the higher-breakdown-voltage MISFET formation region 1C.

Embodiment 3 corresponds to the case where a SOI substrate 10 is used instead of the foregoing semiconductor substrate SB in Embodiment 1 described above.

Figure 59:
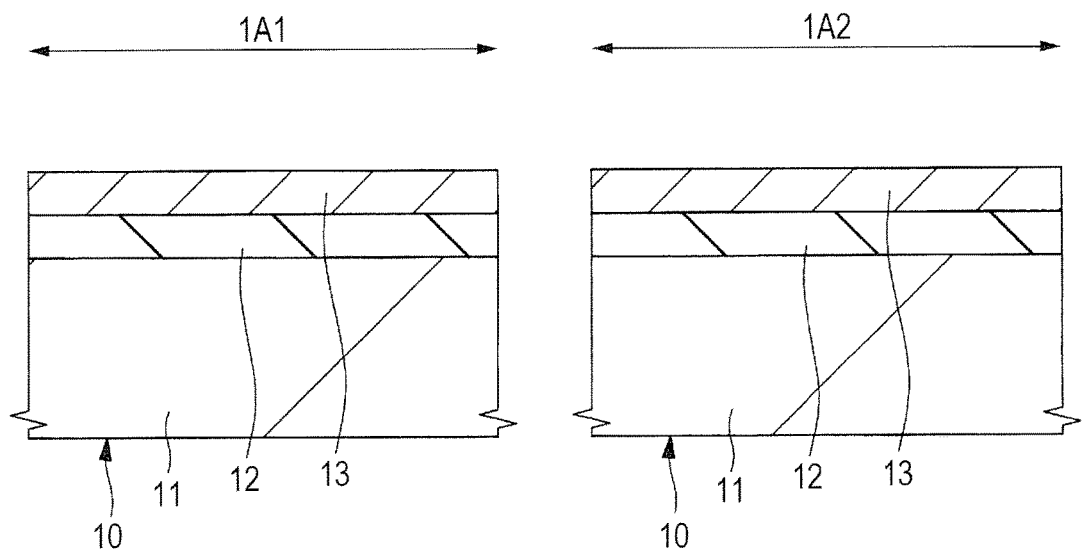
FIG. 59 is a main-portion cross-sectional view of a semiconductor device in still another embodiment during the manufacturing process thereof.
Figure 60:
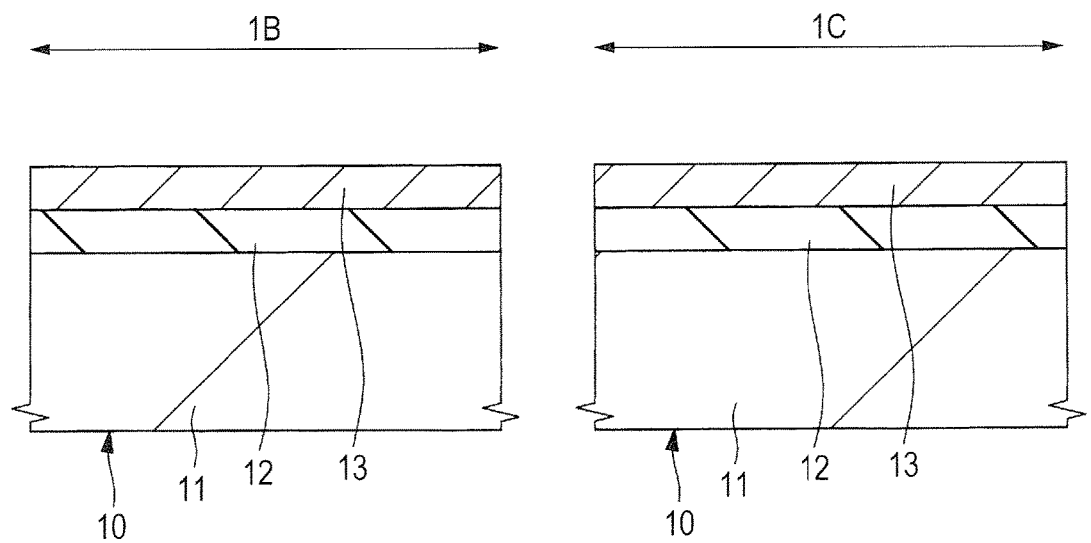
FIG. 60 is a main-portion cross-sectional view of the semiconductor device during the manufacturing process thereof, which is similar to FIG. 59.

First, as shown in FIGS. 59 to 60, the SOI (Silicon On Insulator) substrate 10 is provided (prepared).

The SOI substrate 10 has a semiconductor substrate (supporting substrate) 11 as a supporting substrate, an insulating layer (embedded insulating film) 12 formed over the main surface of the semiconductor substrate 11, and a semiconductor layer 13 formed over the upper surface of the insulating layer 12.

The semiconductor substrate 11 is the supporting substrate which supports the insulating layer 12 and the structure over the insulating layer 12. The semiconductor substrate 11 is preferably a monocrystalline silicon substrate and made of, e.g., p-type monocrystalline silicon. The insulating film 12 is preferably a silicon dioxide film and can also be regarded as an embedded oxide film, i.e., a BOX (Buried Oxide) layer. The semiconductor layer 13 is made of monocrystalline silicon or the like.

Figure 61:
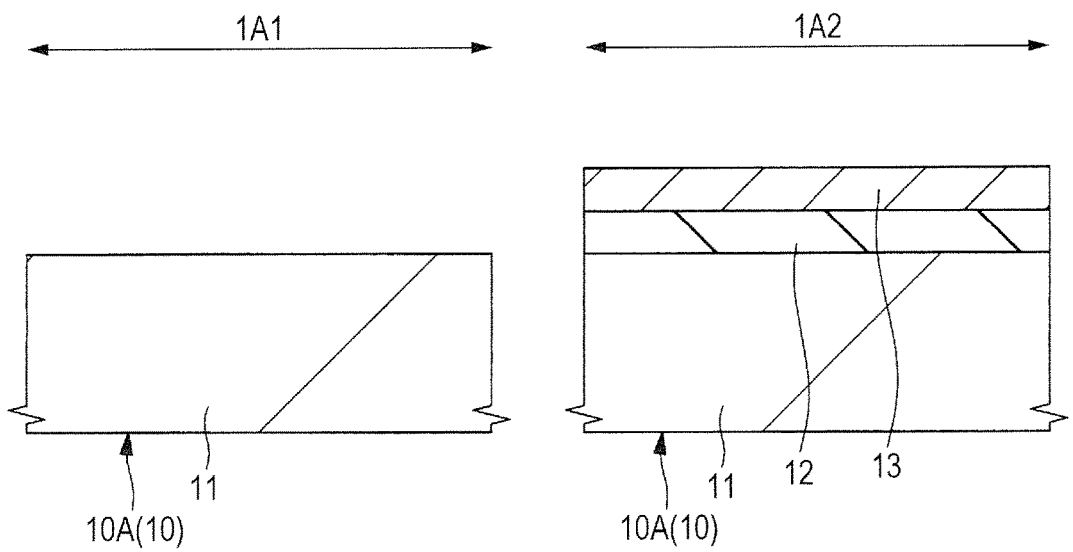
FIG. 61 is a main-portion cross-sectional view of the semiconductor device during the manufacturing process thereof, which is subsequent to FIG. 59.
Figure 62:
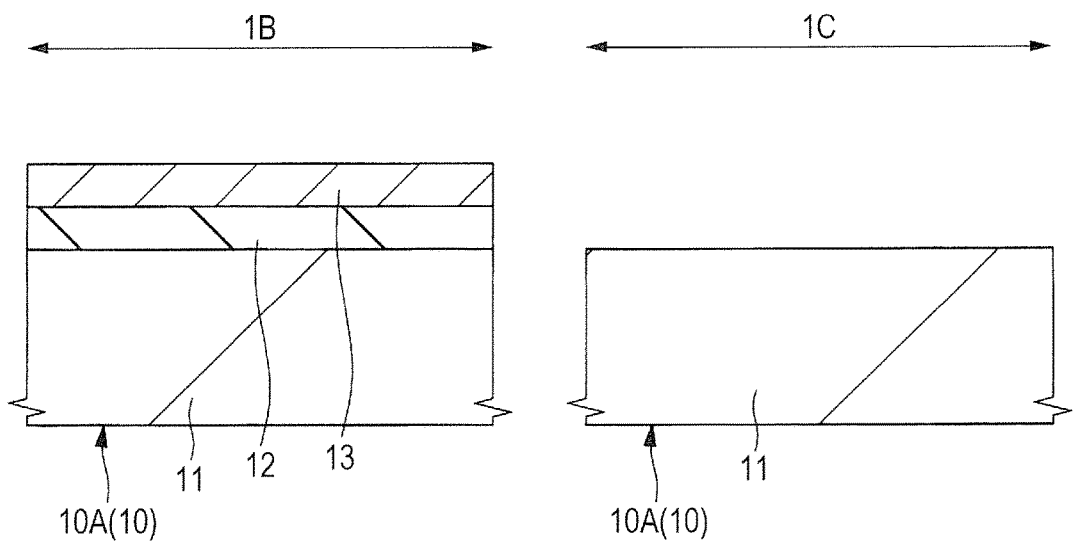
FIG. 62 is a main-portion cross-sectional view of the semiconductor device during the manufacturing process thereof, which is similar to FIG. 61.
Figure 63:
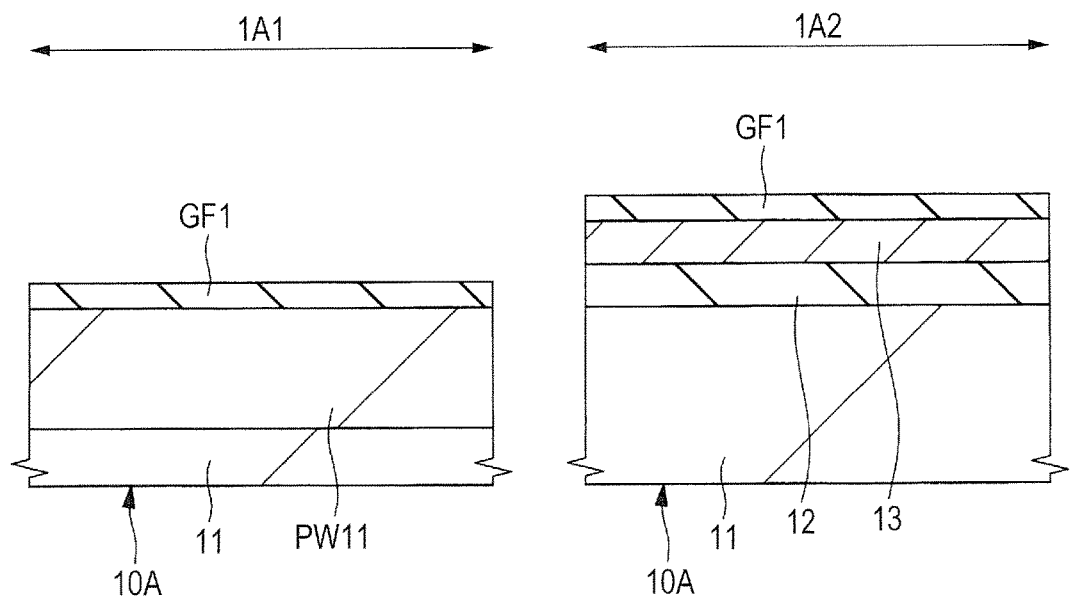
FIG. 63 is a main-portion cross-sectional view of the semiconductor device during the manufacturing process thereof, which is subsequent to FIG. 61.
Figure 64:
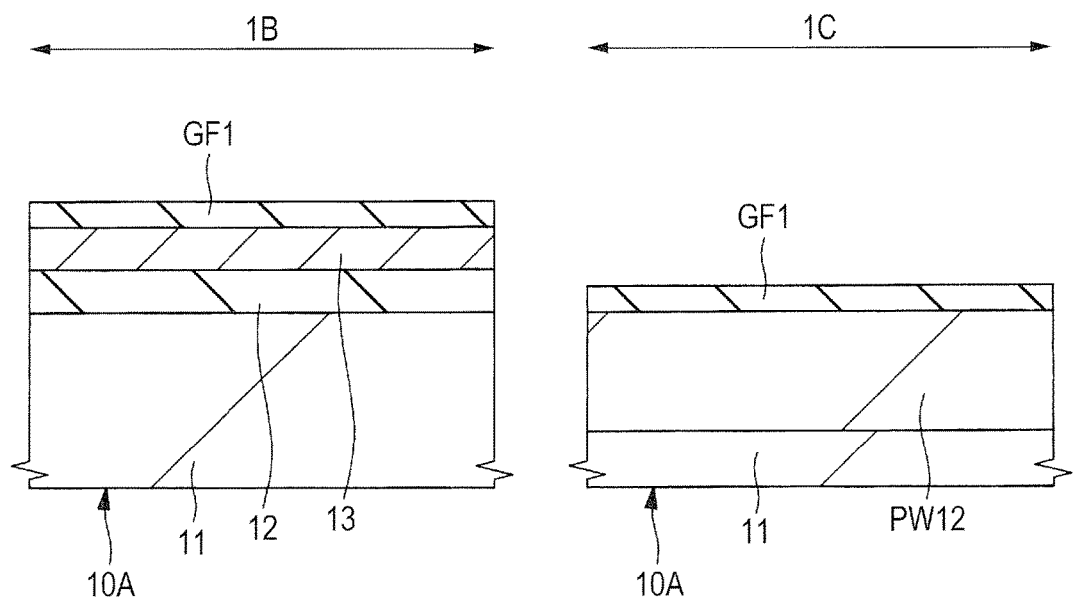
FIG. 64 is a main-portion cross-sectional view of the semiconductor device during the manufacturing process thereof, which is similar to FIG. 63.

Next, in the SOI substrate 10, isolation regions (not shown) are formed. The isolation regions are formed by forming trenches extending through the semiconductor layer 13 and the insulating layer 12 and having bottom portions reaching the semiconductor substrate 11 and then embedding an insulating film (e.g., a silicon dioxide film) in each of the trenches. Then, the semiconductor layer 13 and the insulating layer 12 are removed from each of the memory region 1A1 and the higher-breakdown-voltage MISFET formation region 1C using a photolithographic technique and an etching technique. At this time, the semiconductor layer 13 and the insulating layer 12 in each of the memory region 1A2 and the lower-breakdown-voltage MISFET formation region 1B are not removed therefrom and are left. Thus, the structure shown in FIGS. 61 and 62 is obtained.

The SOI substrate 10 at this process stage is referred to as a substrate 10A. The substrate 10A has the memory regions 1A1 and 1A2 where the memory elements MC are to be formed, the lower-breakdown-voltage MISFET formation region 1B where the lower-breakdown-voltage MISFET 2 is to be formed, and the higher-breakdown-voltage MISFET formation region 1C where the higher-breakdown-voltage MISFET 3 is to be formed. Each of the memory regions 1A1 and 1A2 corresponds to the memory region 1A in Embodiment 1 described above.

Each of the memory region 1A1 and the higher-breakdown-voltage MISFET formation region 1C of the substrate 10A after the removal of the semiconductor layer 13 and the insulating layer 12 therefrom is formed herein of the semiconductor substrate 11. Each of the memory region 1A2 and the lower-breakdown-voltage MISFET formation region 1B of the semiconductor substrate 10A retains the SOI structure (multi-layer structure including the semiconductor substrate 11, the insulating layer 12, and the semiconductor layer 13). That is, each of the memory region 1A2 and the lower-breakdown-voltage MISFET formation region 1B of the substrate 10A is a region having a multi-layer structure (SOI structure) in which the semiconductor layer 13 over the insulating layer 12, the insulating layer 12 over the semiconductor substrate 11, and the semiconductor substrate 11 are stacked. Each of the memory region 1A1 and the higher-breakdown-voltage MISFET formation region 1C of the substrate 10A is a region formed of the semiconductor substrate 11 over the entire thickness thereof. When the main surface (or top surface) of the substrate 10A is mentioned below, the main surface (or top surface) of the substrate 10A is synonymous to the main surface (or top surface) of the semiconductor layer 13 in each of the memory region 1A2 and the lower-breakdown-voltage MISFET formation region 1B and to the main surface (or top surface) of the semiconductor substrate 11 in each of the memory region 1A1 and the higher-breakdown-voltage MISFET formation region 1C.

Next, p-type wells PW11 and PW12 are formed respectively in the semiconductor substrate 11 located in the memory region 1A1 and the semiconductor substrate 11 located in the higher-breakdown-voltage MISFET formation region 1C using an ion implantation method. As necessary, it is also possible to form respective p-type wells (not shown) in the semiconductor substrate 11 located in the memory region 1A2 and the semiconductor substrate 11 located in the lower-breakdown-voltage MISFET formation region 1B using an ion implantation method.

Next, after the top surface of the substrate 10A is cleaned to be purified, the insulating film GF1 is formed over the top surface of the substrate 10A. Thus, the structure shown in FIGS. 63 and 64 corresponding to FIG. 3 described above is obtained. The insulating film GF1 is formed over the semiconductor substrate 11 (p-type well PW11) located in the memory region 1A1, over the semiconductor layer 13 located in the memory region 1A2, over the semiconductor layer 13 located in the lower-breakdown-voltage MISFET formation region 1B, and over the semiconductor substrate 11 (p-type well PW12) located in the higher-breakdown-voltage MISFET formation region 1G. In the same manner as in Embodiment 1 described above, the insulating film GF1 is an insulating film for the gate insulating film of the MISFET 3 formed in the higher-breakdown-voltage MISFET formation region 1G. A method of forming the insulating film GF1 and the material and thickness of the insulating film GF1 are the same as in Embodiment 1 described above.

Figure 65:
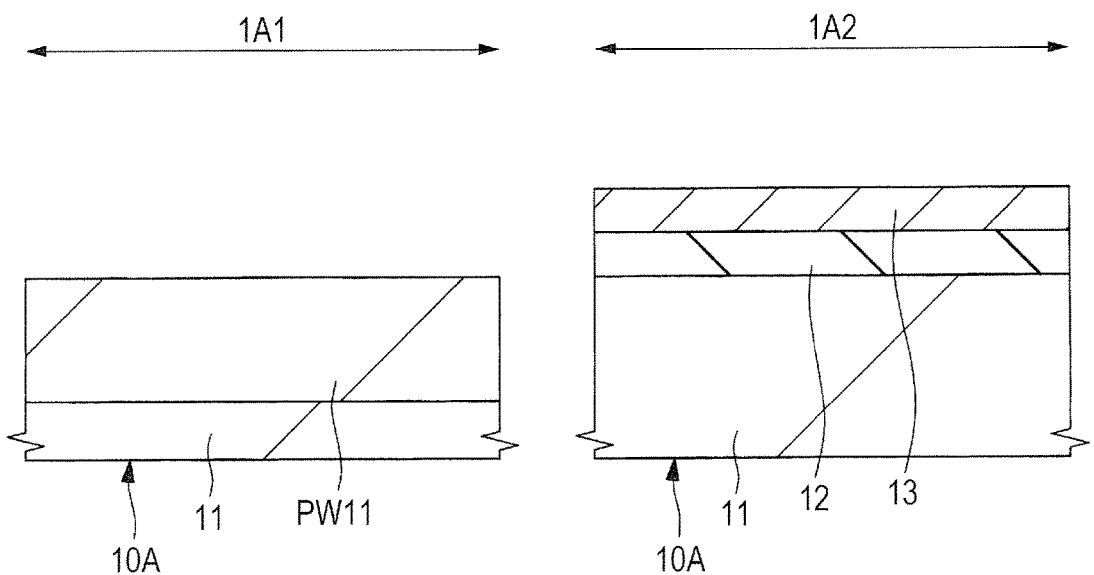
FIG. 65 is a main-portion cross-sectional view of the semiconductor device during the manufacturing process thereof, which is subsequent to FIG. 63.
Figure 66:
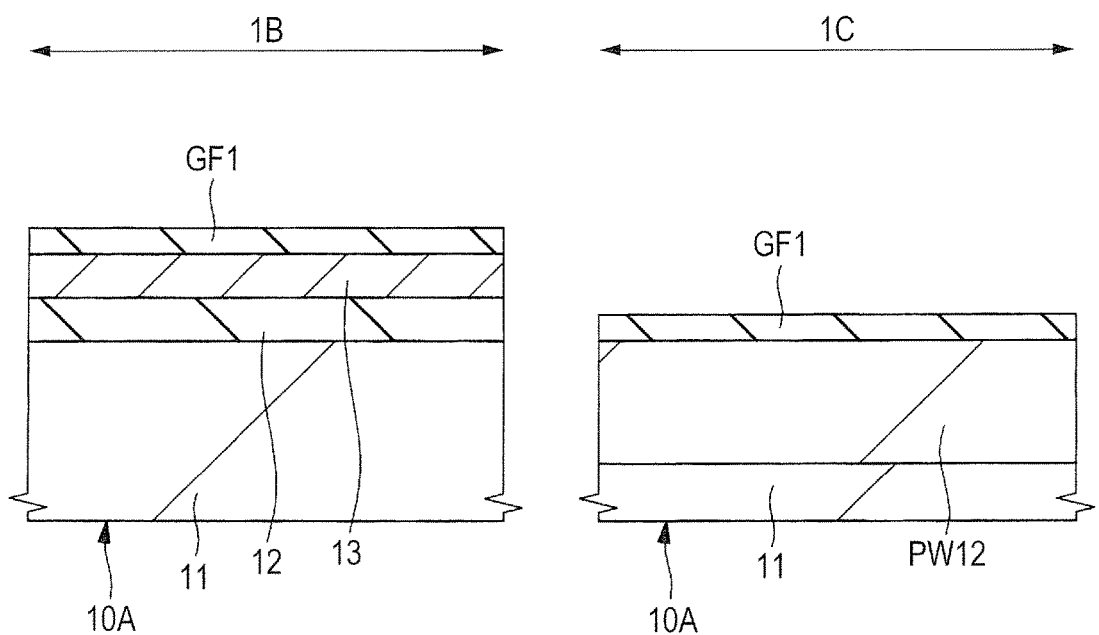
FIG. 66 is a main-portion cross-sectional view of the semiconductor device during the manufacturing process thereof, which is similar to FIG. 65.

Next, a photoresist pattern (not shown) which covers each of the lower-breakdown-voltage MISFET formation region 1B and the higher-breakdown-voltage MISFET formation region 1C and exposes each of the memory regions 1A1 and 1A2 is formed. Then, using the photoresist pattern as an etching mask, the insulating film GF1 is etched. By the etching, the insulating film GF1 is removed from each of the memory regions 1A1 and 1A2, while left in each of the lower-breakdown-voltage MISFET formation region 1B and the higher-breakdown-voltage MISFET formation region 1C. In the memory region 1A1, the top surface (silicon surface) of the semiconductor substrate 11 (p-type well PW11) is exposed while, in the memory region 1A2, the top surface (silicon surface) of the semiconductor layer 13 is exposed. For the etching performed at this time, wet etching can be used appropriately. As an etchant, e.g., a hydrofluoric acid can be used appropriately. Subsequently, the photoresist pattern is removed. FIGS. 65 and 66 show this process stage.

Figure 67:
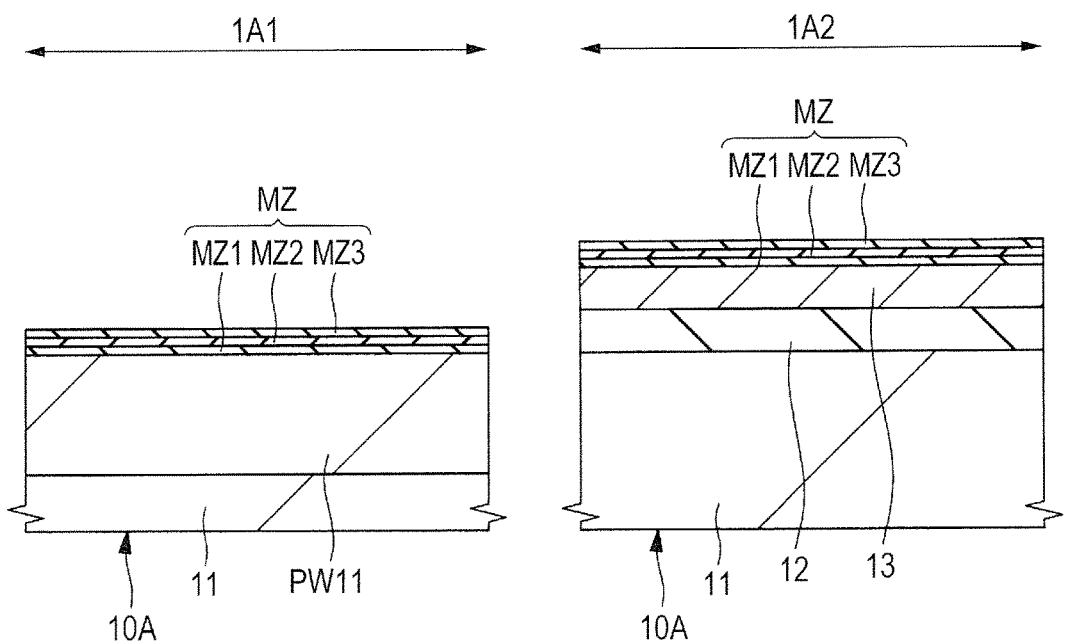
FIG. 67 is a main-portion cross-sectional view of the semiconductor device during the manufacturing process thereof, which is subsequent to FIG. 65.
Figure 68:
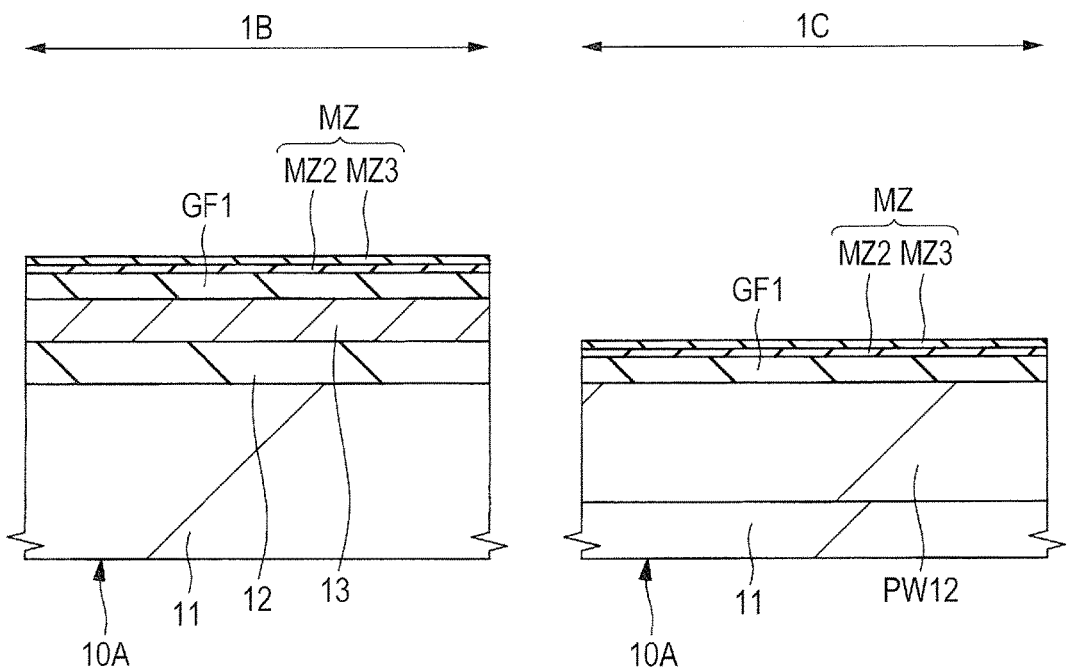
FIG. 68 is a main-portion cross-sectional view of the semiconductor device during the manufacturing process thereof, which is similar to FIG. 67.

Next, as shown in FIGS. 67 and 68, over the main surface of the substrate 10A, the insulating film (multi-layer insulating film) MZ is formed. At this time, in the memory region 1A1, the insulating film MZ is formed over the top surface (silicon surface) of the semiconductor substrate 11 (p-type well PW11) while, in the memory region 1A2, the insulating film MZ is formed over the top surface (silicon surface) of the semiconductor layer 13. In each of the lower-breakdown-voltage MISFET formation region 1B and the higher-breakdown-voltage MISFET formation region 1C, the insulating film MZ is formed over the insulating film GF1. The configuration of the insulating film MZ and a method of forming the insulating film MZ are the same as in Embodiment 1 described above. Accordingly, the insulating film MZ in each of the memory regions 1A1 and 1A2 is made of a multi-layer film including the insulating film MZ1, the insulating film MZ2 over the insulating film MZ1, and the insulating film MZ3 over the insulating film MZ2. On the other hand, the insulating film MZ in each of the lower-breakdown-voltage MISFET formation region 1B and the higher-breakdown-voltage MISFET formation region 1C is made of a multi-layer film including the insulating film MZ2 and the insulating film MZ3 over the insulating film MZ2.

Figure 69:
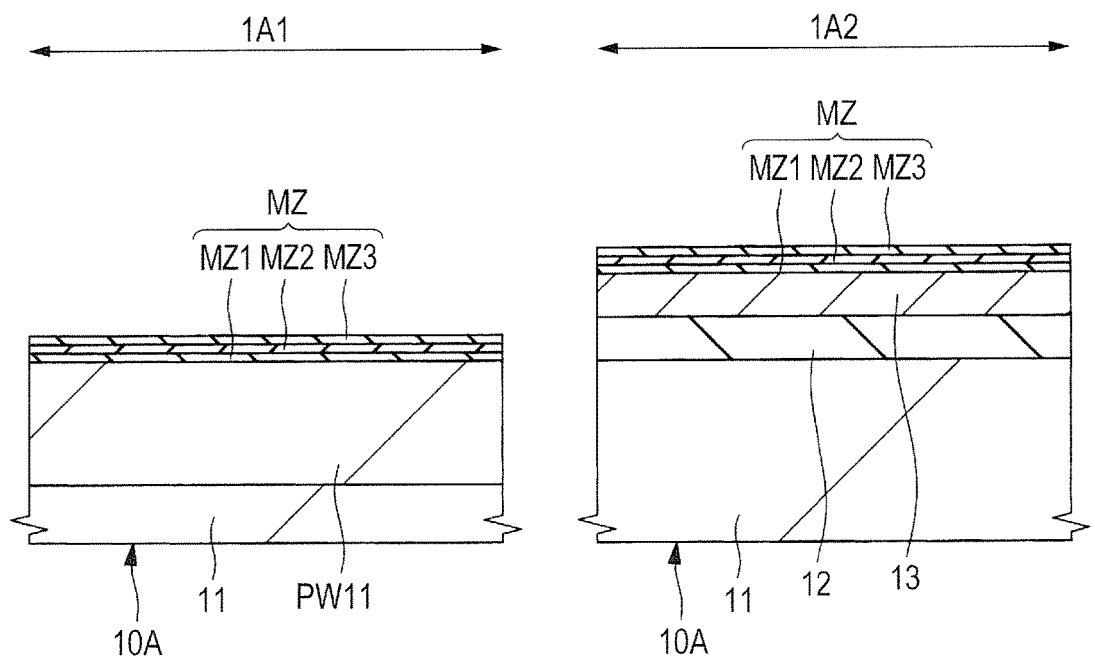
FIG. 69 is a main-portion cross-sectional view of the semiconductor device during the manufacturing process thereof, which is subsequent to FIG. 67.
Figure 70:
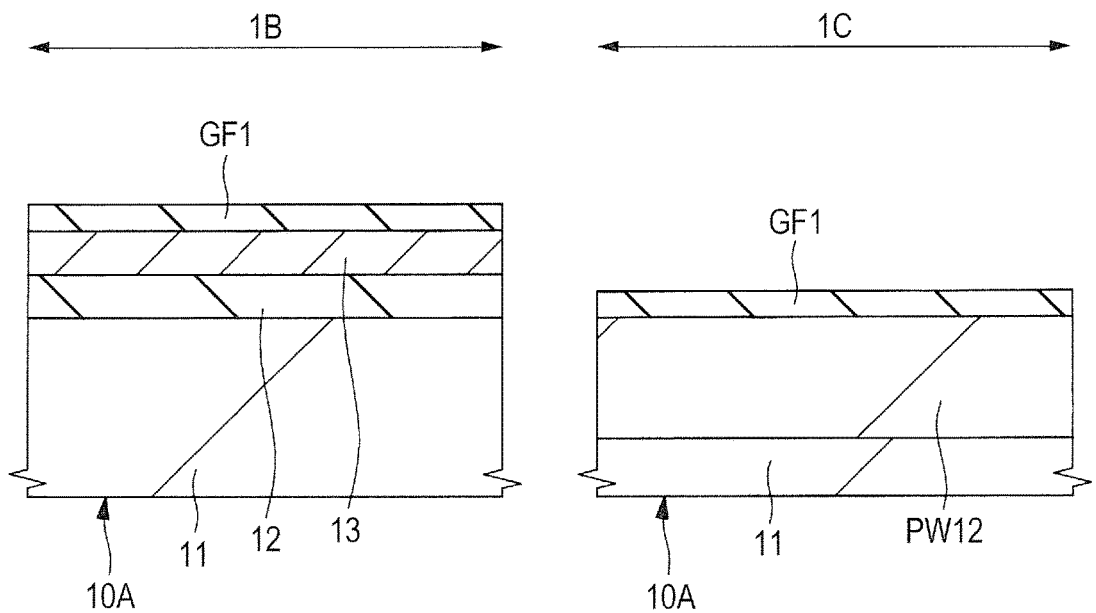
FIG. 70 is a main-portion cross-sectional view of the semiconductor device during the manufacturing process thereof, which is similar to FIG. 69.

Next, as shown in FIGS. 69 and 70, the step of removing the insulating film MZ by etching from each of the lower-breakdown-voltage MISFET formation region 1B and the higher-breakdown-voltage MISFET formation region 1C and leaving the insulating film MZ in each of the memory regions 1A1 and 1A2 is performed. Since this step can be performed in the same manner as in Embodiment 1 described above (step shown in FIGS. 7 and 8 described above), a repeated description thereof is omitted herein. In each of the lower-breakdown-voltage MISFET formation region 1B and the higher-breakdown-voltage MISFET formation region 1C, as a result of the removal of the insulating film MZ therefrom, the insulating film GF1 is exposed.

Figure 71:
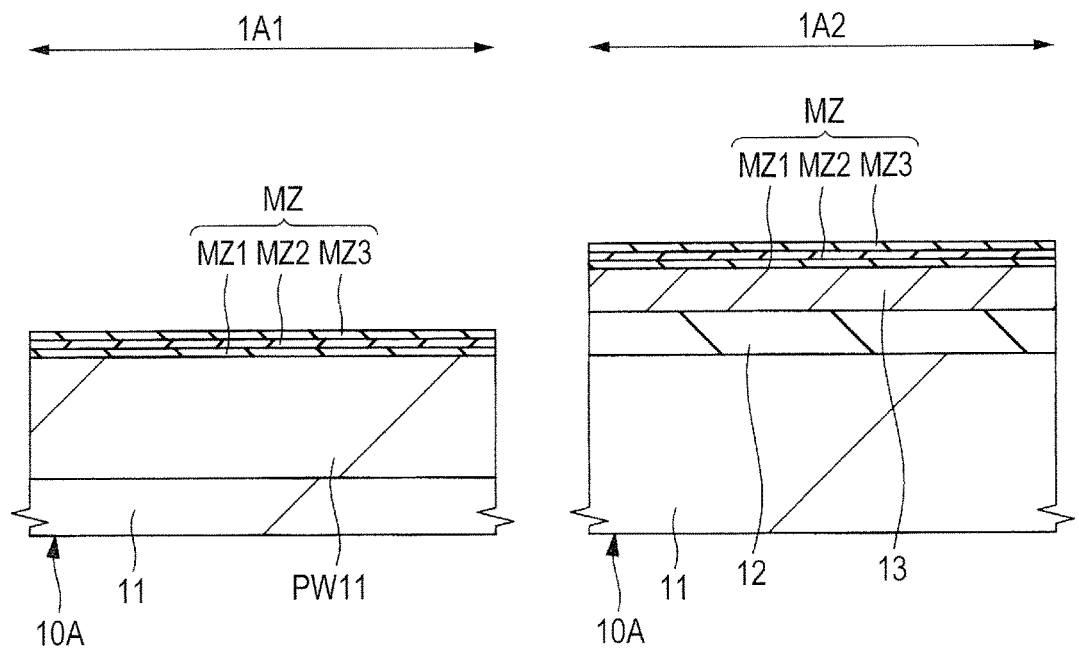
FIG. 71 is a main-portion cross-sectional view of the semiconductor device during the manufacturing process thereof, which is subsequent to FIG. 69.
Figure 72:
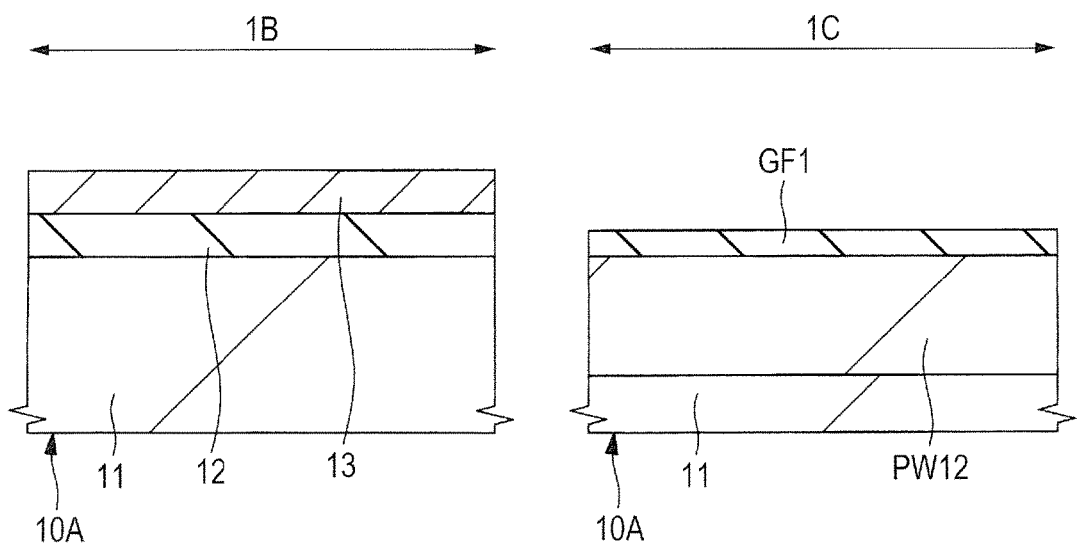
FIG. 72 is a main-portion cross-sectional view of the semiconductor device during the manufacturing process thereof, which is similar to FIG. 71.

Next, a photoresist pattern (not shown) which covers each of the memory regions 1A1 and 1A2 and the higher-breakdown-voltage MISFET formation region 1C and exposes the lower-breakdown-voltage MISFET formation region 1B is formed. Then, using the photoresist pattern as an etching mask, the insulating film GF1 is removed by etching from the lower-breakdown-voltage MISFET formation region 1B. By the etching, the insulating film GF1 is removed from the lower-breakdown-voltage MISFET formation region 1B, while the insulating film MZ is left in each of the memory regions 1A1 and 1A2 and the insulating film GF1 is left in the higher-breakdown-voltage MISFET formation region 1C. In the lower-breakdown-voltage MISFET formation region 1B, the top surface (silicon surface) of the semiconductor layer 13 is exposed. As the etching performed at this time, wet etching can be used appropriately. As an etchant, e.g., a hydrofluoric acid can be used appropriately. Subsequently, the photoresist pattern is removed. FIGS. 71 and 72 show this process stage.

Figure 73:
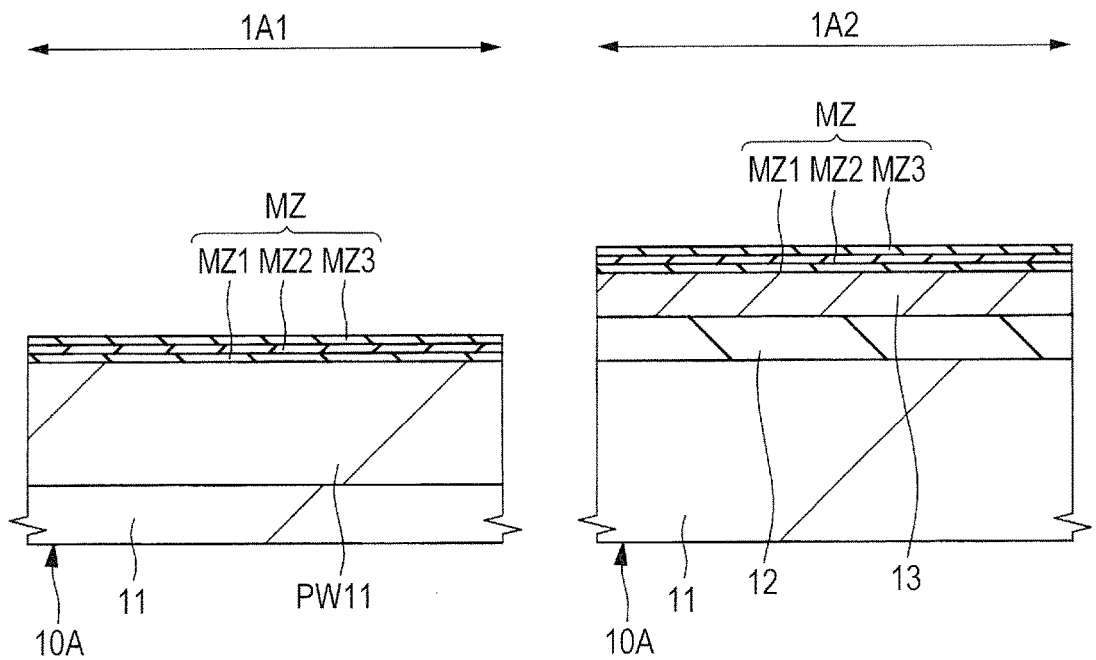
FIG. 73 is a main-portion cross-sectional view of the semiconductor device during the manufacturing process thereof, which is subsequent to FIG. 71.
Figure 74:
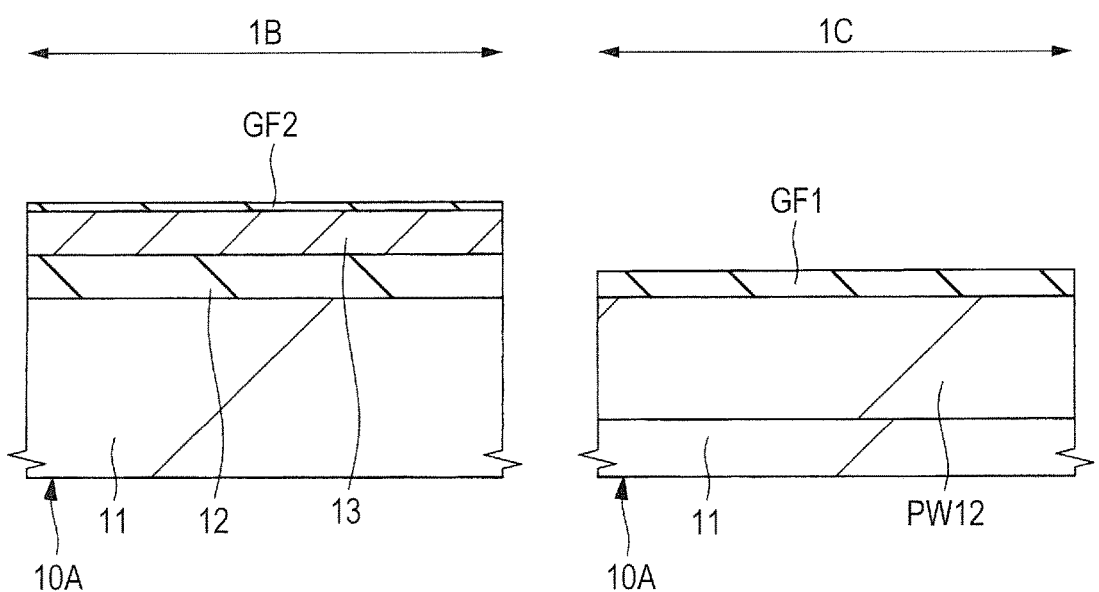
FIG. 74 is a main-portion cross-sectional view of the semiconductor device during the manufacturing process thereof, which is similar to FIG. 73.

Next, as shown in FIGS. 73 and 74, over the top surface of the semiconductor layer 13 located in the lower-breakdown-voltage MISFET formation region 1B, the insulating film GF2 is formed.

In the same manner as in Embodiment 1 described above, the insulating film GF2 is an insulating film for the gate insulating film of the MISFET 2 formed in the lower-breakdown-voltage MISFET formation region 1B. A method of forming the insulating film GF2 and the material and thickness of the insulating film GF2 are the same as in Embodiment 1 described above. When the step of forming the insulating film GF2 (thermal oxidation treatment for forming the insulating film GF2) is performed, in each of the memory regions 1A1 and 1A2, the thickness of the insulating film MZ3 is increased, while the insulating film GF2 is not formed. In the higher-breakdown-voltage MISFET formation region 1C, the thickness of the insulating film GF1 is increased, while the insulating film GF2 is not formed.

Thus, the structure shown in FIGS. 73 and 74 is obtained. In the structure shown in FIGS. 73 and 74, in the memory region 1A1, the insulating film MZ made of the multi-layer film including the insulating films MZ1, MZ2, and MZ3 is formed over the semiconductor substrate 11 (p-type well PW11). In the memory region 1A2, the insulating film MZ made of the multi-layer film including the insulating films MZ1, MZ2, and MZ3 is formed over the semiconductor layer 13. In the lower-breakdown-voltage MISFET formation region 1B, the insulating film GF2 is formed over the semiconductor layer 13. In the higher-breakdown-voltage MISFET formation region 1C, the insulating film GF1 is formed over the semiconductor substrate 11 (p-type well PW12). At this process stage, the thickness of the insulating film GF1 in the higher-breakdown-voltage MISFET formation region 1C is larger than the thickness of the insulating film GF2 in the lower-breakdown-voltage MISFET formation region 1B.

Figure 75:
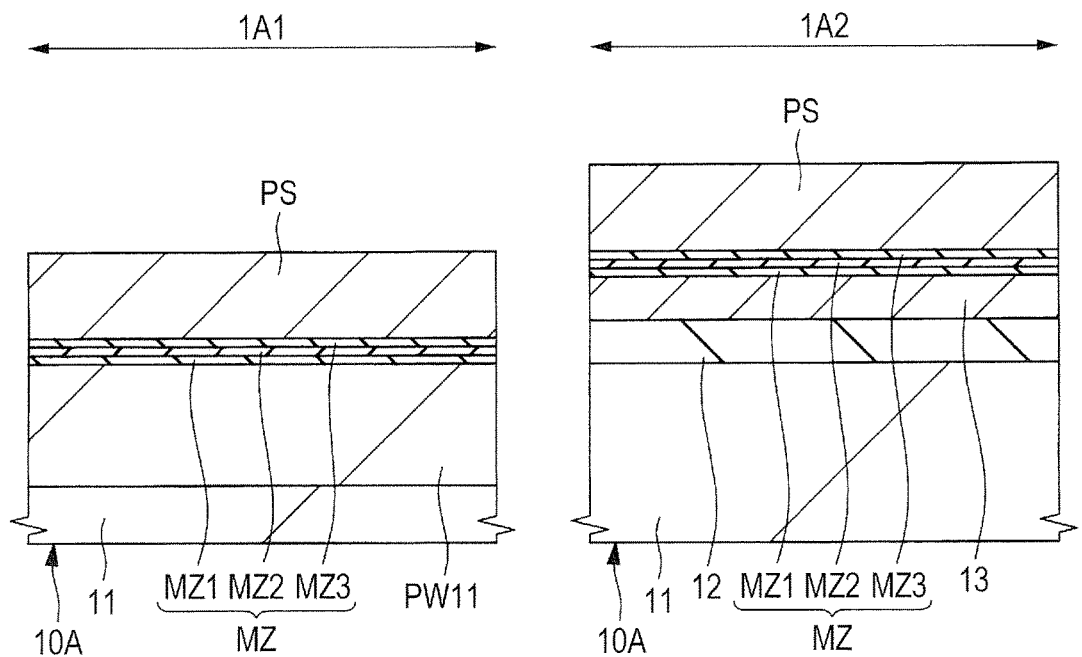
FIG. 75 is a main-portion cross-sectional view of the semiconductor device during the manufacturing process thereof, which is subsequent to FIG. 73.
Figure 76:
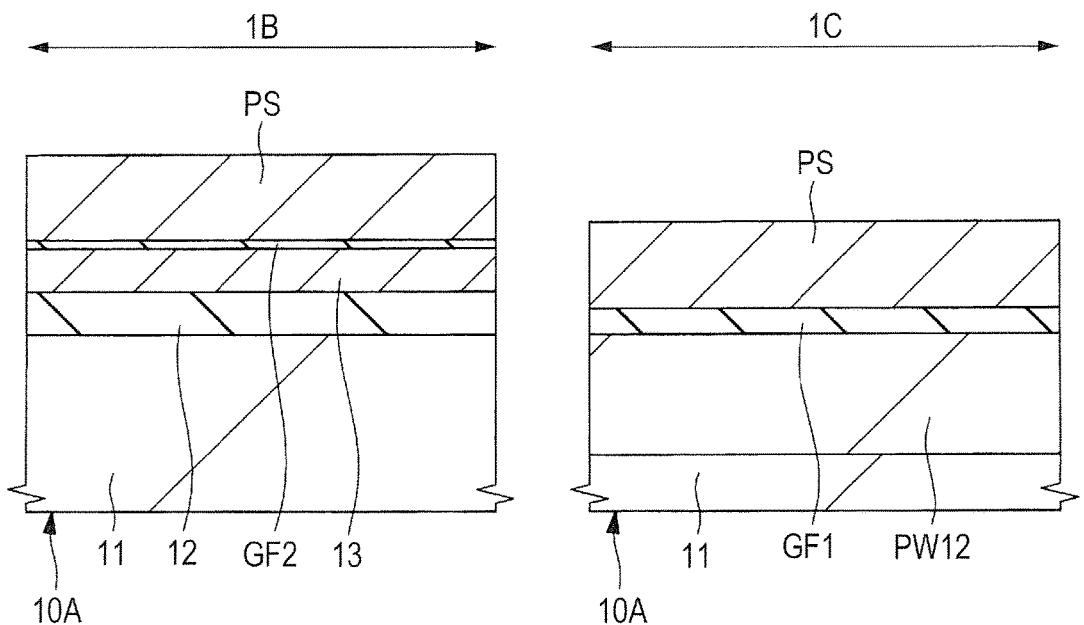
FIG. 76 is a main-portion cross-sectional view of the semiconductor device during the manufacturing process thereof, which is similar to FIG. 75.

Next, as shown in FIGS. 75 and 76, over the main surface (entire main surface) of the semiconductor substrate SB, the same silicon film PS as formed in Embodiment 1 described above is formed. The silicon film PS is a film (conductive film) for forming the gate electrodes MG1, MG2, GE1, and GE2. In each of the memory regions 1A1 and 1A2, the silicon film PS is formed over the insulating film MZ. In the lower-breakdown-voltage MISFET formation region 1B, the silicon film PS is formed over the insulating film GF2. In the higher-breakdown-voltage MISFET formation region 1C, the silicon film PS is formed over the insulating film GF1.

Figure 77:
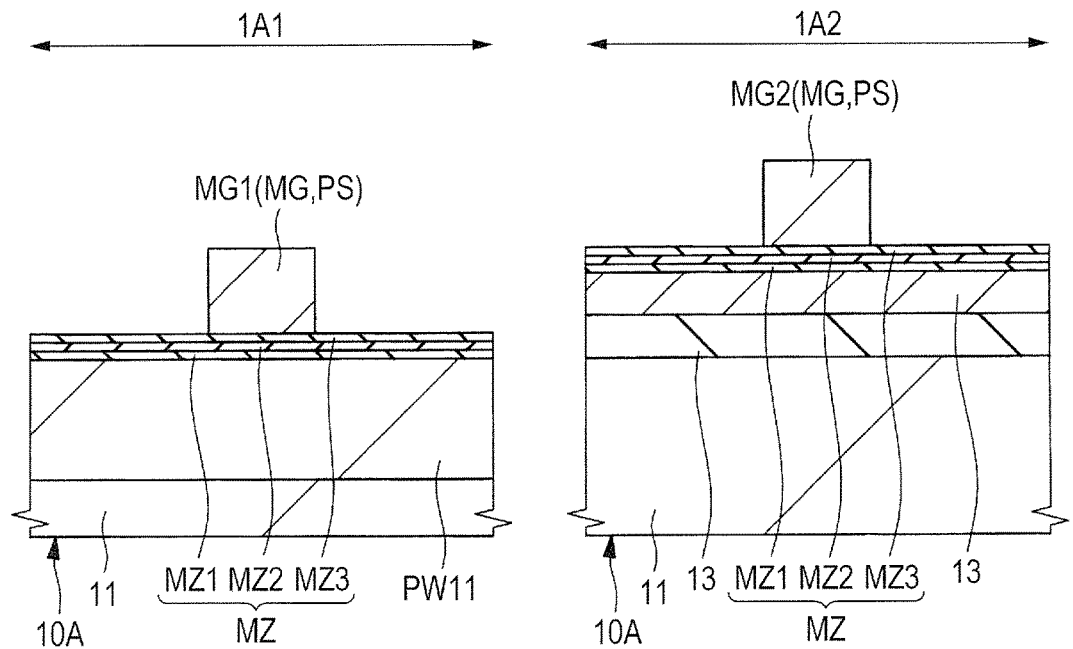
FIG. 77 is a main-portion cross-sectional view of the semiconductor device during the manufacturing process thereof, which is subsequent to FIG. 75.
Figure 78:
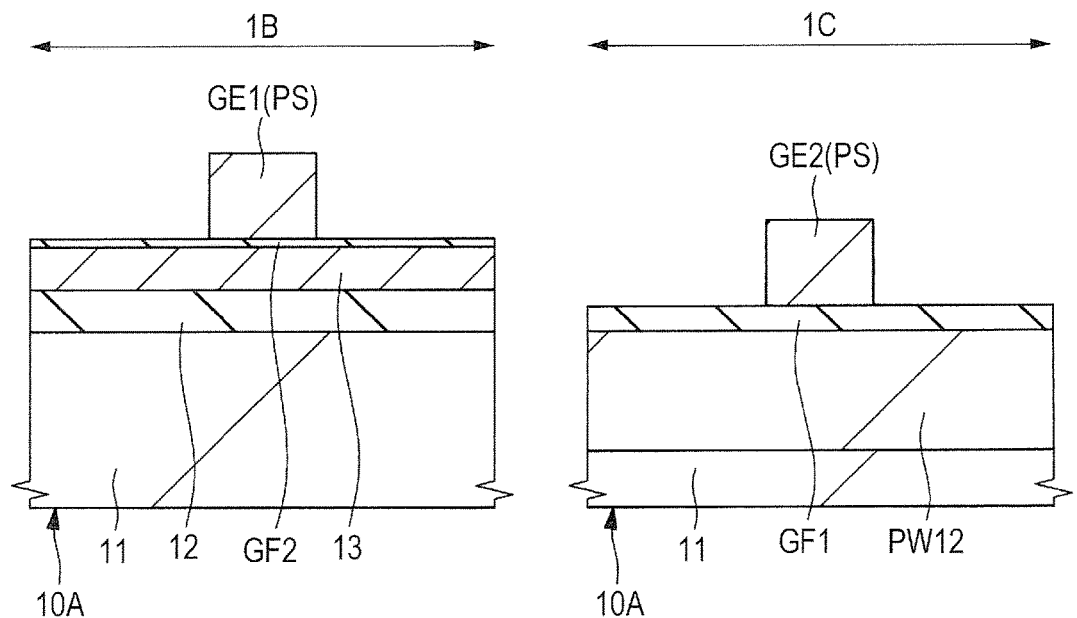
FIG. 78 is a main-portion cross-sectional view of the semiconductor device during the manufacturing process thereof, which is similar to FIG. 77.

Next, as shown in FIGS. 77 and 78, in the same manner as in Embodiment 1 described above, the silicon film PS is patterned to form the gate electrodes MG1, MG2, GE1, and GE2. The gate electrodes MG1 and MG2 correspond to the gate electrode MG in Embodiment 1 described above. The gate electrode MG formed in the memory region 1A1 is the gate electrode MG1, while the gate electrode MG formed in the memory region 1A2 is the gate electrode MG2.

The gate electrode MG1 is formed over the insulating film MZ in the memory region 1A1. The gate electrode MG2 is formed over the insulating film MZ in the memory region 1A2. The gate electrode GE1 is formed over the insulating film GF2 in the lower-breakdown-voltage MISFET formation region 1B. The gate electrode GE2 is formed over the insulating film GF1 in the higher-breakdown-voltage MISFET formation region 1C. That is, in the memory region 1A1, the gate electrode MG1 is formed over the semiconductor substrate 11 (p-type well PW11) via the insulating film MZ. In the memory region 1A2, the gate electrode MG2 is formed over the semiconductor layer 13 via the insulating film MZ. In the lower-breakdown-voltage MISFET formation region 1B, the gate electrode GE1 is formed over the semiconductor layer 13 via the insulating film GF2. In the higher-breakdown-voltage MISFET formation region 1C, the gate electrode GE2 is formed over the semiconductor substrate (p-type well PW12) via the insulating film GF1. In another form, respective cap insulating films can also be formed over the gate electrodes MG1, MG2, GE1, and GE2.

The subsequent process steps are basically the same as the process steps shown in FIGS. 14 to 23 described above in Embodiment 1 described above. By performing the same process steps as those shown in FIGS. 14 to 23 described above, the structure shown in FIGS. 79 to 80 can be obtained. That is, the offset spacers OS are formed as necessary over the respective side walls of the gate electrodes MG1, MG2, GE1, and GE2, and then n⁻-type semiconductor regions EX1a and EX1b and the n⁻-type semiconductor regions EX2 and EX3 are formed using an ion implantation method. Then, over the respective side walls of the gate electrodes MG1, MG2, GE1, and GE2, the sidewall spacers SW are formed. Then, using an ion implantation method, n⁺-type semiconductor regions SD1a and SD1b and the n⁺-type semiconductor regions SD2 and SD3 are formed.

Note that the n⁻-type semiconductor regions EX1a and EX1b correspond to the n⁻-type semiconductor regions EX1 in Embodiment 1 described above. The n⁻-type semiconductor regions EX1 formed in the memory region 1A1 are the n⁻-type semiconductor regions EX1a. The n⁻-type semiconductor regions EX1 formed in the memory region 1A2 are the n⁻-type semiconductor regions EX1b. Note that the n⁺-type semiconductor regions SD1a and SD1b correspond to the n⁺-type semiconductor regions SD1 in Embodiment 1 described above. The n⁺-type semiconductor regions SD1 formed in the memory region 1A1 are the n⁺-type semiconductor regions SD1a. The n⁺-type semiconductor regions SD1 formed in the memory region 1A2 are the n⁺-type semiconductor regions SD1b.

Figure 79:
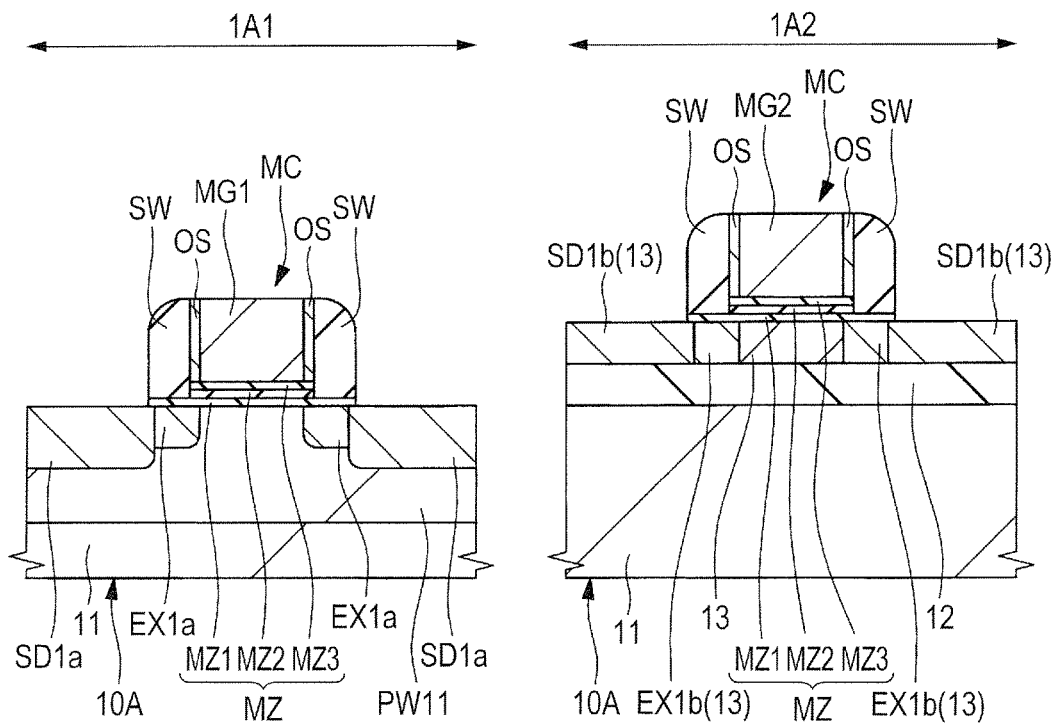
FIG. 79 is a main-portion cross-sectional view of the semiconductor device during the manufacturing process thereof, which is subsequent to FIG. 77.
Figure 80:
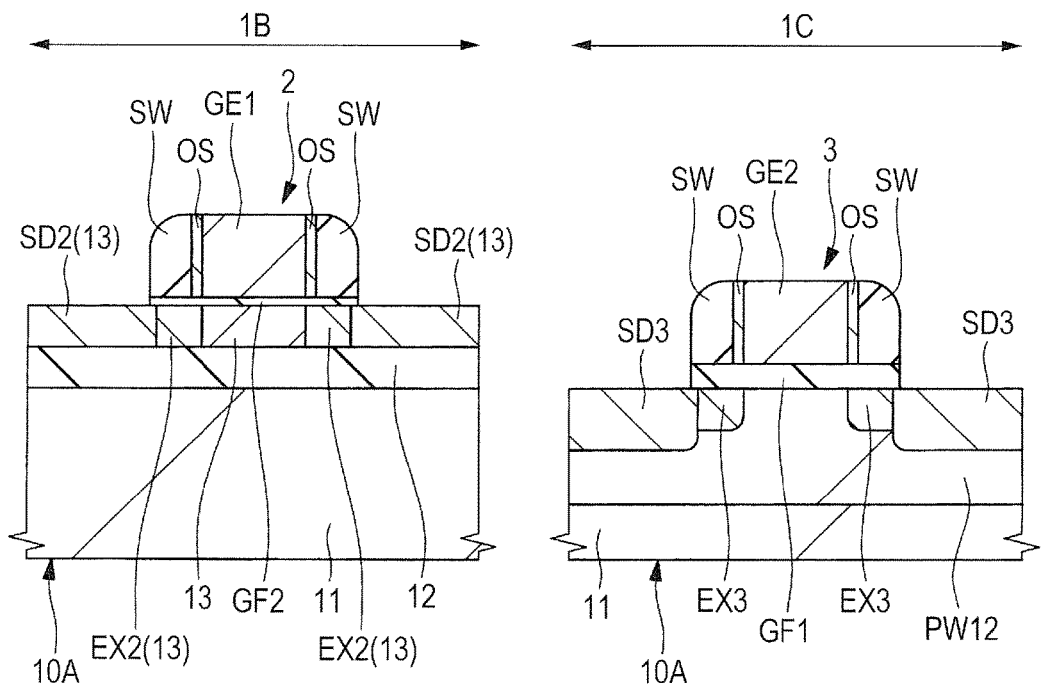
FIG. 80 is a main-portion cross-sectional view of the semiconductor device during the manufacturing process thereof, which is similar to FIG. 79.

The n⁻-type semiconductor regions EX1a and the n⁺-type semiconductor regions SD1a are formed in the semiconductor substrate 11 (p-type well PW11) located in the memory region 1A1. The n⁻-type semiconductor regions EX1b and the n⁺-type semiconductor regions SD1b are formed in the semiconductor layer 13 located in the memory region 1A2. The n⁻-type semiconductor regions EX2 and the n⁺-type semiconductor regions SD2 are formed in the semiconductor layer 13 located in the lower-breakdown-voltage MISFET formation region 1B. The n⁻-type semiconductor regions EX3 and the n⁺-type semiconductor regions SD3 are formed in the semiconductor substrate 11 (p-type well PW12) located in the higher-breakdown-voltage MISFET formation region 1C. Then, activation anneal is performed. Thus, the structure shown in FIGS. 79 and 80 is obtained.

In this manner, in the memory regions 1A1 and 1A2, the respective memory elements MC are formed. In the lower-breakdown-voltage MISFET formation region 1B, the lower-breakdown-voltage MISFET 2 is formed. In the higher-breakdown-voltage MISFET formation region 1C, the higher-breakdown-voltage MISFET 3 is formed.

Then, in the same manner as in Embodiment 1 described above, the foregoing metal silicide layers SL, the foregoing insulating film IL1, the foregoing plugs PG, the foregoing insulating film IL2, and the foregoing wires M1 are formed. However, the illustration and repeated description thereof is omitted herein.

In Embodiment 3 also, in the same manner as in Embodiment 1 described above, the step of forming the insulating film GF1 (FIGS. 63 and 64) is performed before the step of forming the insulating film MZ (FIGS. 67 and 68), and the step of forming the insulating film GF2 (FIGS. 73 and 74) is performed after the step of forming the insulating film MZ (FIGS. 67 and 68). This allows effects as described above in Embodiment 1 to be obtained. Briefly, since it is possible to prevent the step of forming the insulating film GF1 from affecting the insulating film MZ, it is possible to reliably control the structure of the gate insulating film of each of the memory elements MC to an intended configuration and reliably prevent variations in the characteristics of the memory element MC. In addition, since it is possible to prevent the step of removing the insulating film MZ from affecting the thin insulating film GF2, it is possible to reliably prevent variations in the characteristics of the MISFET 2. This can improve the performance of the semiconductor device and the reliability thereof.

In Embodiment 3, the following effects can also be obtained.

That is, in the lower-breakdown-voltage MISFET formation region 1B, after the insulating film GF1 is formed over the semiconductor layer 13, the insulating film MZ is formed. This can prevent the semiconductor layer 13 located in the lower-breakdown-voltage MISFET formation region 1B from being consumed in the step of forming the insulating film MZ. As a result, at the process stage shown in FIGS. 73 and 74, the thickness of the semiconductor layer 13 located in the lower-breakdown-voltage MISFET formation region 1B is easily ensured.

Also, in Embodiment 3, at the process stage shown in FIGS. 73 and 74, the respective semiconductor layers 13 located in the memory region 1A2 and the lower-breakdown-voltage MISFET formation region 1B are allowed to have substantially equal thicknesses. This allows the ion implantation step for forming the n⁻-type semiconductor regions EX1b in the memory region 1A2 and the ion implantation step for forming the n⁻-type semiconductor regions EX2 in the lower-breakdown-voltage MISFET formation region 1B to be more easily performed as a common ion implantation step. This also allows the ion implantation step for forming the n⁺-type semiconductor regions SD1b in the memory region 1A2 and the ion implantation step for forming the n⁻-type semiconductor regions SD2 in the lower-breakdown-voltage MISFET formation region 1B to be more easily performed as a common ion implantation step.

While the invention achieved by the present inventors has been specifically described heretofore on the basis of the embodiments thereof, the present invention is not limited to the foregoing embodiments. It will be appreciated that various changes and modifications can be made in the invention within the scope not departing from the gist thereof.

What is claimed is:

1. A method of manufacturing a semiconductor device, comprising the steps of:
   (a) providing a semiconductor substrate including a first region where a nonvolatile memory element is to be formed, a second region where a first transistor is to be formed, and a third region where a second transistor is to be formed;
   (b) forming a first insulating film for a gate insulating film of the first transistor over the semiconductor substrate located in the first, second, and third regions;
   (c) after the step (b), removing the first insulating film from the first region, while leaving the first insulating film in each of the second and third regions;
   (d) after the step (c), forming a second insulating film for a gate insulating film of the memory element over the semiconductor substrate located in the first region and over the first insulating film located in each of the second and third regions;
   (e) after the step (d), removing the second insulating film from each of the second and third regions, while leaving the second insulating film in the first region;
   (f) after the step (e), removing the first insulating film from the third region, while leaving the second insulating film in the first region and leaving the first insulating film in the second region;
   (g) after the step (f), forming a third insulating film for a gate insulating film of the second transistor over the semiconductor substrate located in the third region;
   (h) after the step (g), forming a first film over the second insulating film located in the first region, over the first insulating film located in the second region, and over the third insulating film located in the third region; and
   (i) after the step (h), patterning the first film to form a first gate electrode for the memory element, a second gate electrode for the first transistor, and a third gate electrode for the second transistor,
   wherein the first gate electrode is formed over the semiconductor substrate located in the first region via the second insulating film,
   wherein the second gate electrode is formed over the semiconductor substrate located in the second region via the first insulating film, wherein the third gate electrode is formed over the semiconductor substrate located in the third region via the third insulating film, wherein a thickness of the first insulating film interposed between the second gate electrode and the semiconductor substrate is larger than a thickness of the third insulating film interposed between the third gate electrode and the semiconductor substrate, wherein the second insulating film interposed between the first gate electrode and the semiconductor substrate is made of a multi-layer film including a fourth insulating film, a fifth insulating film over the fourth insulating film, and a sixth insulating film over the fifth insulating film, and wherein the fifth insulating film has a charge storing function.

2. The method of manufacturing the semiconductor device according to claim 1, wherein the first insulating film is made of a silicon dioxide film, and wherein the third insulating film is made of a silicon dioxide film.

3. The method of manufacturing the semiconductor device according to claim 2, wherein each of the first and third insulating films is formed by a thermal oxidation method.

4. The method of manufacturing the semiconductor device according to claim 2, wherein the fourth insulating film is made of a silicon dioxide film or a silicon oxynitride film, wherein the fifth insulating film is made of a silicon nitride film, and wherein the sixth insulating film is made of a silicon dioxide film.

5. The method of manufacturing the semiconductor device according to claim 1, wherein a band gap in each of the fourth and sixth insulating films is larger than a band gap in the fifth insulating film.

6. The method of manufacturing the semiconductor device according to claim 1, wherein the first film is made of a silicon film.

7. The method of manufacturing the semiconductor device according to claim 1, wherein, in the step (e), the second insulating film is removed from each of the second and third regions by wet etching.

8. The method of manufacturing the semiconductor device according to claim 1, further comprising, after the step (i), the step of:

(j) forming a first semiconductor region for a source or drain region of the memory element in the semiconductor substrate located in the first region, forming a second semiconductor region for a source or drain region of the first transistor in the semiconductor substrate located in the second region, and forming a third semiconductor region for a source or drain region of the second transistor in the semiconductor substrate located in the third region.

9. The method of manufacturing the semiconductor device according to claim 1, wherein the semiconductor substrate provided in the step (a) and located in each of the first and third regions has a SOI structure having a supporting substrate, an insulating layer over the supporting substrate, and a semiconductor layer over the insulating layer, while the semiconductor substrate provided in the step (a) and located in the second region has neither the insulating layer nor the semiconductor layer and is made of the supporting substrate, wherein, in the step (b), the first insulating film is formed over the semiconductor layer located in each of the first and third regions and over the supporting substrate located in the second region, wherein, in the step (d), the second insulating film is formed over the semiconductor layer located in the first region and over the first insulating film located in each of the second and third regions, wherein, in the step (g), the third insulating film is formed over the semiconductor layer located in the third region, wherein the first gate electrode is formed over the semiconductor layer located in the first region via the second insulating film, wherein the second gate electrode is formed over the supporting substrate located in the second region via the first insulating film, and wherein the third gate electrode is formed over the semiconductor layer located in the third region via the third insulating film.

10. The method of manufacturing the semiconductor device according to claim 1, wherein the semiconductor substrate provided in the step (a) and located in the third region has a SOI structure having a supporting substrate, an insulating layer over the supporting substrate, and a semiconductor layer over the insulating layer, while the semiconductor substrate provided in the step (a) and located in each of the first and second regions has neither the insulating layer nor the semiconductor layer and is made of the supporting substrate, wherein, in the step (b), the first insulating film is formed over the semiconductor layer located in the third region and over the supporting substrate located in each of the first and second regions, wherein, in the step (d), the second insulating film is formed over the supporting substrate located in the first region and over the first insulating film located in each of the second and third regions, wherein, in the step (g), the third insulating film is formed over the semiconductor layer located in the third region, wherein the first gate electrode is formed over the supporting substrate located in the first region via the second insulating film, wherein the second gate electrode is formed over the supporting substrate located in the second region via the first insulating film, and wherein the third gate electrode is formed over the semiconductor layer located in the third region via the third insulating film.

11. A method of manufacturing a semiconductor device, comprising the steps of:

(a) providing a semiconductor substrate including a first region where a nonvolatile memory element is to be formed, a second region where a first transistor is to be formed, a third region where a second transistor is to be formed, and a fourth region where a third transistor is to be formed;

(b) forming a first insulating film for a gate insulating film of the first transistor over the semiconductor substrate located in each of the first, second, third, and fourth regions;

(c) after the step (b), removing the first insulating film from the third region, while leaving the first insulating film in each of the first, second, and fourth regions;

(d) after the step (c), forming a second insulating film for a gate insulating film of the second transistor over the semiconductor substrate located in the third region;

(e) after the step (d), removing the first insulating film from the first region, while leaving the first insulating film in each of the second and fourth regions and leaving the second insulating film in the third region;

(f) after the step (e), forming a third insulating film for a gate insulating film of the memory element over the semiconductor substrate located in the first region, over the first insulating film located in each of the second and fourth regions, and over the second insulating film located in the third region;

(g) after the step (f), removing the third insulating film from each of the second, third, and fourth regions, while leaving the third insulating film in the first region;

(h) after the step (g), removing the first insulating film from the fourth region, while leaving the third insulating film in the first region, leaving the first insulating film in the second insulating film, and leaving the second insulating film in the third region;

(i) after the step (h), forming a fourth insulating film for a gate insulating film of the third transistor over the semiconductor substrate located in the fourth region;

(j) after the step (i), forming a first film over the third insulating film located in the first region, over the first insulating film located in the second region, over the second insulating film located in the third region, and over the fourth insulating film located in the fourth region; and (k) after the step (j), patterning the first film to form a first gate electrode for the memory element, a second gate electrode for the first transistor, a third gate electrode for the second transistor, and a fourth gate electrode for the third transistor, wherein the first gate electrode is formed over the semiconductor substrate located in the first region via the third insulating film, wherein the second gate electrode is formed over the semiconductor substrate located in the second region via the first insulating film, wherein the third gate electrode is formed over the semiconductor substrate located in the third region via the second insulating film, wherein the fourth gate electrode is formed over the semiconductor substrate located in the fourth region via the fourth insulating film, wherein a thickness of the first insulating film interposed between the second gate electrode and the semiconductor substrate is larger than a thickness of the second insulating film interposed between the third gate electrode and the semiconductor substrate, wherein a thickness of the second insulating film interposed between the third gate electrode and the semiconductor substrate is larger than a thickness of the fourth insulating film interposed between the fourth gate electrode and the semiconductor substrate, wherein the third insulating film interposed between the first gate electrode and the semiconductor substrate is made of a multi-layer film including a fifth insulating film, a sixth insulating film over the fifth insulating film, and a seventh insulating film over the sixth insulating film, and wherein the sixth insulating film has a charge storing function.

12. The method of manufacturing the semiconductor device according to claim 11,
wherein the first insulating film is made of a silicon dioxide film,
wherein the second insulating film is made of a silicon dioxide film, and
wherein the fourth insulating film is made of a silicon dioxide film.

13. The method of manufacturing the semiconductor device according to claim 12,
wherein each of the first, second, and third insulating films is formed by a thermal oxidation method.

14. The method of manufacturing the semiconductor device according to claim 12,
wherein the fifth insulating film is made of a silicon dioxide film or a silicon oxynitride film,
wherein the sixth insulating film is made of a silicon nitride film, and
wherein the seventh insulating film is made of a silicon dioxide film.

15. The method of manufacturing the semiconductor device according to claim 11,
wherein a band gap in each of the fifth and seventh insulating films is larger than a band gap in the sixth insulating film.

16. The method of manufacturing the semiconductor device according to claim 11,
wherein the first film is made of a silicon film.

17. The method of manufacturing the semiconductor device according to claim 11,
wherein, in the step (g), the third insulating film is removed from each of the second, third, and fourth regions by wet etching.

18. The method of manufacturing the semiconductor device according to claim 11, further comprising, after the step (k), the step of:
(l) forming a first semiconductor region for a source or drain region of the memory element in the semiconductor substrate located in the first region, forming a second semiconductor region for a source or drain region of the first transistor in the semiconductor substrate located in the second region, forming a third semiconductor region for a source or drain region of the second transistor in the semiconductor substrate located in the third region, and forming a fourth semiconductor region for a source or drain region of the third transistor in the semiconductor substrate located in the fourth region.

* * * * *